United States Patent
Yamashita et al.

(10) Patent No.: US 8,674,977 B2
(45) Date of Patent: Mar. 18, 2014

(54) DRIVING METHOD OF ORGANIC ELECTROLUMINESCENCE EMISSION PART

(75) Inventors: Junichi Yamashita, Tokyo (JP);
Katsuhide Uchino, Kanagawa (JP)

(73) Assignee: Sony Corporation, Tokyo (JP)

( * ) Notice: Subject to any disclaimer, the term of this patent is extended or adjusted under 35 U.S.C. 154(b) by 422 days.

(21) Appl. No.: 12/654,482

(22) Filed: Dec. 22, 2009

(65) Prior Publication Data
US 2010/0171738 A1    Jul. 8, 2010

(30) Foreign Application Priority Data

Jan. 6, 2009    (JP) .................................. 2009-000664

(51) Int. Cl.
G06F 3/038    (2013.01)
G09G 5/00    (2006.01)
H01J 7/44    (2006.01)
H01J 13/46    (2006.01)
H01J 17/34    (2006.01)
H01J 19/78    (2006.01)
H01J 23/16    (2006.01)
H01J 29/96    (2006.01)
H01K 1/62    (2006.01)
G09G 3/10    (2006.01)

(52) U.S. Cl.
USPC ........... 345/213; 345/204; 315/35; 315/169.1

(58) Field of Classification Search
USPC ......... 315/175, 35, 169.3; 345/55, 80, 82, 92, 345/205, 211, 76–78, 690; 438/35
See application file for complete search history.

(56) References Cited

U.S. PATENT DOCUMENTS

| | | | |
|---|---|---|---|
| 2006/0012310 A1* | 1/2006 | Chen et al. | 315/169.3 |
| 2007/0268210 A1* | 11/2007 | Uchino et al. | 345/55 |
| 2007/0273621 A1* | 11/2007 | Yamashita et al. | 345/76 |
| 2008/0001854 A1* | 1/2008 | Hamer et al. | 345/76 |
| 2008/0129212 A1* | 6/2008 | Chen et al. | 315/169.1 |
| 2008/0246403 A1* | 10/2008 | Sagawa et al. | 315/35 |
| 2008/0252626 A1* | 10/2008 | Iida et al. | 345/204 |

FOREIGN PATENT DOCUMENTS

| | | | |
|---|---|---|---|
| JP | 2005-164894 A | 6/2005 | |
| JP | 2005-195756 A | 7/2005 | |
| JP | 2007-310311 | 11/2007 | |
| JP | 2008-287139 A | 11/2008 | |
| JP | 2009-168969 A | 7/2009 | |

OTHER PUBLICATIONS

Japanese Office Action issued Apr. 5, 2011 for corresponding Japanese Application No. 2009-000664.

* cited by examiner

*Primary Examiner* — Yong H Sim
*Assistant Examiner* — Lin Li
(74) *Attorney, Agent, or Firm* — Rader, Fishman & Grauer PLLC

(57) ABSTRACT

A driving method of a display device having a driving transistor and a display element, one source/drain region of the driving transistor connected to a power supply part, the other source/drain region connected to an anode electrode provided in the display element, the method includes the steps of: setting a potential of the anode electrode by applying a predetermined intermediate voltage to the anode electrode so that a potential difference between the anode electrode of the display element and a cathode electrode at the other end of the display element does not exceed a threshold voltage of the display element; and then holding the driving transistor in OFF-state while a drive voltage is applied from the power supply part to one source/drain region of the driving transistor.

15 Claims, 23 Drawing Sheets

[EMBODIMENT 1]

[EMBODIMENT 1 TO EMBODIMENT 5]

[EMBODIMENT 1 (REFERENCE EXAMPLE)]
FIG.5A [TP(2)₀']
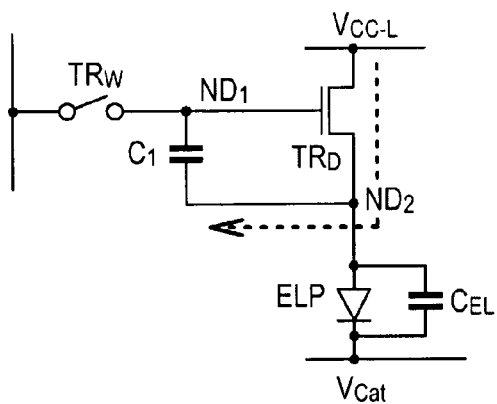
FIG.5B [TP(2)₁']
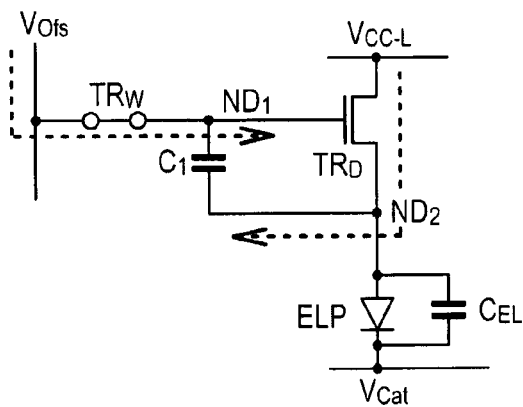
FIG.5C [TP(2)₂']
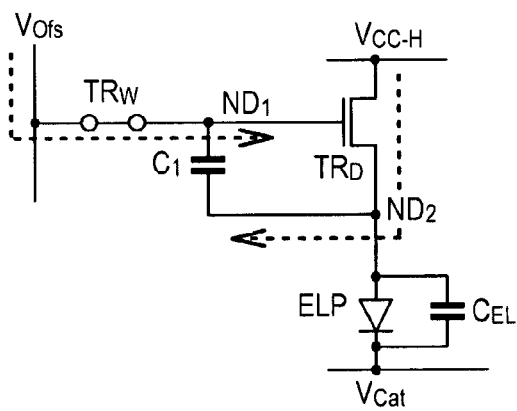
FIG.5D [TP(2)₃']
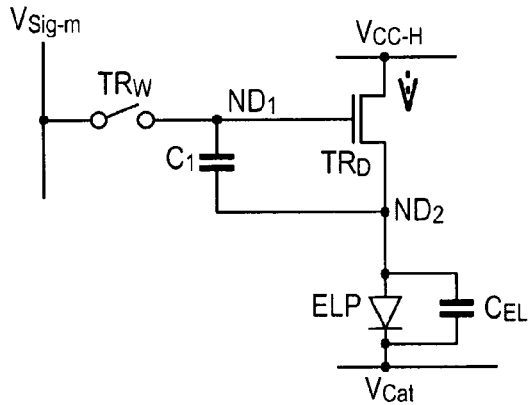
FIG.5E [TP(2)₄']
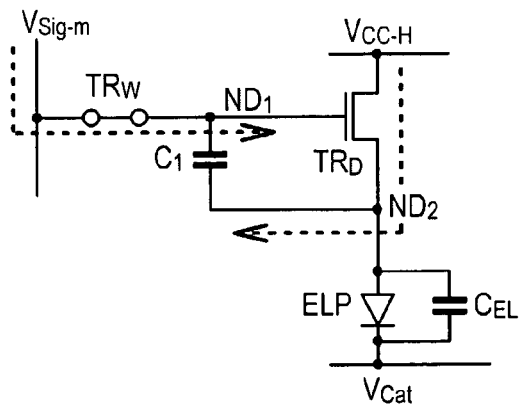
FIG.5F [TP(2)₅']
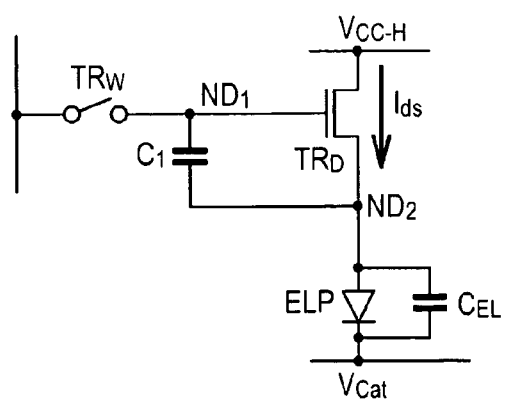

[EMBODIMENT 1 (REFERENCE EXAMPLE)]
FIG.6A [TP(2)₆']
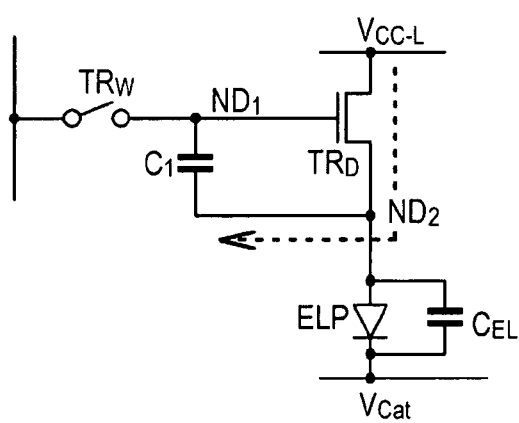
FIG.6B [TP(2)₊₁']
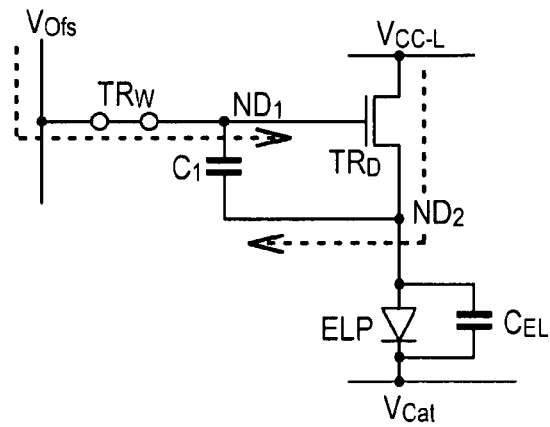

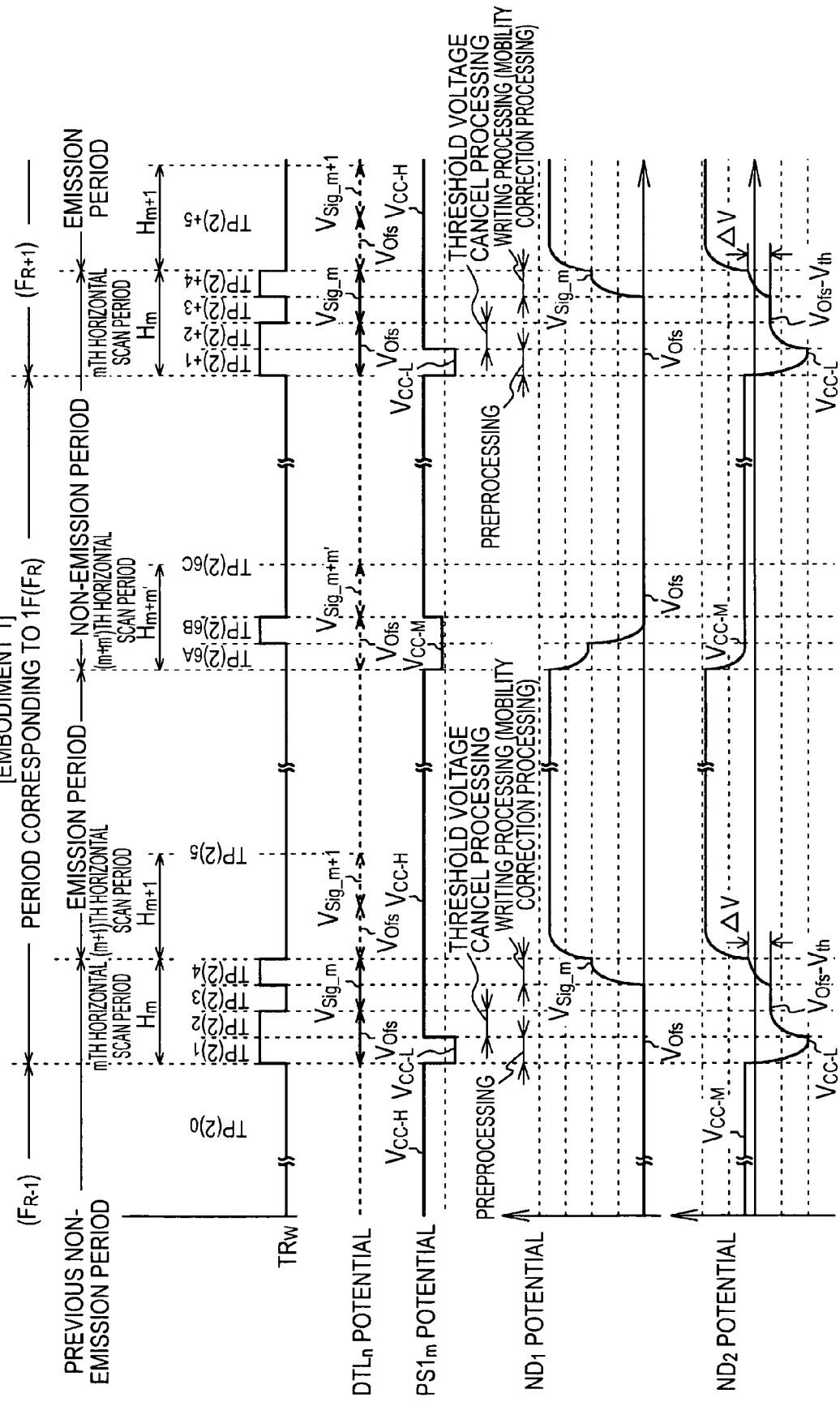

[EMBODIMENT 1]
FIG.8A [TP(2)₀]
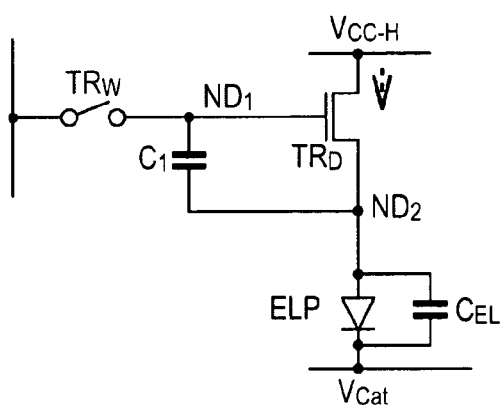
FIG.8B [TP(2)₁]
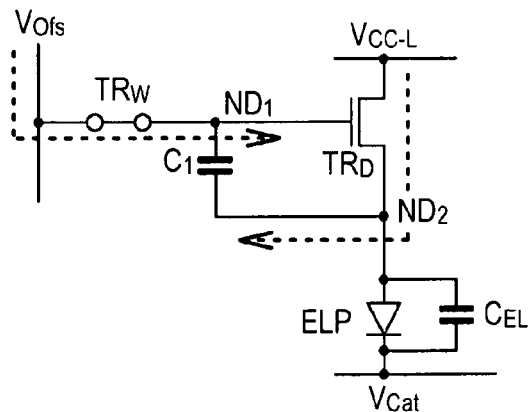
FIG.8C [TP(2)₂]
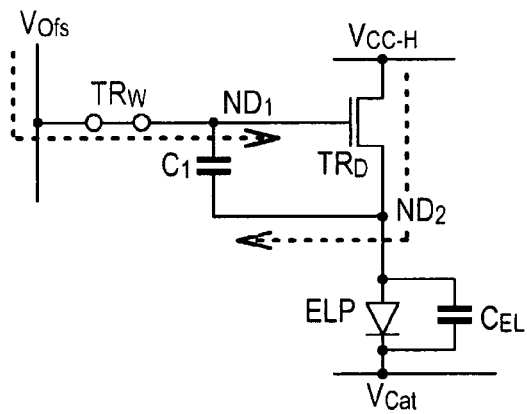
FIG.8D [TP(2)₃]
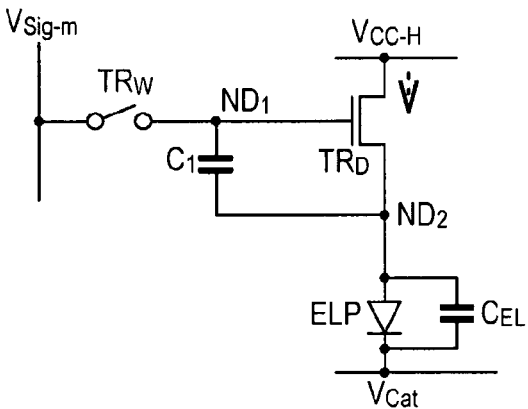
FIG.8E [TP(2)₄]
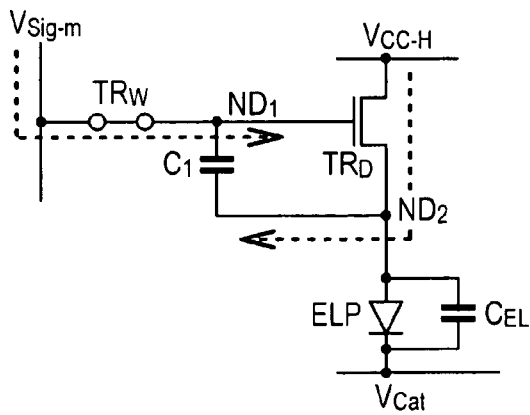
FIG.8F [TP(2)₅]
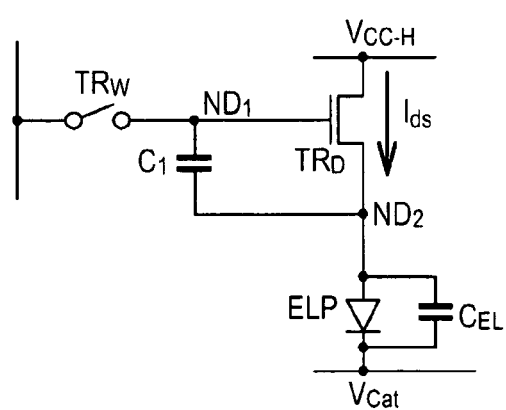

[EMBODIMENT 1]
FIG.9A [TP(2)6A]
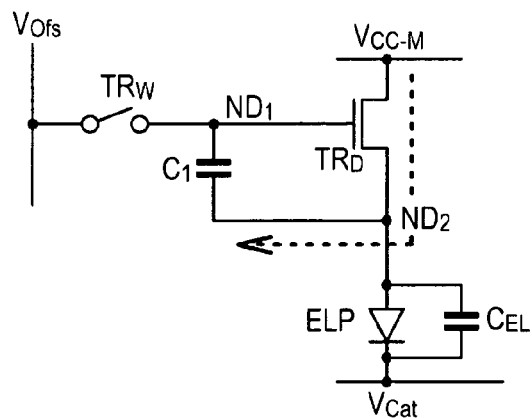
FIG.9B [TP(2)6B]
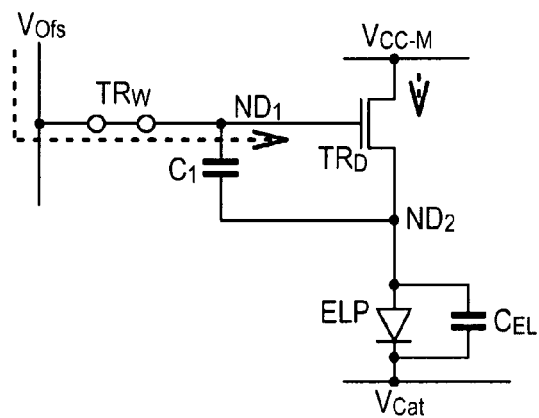
FIG.9C [TP(2)6C]
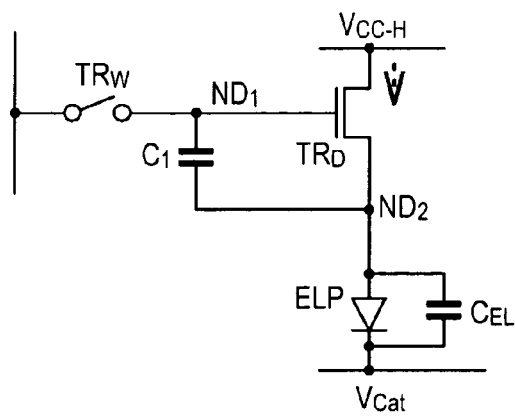

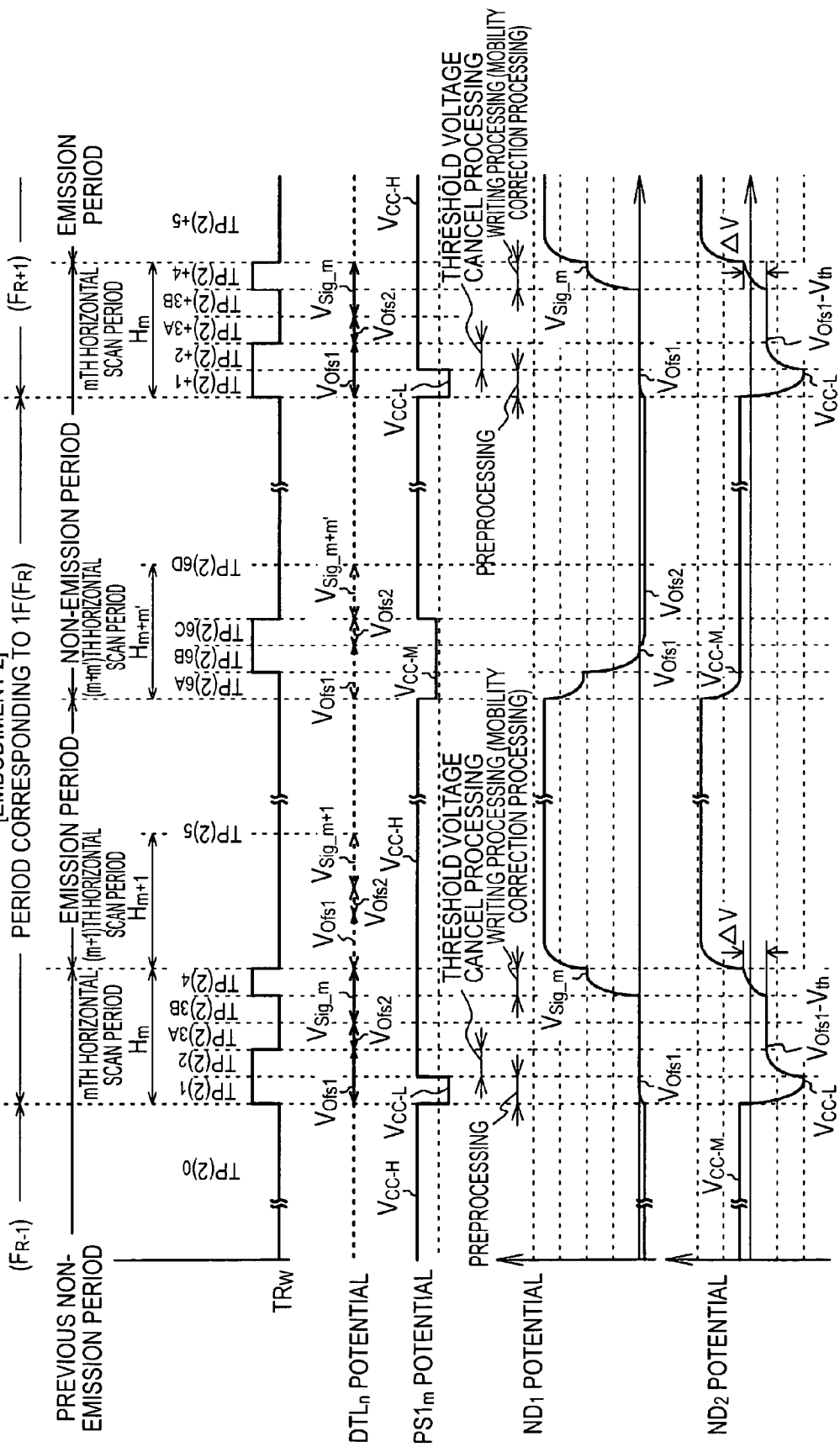

[EMBODIMENT 2]
FIG.11A [TP(2)₀]
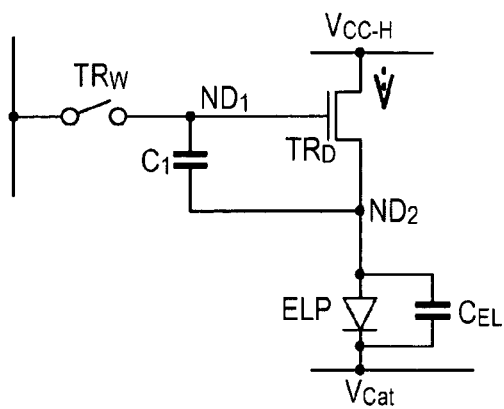
FIG.11B [TP(2)₁]
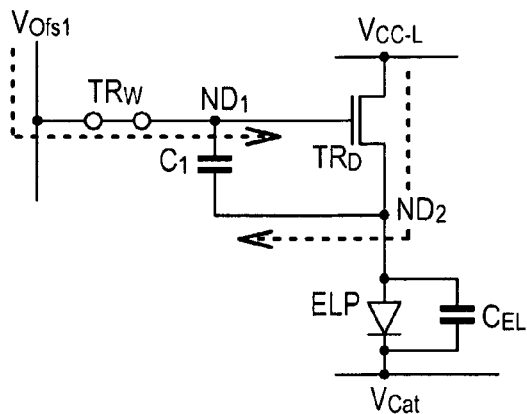
FIG.11C [TP(2)₂]
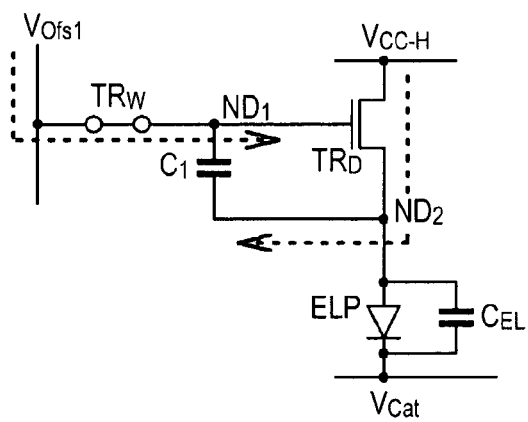
FIG.11D [TP(2)₃A]
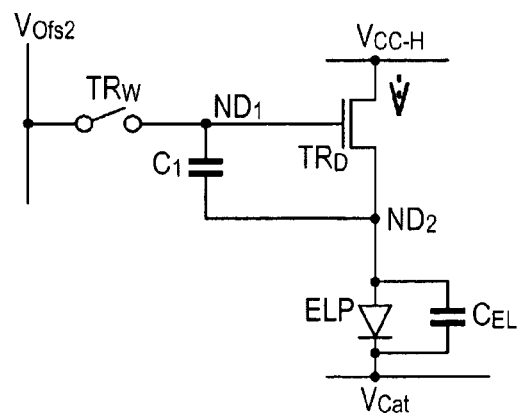
FIG.11E [TP(2)₃B]
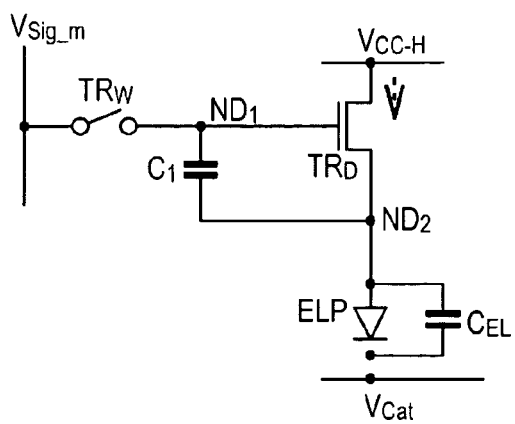
FIG.11F [TP(2)₄]
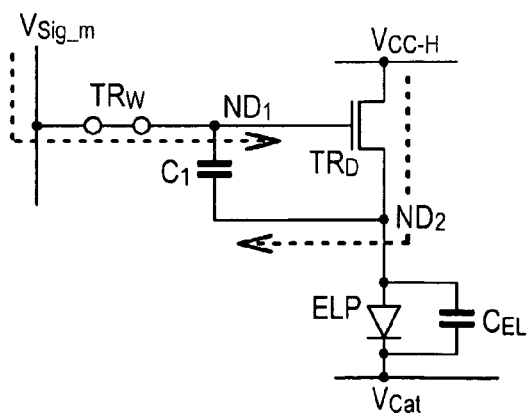

[EMBODIMENT 2]
FIG.12A [TP(2)₅]
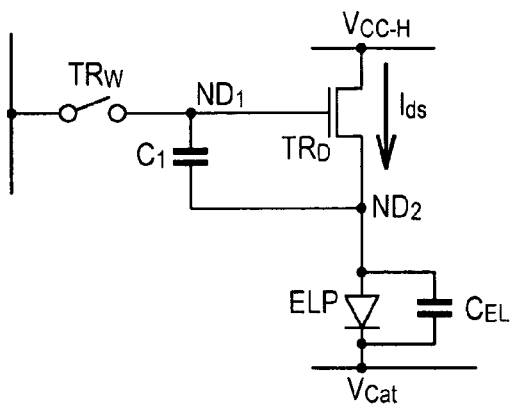
FIG.12B [TP(2)₆ₐ]
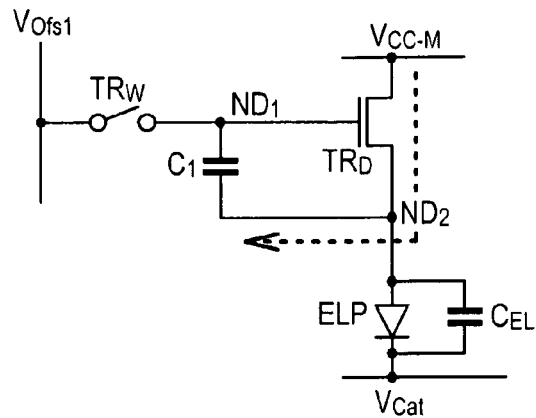
FIG.12C [TP(2)₆B]
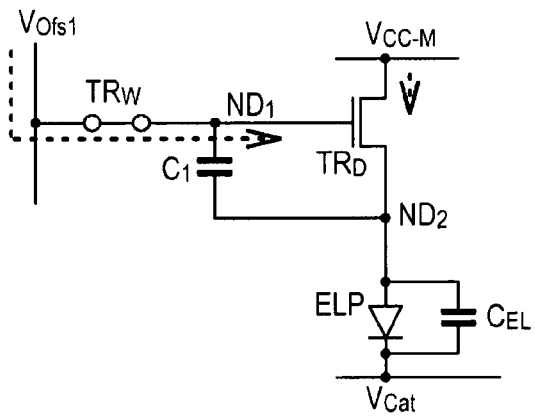
FIG.12D [TP(2)₆C]
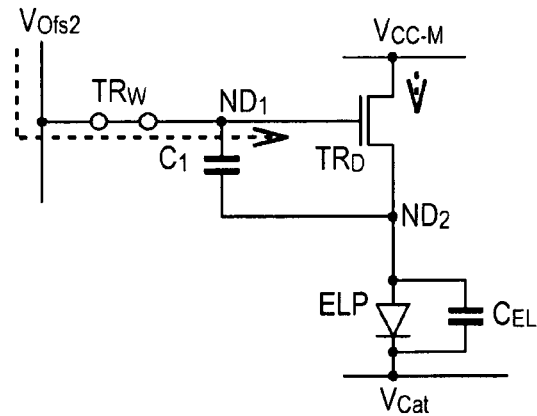
FIG.12E [TP(2)₆D]
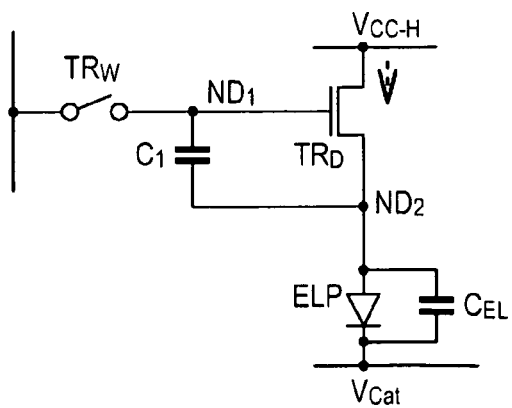

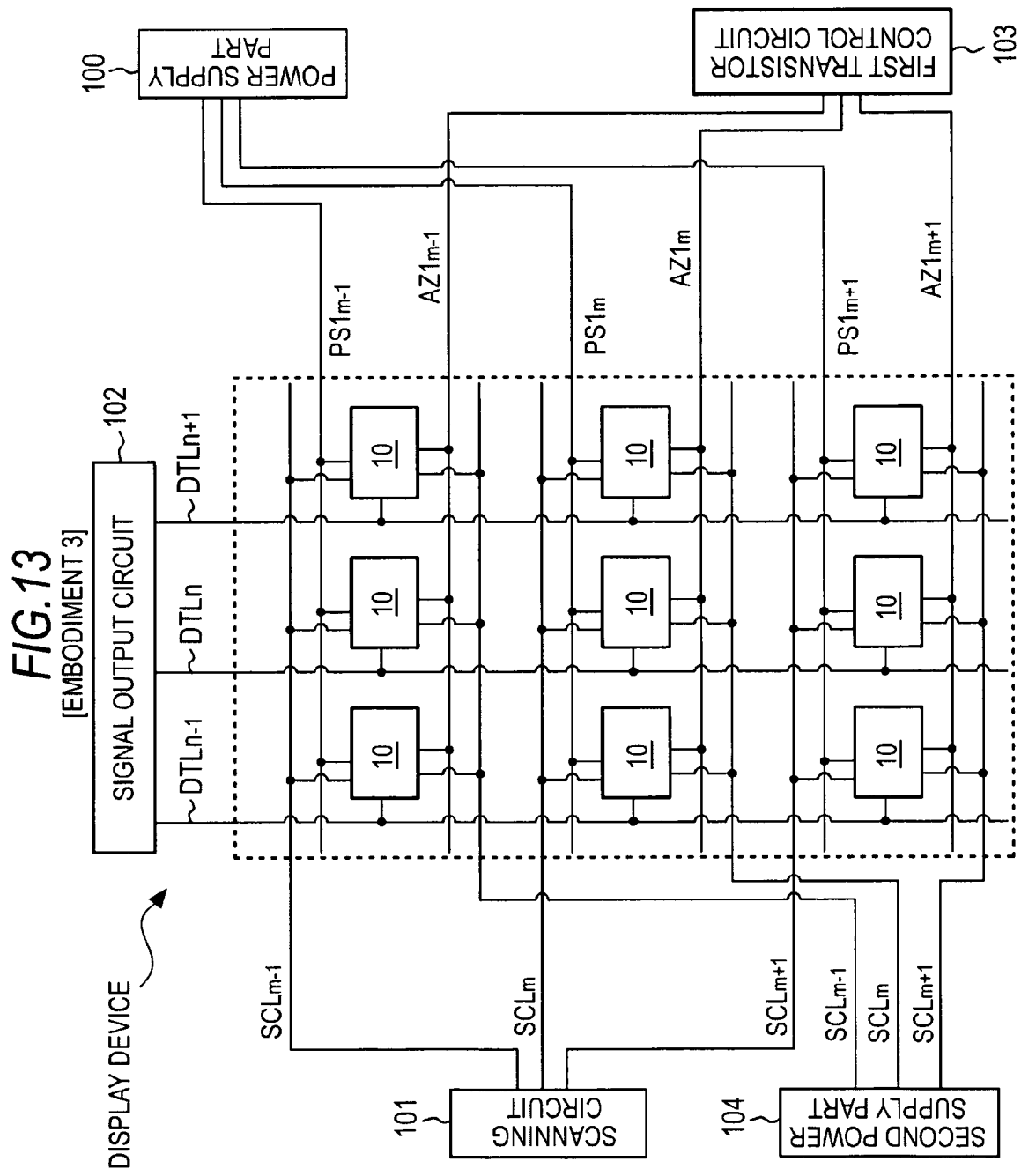

[EMBODIMENT 3]

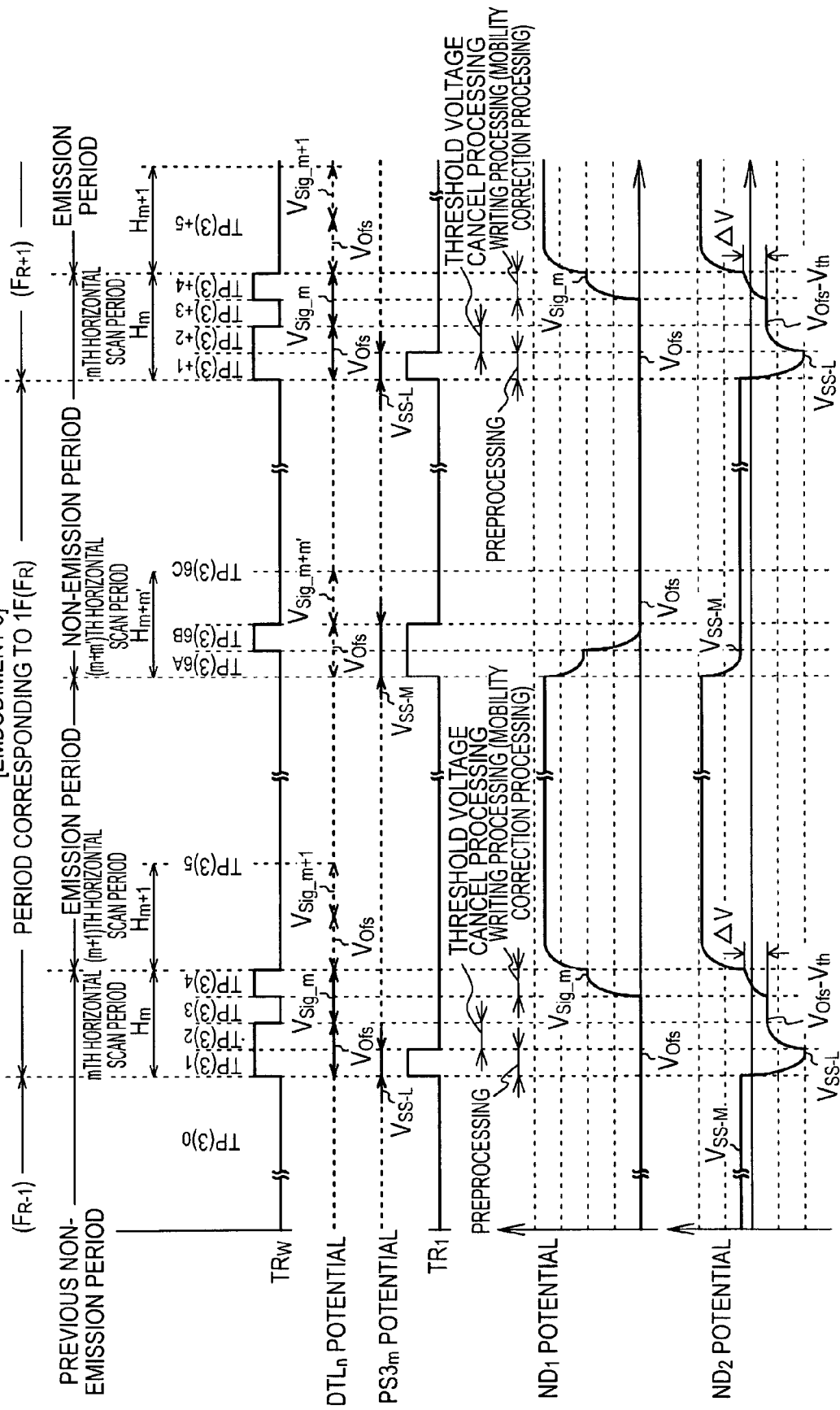

[EMBODIMENT 3]
FIG.16A [TP(3)₀]
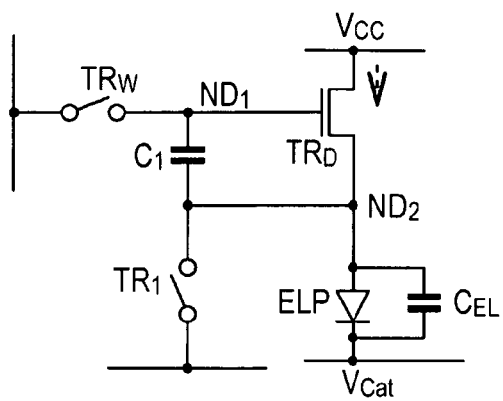
FIG.16B [TP(3)₁]
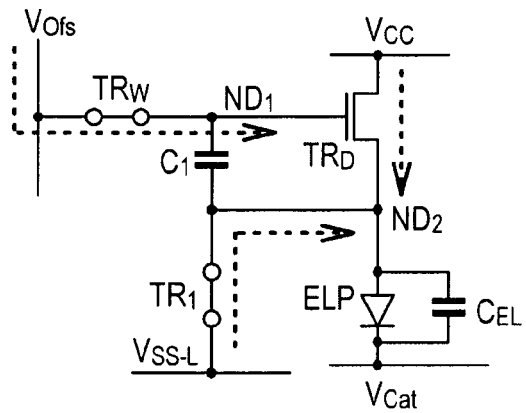
FIG.16C [TP(3)₂]
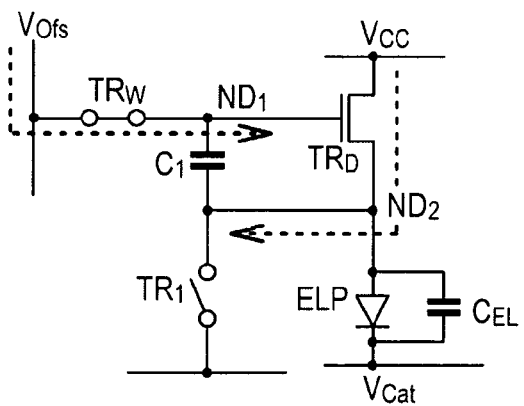
FIG.16D [TP(3)₃]
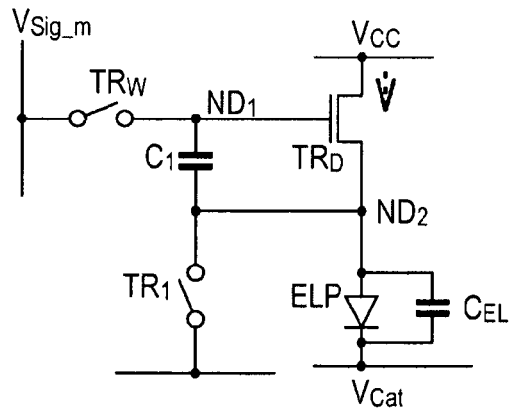
FIG.16E [TP(3)₄]
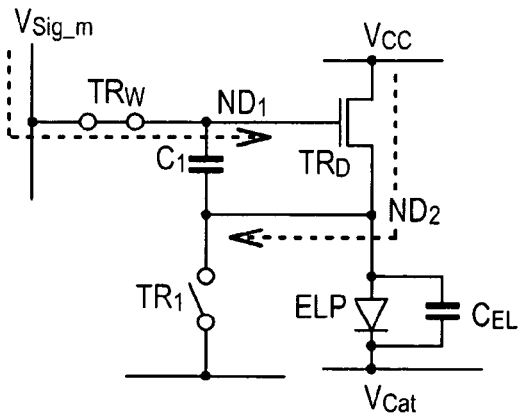
FIG.16F [TP(3)₅]
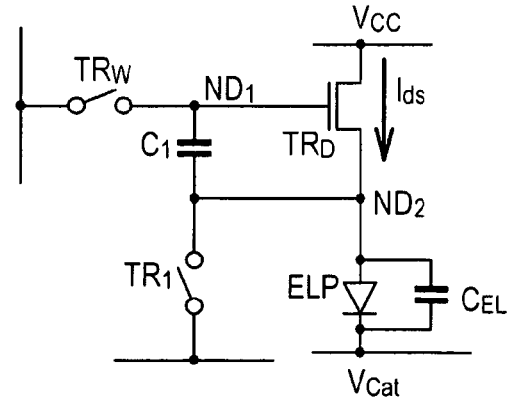

[EMBODIMENT 3]
FIG.17A [TP(3)6A]
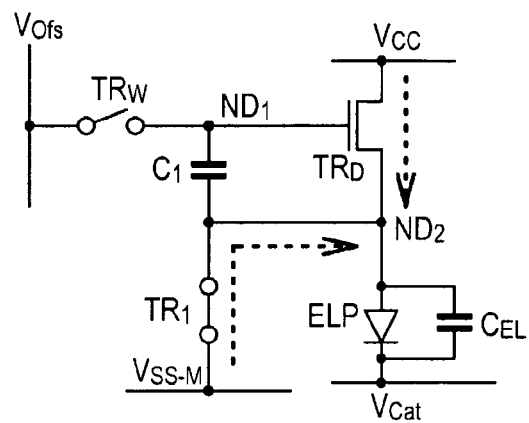
FIG.17B [TP(3)6B]
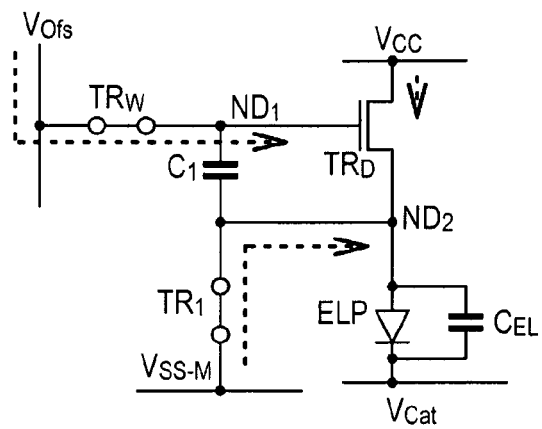
FIG.17C [TP(3)6C]
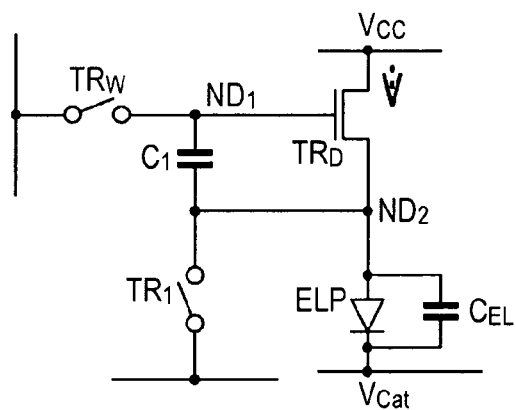

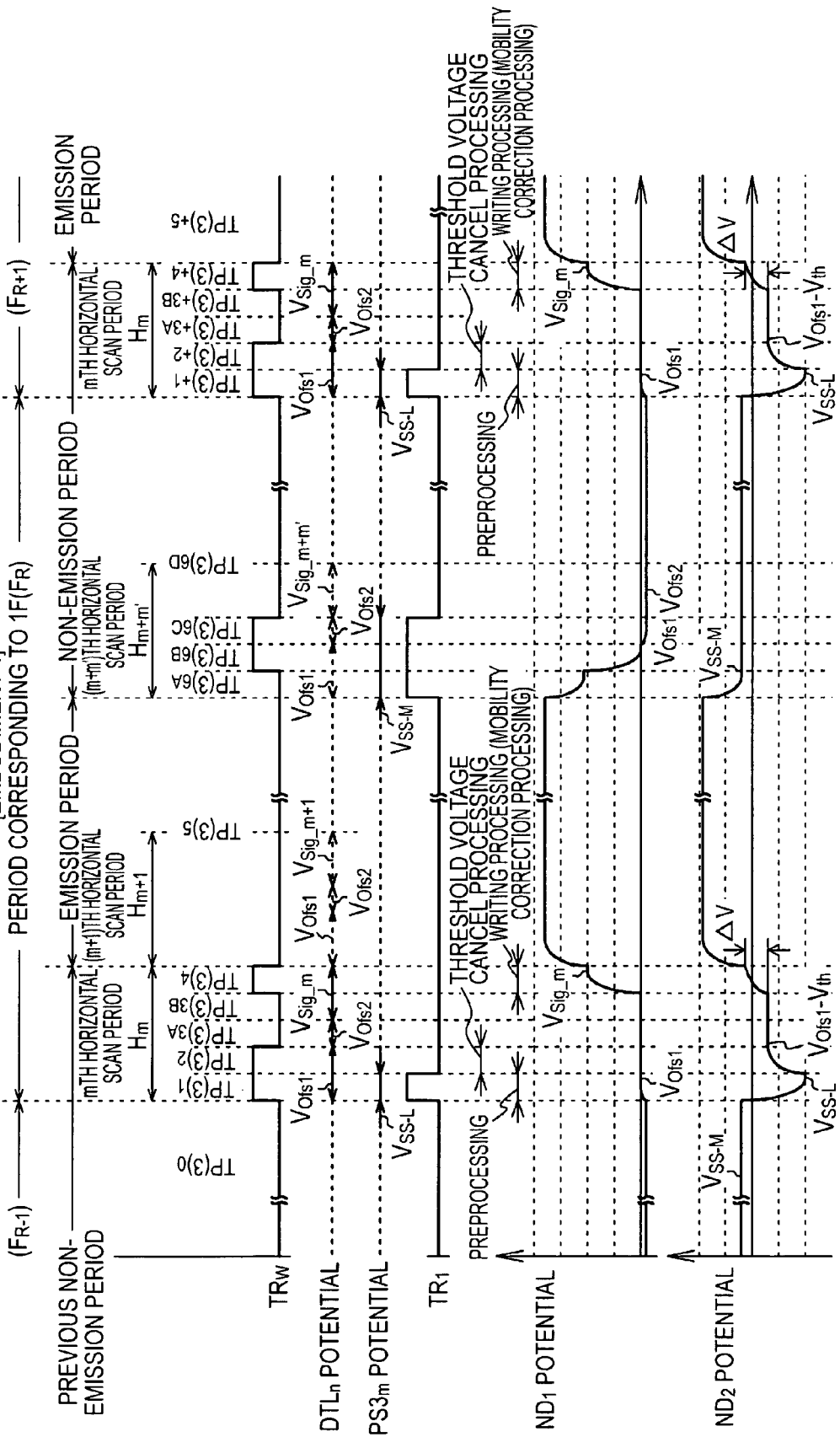

[EMBODIMENT 4]
FIG.19A [TP(3)₅]
FIG.19B [TP(3)₆A]
FIG.19C [TP(3)₆B]
FIG.19D [TP(3)₆C]
FIG.19E [TP(3)₆D]
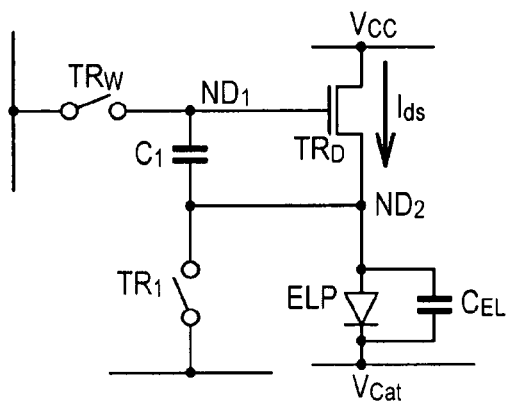
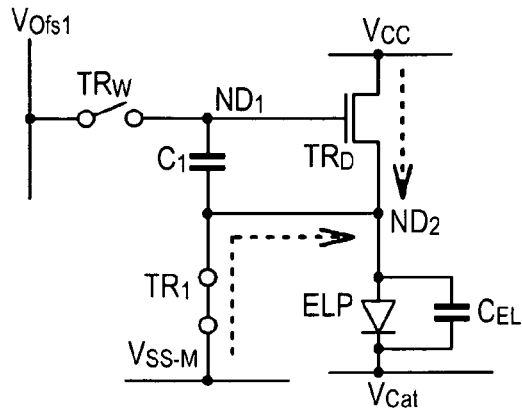
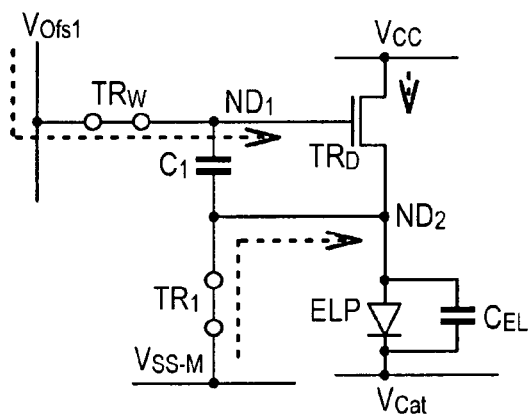
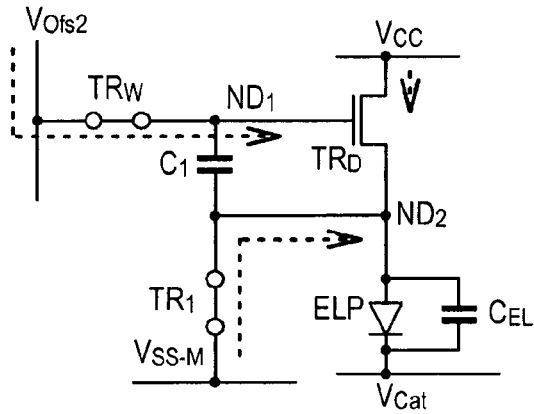
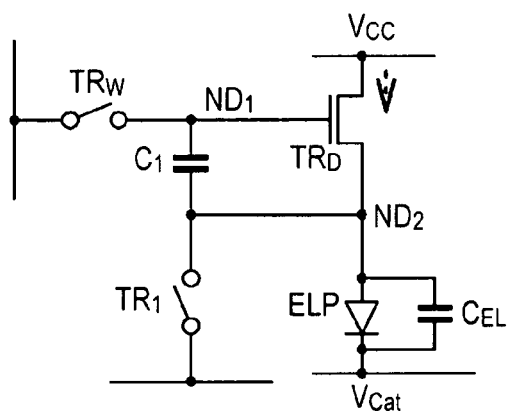

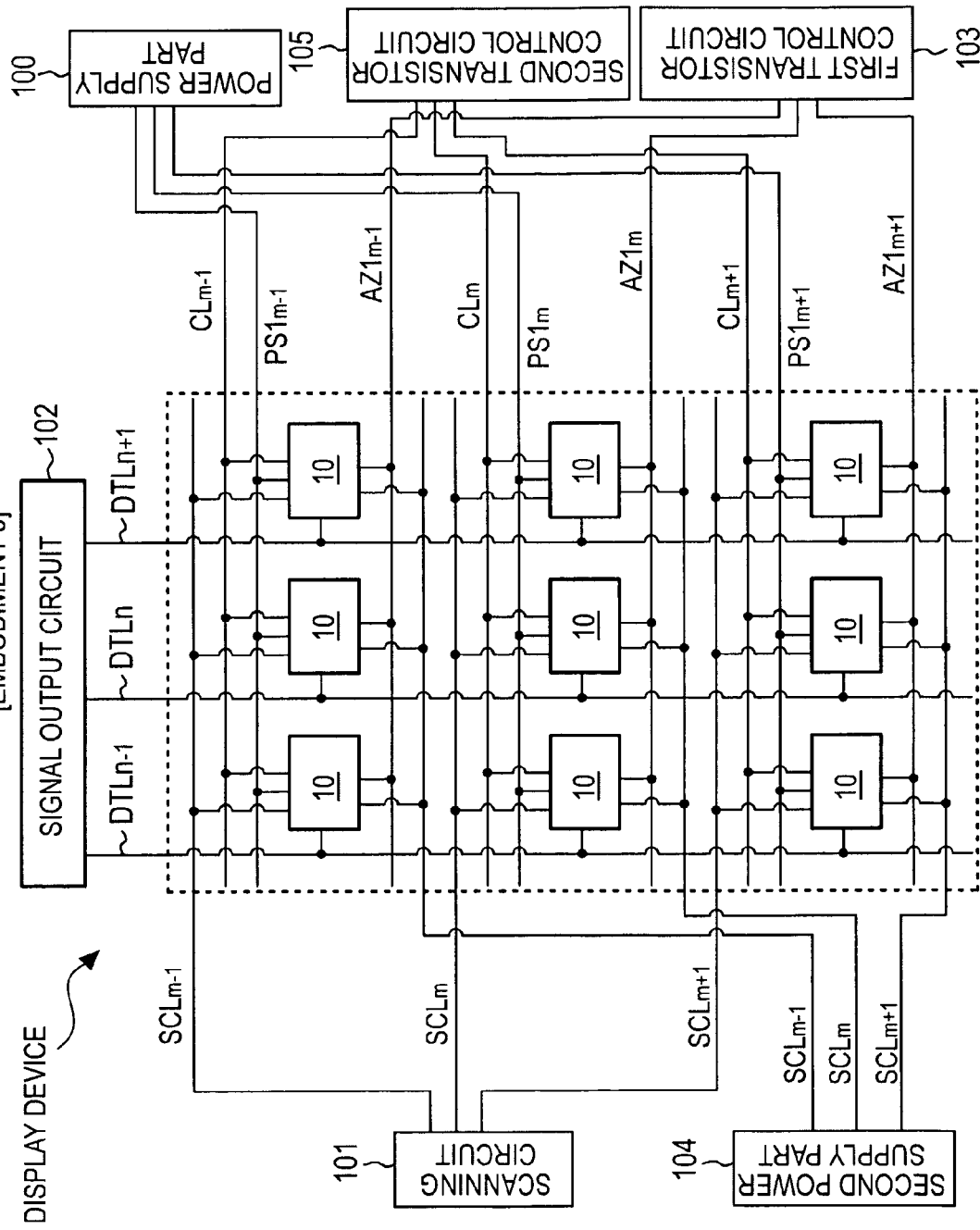

[EMBODIMENT 5]

[EMBODIMENT 5]
FIG.22A [TP(3)₀]
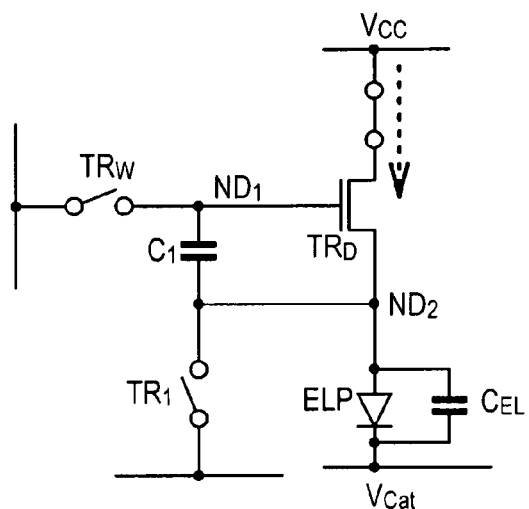
FIG.22B [TP(3)₁]
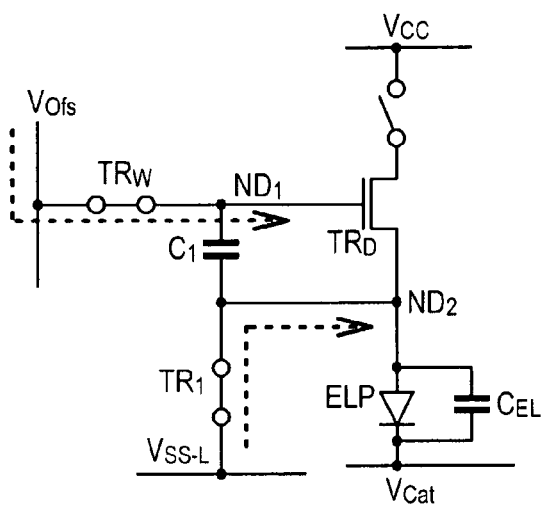
FIG.22C [TP(3)]
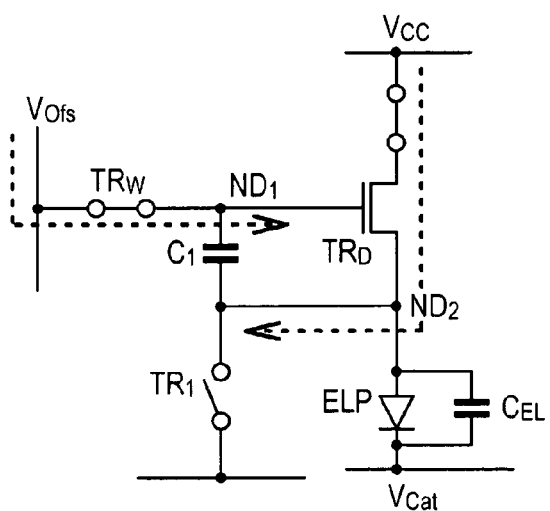

DRIVING METHOD OF ORGANIC ELECTROLUMINESCENCE EMISSION PART

BACKGROUND OF THE INVENTION

1. Field of the Invention

The present invention relates to a driving method of an organic electroluminescence emission part.

2. Description of Related Art

A display element having an emission part and a display device including the display element are known. For example, a display element having an organic electroluminescence emission part (hereinafter, may be abbreviated simply as "organic EL display element") using electroluminescence (hereinafter, may be abbreviated as "EL") of an organic material attracts attention as a display element that can perform high-luminance emission by low-voltage direct-current drive.

Like in a liquid crystal display device, for example, in an organic electroluminescence display device (hereinafter, may be abbreviated simply as "organic EL display device") including an organic EL display element, a simple matrix system and an active matrix system are known as drive systems. The active matrix system has a disadvantage that the structure becomes complex, but has advantages that image luminescence can be made higher etc. In the organic EL display element driven by the active matrix system, an emission part including an organic layer containing an emission layer etc. and a drive circuit for driving the emission point are provided.

As a circuit for driving an organic electroluminescence emission part (hereinafter, may be abbreviated simply as "emission part"), a drive circuit including two transistors and one capacity part (referred to as "2Tr/1C" drive circuit) is known from JP-A-2007-310311, for example. The 2Tr/1C drive circuit includes two transistors of a writing transistor $TR_W$ and a driving transistor $TR_D$, and further includes one capacity part $C_1$ as shown in FIG. 2. Here, the other source/drain region of the driving transistor $TR_D$ forms a second node $ND_2$, and the gate electrode of the driving transistor $TR_D$ forms a first node $ND_1$.

Further, as shown in a timing chart of FIG. 4, in [period-$TP(2)_1$'], preprocessing for threshold voltage cancel processing is executed. That is, via the writing transistor $TR_W$ in ON-state by a signal from a scan line SCN, a first node initializing voltage $V_{Ofs}$ (e.g., zero volt) is applied from a data line DTL to the first node $ND_1$. Thereby, the potential of the first node $ND_1$ becomes $V_{Ofs}$. Further, via the driving transistor $TR_D$, a second node initializing voltage $V_{CC-L}$ (e.g. −10 volts) is applied from a power supply part 100 to the second node $ND_2$. Thereby, the potential of the second node $ND_2$ becomes $V_{CC-L}$. The threshold voltage of the driving transistor $TR_D$ is expressed by a voltage $V_{th}$ (e.g., 3 volts). When the potential difference between the gate electrode and the other source/drain region of the driving transistor $TR_D$ (hereinafter, may be referred to as "source region" for convenience) becomes $V_{th}$ or more, the driving transistor $TR_D$ turns into ON-state. Note that the cathode electrode of the emission part ELP is connected to a power supply line PS2 to which a voltage $V_{Cat}$ (e.g., zero volts) is applied.

Then, threshold voltage cancel processing is performed in [period-$TP(2)_2$'] That is, while the ON-state of the writing transistor $TR_W$ is maintained, the voltage of the power supply part 100 is switched from the second node initializing voltage $V_{CC-L}$ to a drive voltage $V_{CC-H}$ (e.g., 20 volts). As a result, the potential of the second node $ND_2$ changes toward the potential obtained by subtracting the threshold voltage $V_{th}$ of the driving transistor $TR_D$ from the potential of the first node $ND_1$. That is, the potential of the floating second node $ND_2$ rises. Then, when the potential difference between the gate electrode and the source region of the driving transistor $TR_D$ reaches $V_{th}$, the driving transistor $TR_D$ turns into OFF-state. In the state, the potential of the second node $ND_2$ is generally $(V_{Ofs}-V_{th})$.

Then, in [period-$TP(2)_3$'], the writing transistor $TR_W$ is turned into OFF-state. Then, the voltage of the data line DTL is set to the voltage corresponding to a video signal [video signal (drive signal, luminance signal) $V_{Sig\_m}$ for controlling the luminance in the emission part ELP].

Then, in [period-$TP(2)_4$'], writing processing is performed. Specifically, the scan line SCN is turned into HIGH-level and the writing transistor $TR_W$ is turned into ON-state. As a result, the potential of the first node $ND_1$ rises to the video signal $V_{Sig\_m}$.

Here, given that the value of the capacity part $C_1$ is $c_1$, the value of the capacity $C_{EL}$ of the emission part ELP is $c_{EL}$, and further, the value of the parasitic capacity between the gate electrode and the other source/drain region of the driving transistor $TR_D$ is $c_{gs}$, when the potential of the gate electrode of the driving transistor $TR_D$ changes from $V_{Ofs}$ to $V_{Sig\_m}$ ($>V_{Ofs}$) the potentials at ends of the capacity part $C_1$ (in other words, the potentials of the first node $ND_1$ and the second node $ND_2$) basically change. That is, the charge based on the amount of change ($V_{Sig\_m}-V_{Ofs}$) of the potential of the gate electrode of the driving transistor $TR_D$ (=potential of the first node $ND_2$) is assigned to the capacity part $C_1$, the capacity $C_{EL}$ of the emission part ELP, and the parasitic capacity between the gate electrode and the other source/drain region of the driving transistor $TR_D$. Hence, if the value $c_{EL}$ is a sufficiently large value compared to the value $c_1$ and the value $c_{gs}$, the change of the potential of the other source/drain region of the driving transistor $TR_D$ (second node $ND_2$) according to the amount of change ($V_{Sig\_m}-V_{Ofs}$) of the potential of the gate electrode of the driving transistor $TR_D$ is small. Further, typically, the value $c_{EL}$ of the capacity $C_{EL}$ of the emission part ELP is larger than the value $c_1$ of the capacity part $C_1$ and the value $c_{gs}$ of the parasitic capacity of the driving transistor $TR_D$. Accordingly, for convenience of explanation, the explanation will be made without consideration of the potential change of the second node $ND_2$ generated by the potential change of the first node $ND_1$. Note that the drive timing chart shown in FIG. 4 is formed without consideration of the potential change of the second node $ND_2$ generated by the potential change of the first node $ND_1$.

In the above described operation, while the voltage $V_{CC-H}$ is applied from the power supply part 100 to one source/drain region of the driving transistor $TR_D$, the video signal $V_{Sig\_m}$ is applied to the gate electrode of the driving transistor $TR_D$. Accordingly, as shown in FIG. 4, in [period-$TP(2)_4$'], the potential of the second node $ND_2$ rises. The amount of rise of the potential $\Delta V$ (potential correction value) will be described later. Given that the potential of the gate electrode of the driving transistor $TR_D$ (first node $ND_1$) is $V_g$, and the potential of the other source/drain region of the driving transistor $TR_D$ (second node $ND_2$) is $V_s$, if the amount of rise of the potential $\Delta V$ of the second node $ND_2$ is not considered, the value of $V_g$ and the value of $V_s$ are as follows. The potential difference between the first node $ND_1$ and the second node $ND_2$, i.e., the potential difference $V_{gs}$ between the gate electrode and the other source/drain region serving as a source region of the driving transistor $TR_D$ can be expressed by the following expressions (A).

$$V_g = V_{Sig\_m}$$

$$V_s \approx V_{Ofs} - V_{th}$$

$$V_{gs} \approx V_{Sig\_m} - (V_{Ofs} - V_{th}) \quad\quad (A)$$

That is, $V_{gs}$ obtained in the writing processing in the driving transistor $TR_D$ depends only on the video signal $V_{Sig\_m}$ for controlling the luminance in the emission part ELP, the threshold voltage $V_{th}$ of the driving transistor $TR_D$, and the voltage $V_{Ofs}$ for initializing the potential of the gate electrode of the driving transistor $TR_D$. Further, it is independent of the threshold voltage $V_{th\text{-}EL}$ of the emission part ELP.

Subsequently, mobility correction processing will be briefly explained. In the above described operation, in the writing processing, mobility correction processing of changing the potential of the other source/drain region of the driving transistor $TR_D$ (i.e., the potential of the second node $ND_2$) according to the characteristic of the driving transistor $TR_D$ (e.g., magnitude of mobility $\mu$ or the like) is also performed.

As described above, while the voltage $V_{CC\text{-}H}$ is applied from the power supply part 100 to one source/drain region of the driving transistor $TR_D$, the video signal $V_{Sig\_m}$ is applied to the gate electrode of the driving transistor $TR_D$. Here, as shown in FIG. 4, in [period-TP(2)$_4$'], the potential of the second node $ND_2$ rises. As a result, if the value of the mobility $\mu$ of the driving transistor $TR_D$ is large, the amount of rise of the potential $\Delta V$ (potential correction value) in the source region of the driving transistor $TR_D$ becomes larger, and, if the value of the mobility $\mu$ of the driving transistor $TR_D$ is small, the amount of rise of the potential $\Delta V$ (potential correction value) in the source region of the driving transistor $TR_D$ becomes smaller. The potential difference $V_{gs}$ between the gate electrode and the source region of the driving transistor $TR_D$ is transformed from the expression (A) to the following expression (B). Note that, the whole time ($t_0$) of the [period-TP(2)$_4$'] may be determined in advance as a design value at designing of the organic EL display device.

$$V_{gs} \approx V_{Sig\_m} - (V_{Ofs} - V_{th}) - \Delta V \quad\quad (B)$$

Through the above operation, the threshold voltage cancel processing, the writing processing, and the mobility correction processing are completed. Further, at the start of the subsequent [period-TP(2)$_5$'], the writing transistor $TR_W$ is turned into OFF-state by the signal from the scan line SCL, and thereby, the first node $ND_1$ is floated. Concurrently, the voltage $V_{CC\text{-}H}$ is applied from the power supply part 100 to one source/drain region of the driving transistor $TR_D$ (hereinafter, may be referred to as "drain region" for convenience). Therefore, as a result, the potential of the second node $ND_2$ rises, the same phenomenon as that in a so-called bootstrap circuit occurs in the gate electrode of the driving transistor $TR_D$, and the potential of the first node $ND_1$ also rises. The potential difference $V_{gs}$ between the gate electrode and the source region of the driving transistor $TR_D$ basically holds the value of the expression (B). Further, the current flowing in the emission part ELP is a drain current $I_{ds}$ flowing from the drain region to the source region of the driving transistor $TR_D$. If the driving transistor $TR_D$ ideally operates in the saturation region, the drain current $I_{ds}$ can be expressed by the following expression (C). The emission part ELP emits light with luminescence according to the value of the drain current $I_{ds}$. The coefficient k will be described later.

$$I_{ds} = k \cdot \mu \cdot (V_{gs} - V_{th})^2 \quad\quad (C)$$

$$= k \cdot \mu \cdot (V_{Sig\_m} - V_{Ofs} - \Delta V)^2$$

Further, [period-TP(2)$_5$'] shown in FIG. 4 is an emission period and a period from the start of [period-TP(2)$_6$'] to the next emission period is a non-emission period (hereinafter, may be referred simply to as "non-emission period"). Specifically, at the start of [period-TP(2)$_6$'], the voltage $V_{CC\text{-}H}$ of the power supply part 100 is switched to the voltage $V_{CC\text{-}L}$ and maintained to the end of the next period [period-TP(2)$_1$'] (shown by [period-TP(2)$_{+1}$'] in FIG. 4). Thereby, the period from the start of [period-TP(2)$_6$'] to the start of the next [period-TP(2)$_{+5}$'] is the non-emission period.

The operation of the 2Tr/1C drive circuit, which has been briefly explained, will be specifically explained later.

SUMMARY OF THE INVENTION

In the above described driving method, the potential of the gate electrode of the driving transistor in the emission period is higher than the potential of the channel formation region between the source/drain regions. Further, in the large part of the non-emission period, the potential of the gate electrode of the driving transistor is also higher than the potential of the channel formation region between the source/drain regions. Therefore, for example, when the emission part forming the organic EL display device is driven according to the above described driving method, it is recognized that the characteristic of the driving transistor tends to shift to the enhancement side due to temporal change. In the above description, the case where the same phenomenon as that in the so-called bootstrap circuit ideally occurs in the gate electrode of the driving transistor has been explained. However, in practice, the characteristic of the driving transistor shifts to the enhancement side, and thereby, a phenomenon that the potential difference between the first node and the second node changes occurs in the bootstrap operation. The phenomenon contributes to occurrence of temporal change in luminescence of the organic electroluminescence display device.

Therefore, it is desirable to provide a driving method of an organic electroluminescence emission part that can reduce the degree that the characteristic of the driving transistor shifts to the enhancement side due to temporal change.

An embodiment of the invention is directed to a driving method of a display device of having a driving transistor and a display element, one source/drain region of the driving transistor connected to a power supply part, the other source/drain region connected to an anode electrode provided in the display element, the method including the steps of:

setting a potential of the anode electrode by applying a predetermined intermediate voltage to the anode electrode so that a potential difference between the anode electrode of the display element and a cathode electrode at the other end of the display element does not exceed a threshold voltage of the display element; and then holding the driving transistor in OFF-state while a drive voltage is applied from the power supply part to one source/drain region of the driving transistor.

Another embodiment of the invention is directed to a driving method of an organic electroluminescence emission part, using a drive circuit including a writing transistor, a driving transistor, and a capacity part, in the driving transistor, (A-1) one source/drain region connected to a power supply part, (A-2) the other source/drain region connected to an anode electrode provided in an organic electroluminescence emission part and connected to one electrode of the capacity part, and forming a second node, and (A-3) a gate electrode connected to the other source/drain region of the writing transistor and connected to the other electrode of the capacity part, and forming a first node, in the writing transistor, (B-1) one source/drain region connected to a data line, and (B-2) a gate electrode connected to a scan line, the method including the step of (a) setting a potential of the second node by applying a predetermined intermediate voltage to the second node so that a potential difference between the second node and a cathode electrode provided in the organic electroluminescence emission part may not exceed a threshold voltage of the organic electroluminescence emission part, and then, holding the driving transistor in OFF-state while a drive voltage is applied from the power supply part to one source/drain region of the driving transistor.

The driving method of an organic electroluminescence emission part of the embodiment of the invention includes the step (a). The step (a) corresponds to the non-emission period, the potential of the gate electrode of the driving transistor is lower than the potential of the channel formation region between the source/drain regions. Thereby, the potential relationship between the gate electrode of the driving transistor and the channel formation region is inverted between the emission period and the non-emission period, and the tendency of the characteristic of the driving transistor to shift to the enhancement side due to temporal change is reduced. Further, at step (a), the potential of the second node is set by applying the predetermined intermediate voltage to the second node, and thus, the emission part can be driven without trouble even in the display device having a short scanning period.

BRIEF DESCRIPTION OF THE DRAWINGS

FIGS. 5A to 5F schematically show ON/OFF states etc. of the respective transistors forming the drive circuit of the organic electroluminescence display device.

FIGS. 6A and 6B schematically show ON/OFF states etc. of the respective transistors forming the drive circuit of the organic electroluminescence display device subsequent to FIG. 5F.

FIG. 7 is a schematic diagram of a drive timing chart of an organic electroluminescence emission part according to embodiment 1.

FIGS. 8A to 8F schematically show ON/OFF states etc. of the respective transistors forming the drive circuit of the organic electroluminescence display device.

FIGS. 9A to 9C schematically show ON/OFF states etc. of the respective transistors forming the drive circuit of the organic electroluminescence display device subsequent to FIG. 8F.

FIG. 10 is a schematic diagram of a drive timing chart of an organic electroluminescence emission part according to embodiment 2.

FIGS. 11A to 11F schematically show ON/OFF states etc. of the respective transistors forming the drive circuit of the organic electroluminescence display device.

FIGS. 12A to 12E schematically show ON/OFF states etc. of the respective transistors forming the drive circuit of the organic electroluminescence display device subsequent to FIG. 11F.

FIG. 13 is a conceptual diagram of an organic electroluminescence emission part according to embodiment 3.

FIG. 15 is a schematic diagram of a drive timing chart of an organic electroluminescence emission part according to embodiment 3.

FIGS. 16A to 16F schematically show ON/OFF states etc. of the respective transistors forming the drive circuit of the organic electroluminescence display device.

FIGS. 17A to 17C schematically show ON/OFF states etc. of the respective transistors forming the drive circuit of the organic electroluminescence display device subsequent to FIG. 16F.

FIG. 18 is a schematic diagram of a drive timing chart of an organic electroluminescence emission part according to embodiment 4.

FIGS. 19A to 19E schematically show ON/OFF states etc. of the respective transistors forming the drive circuit of the organic electroluminescence display device.

FIG. 20 is a conceptual diagram of an organic electroluminescence display device according to embodiment 5.

FIGS. 22A to 22C schematically show ON/OFF states etc. of the respective transistors forming the drive circuit of the organic electroluminescence display device.

DESCRIPTION OF PREFERRED INVENTION

Figure 1:
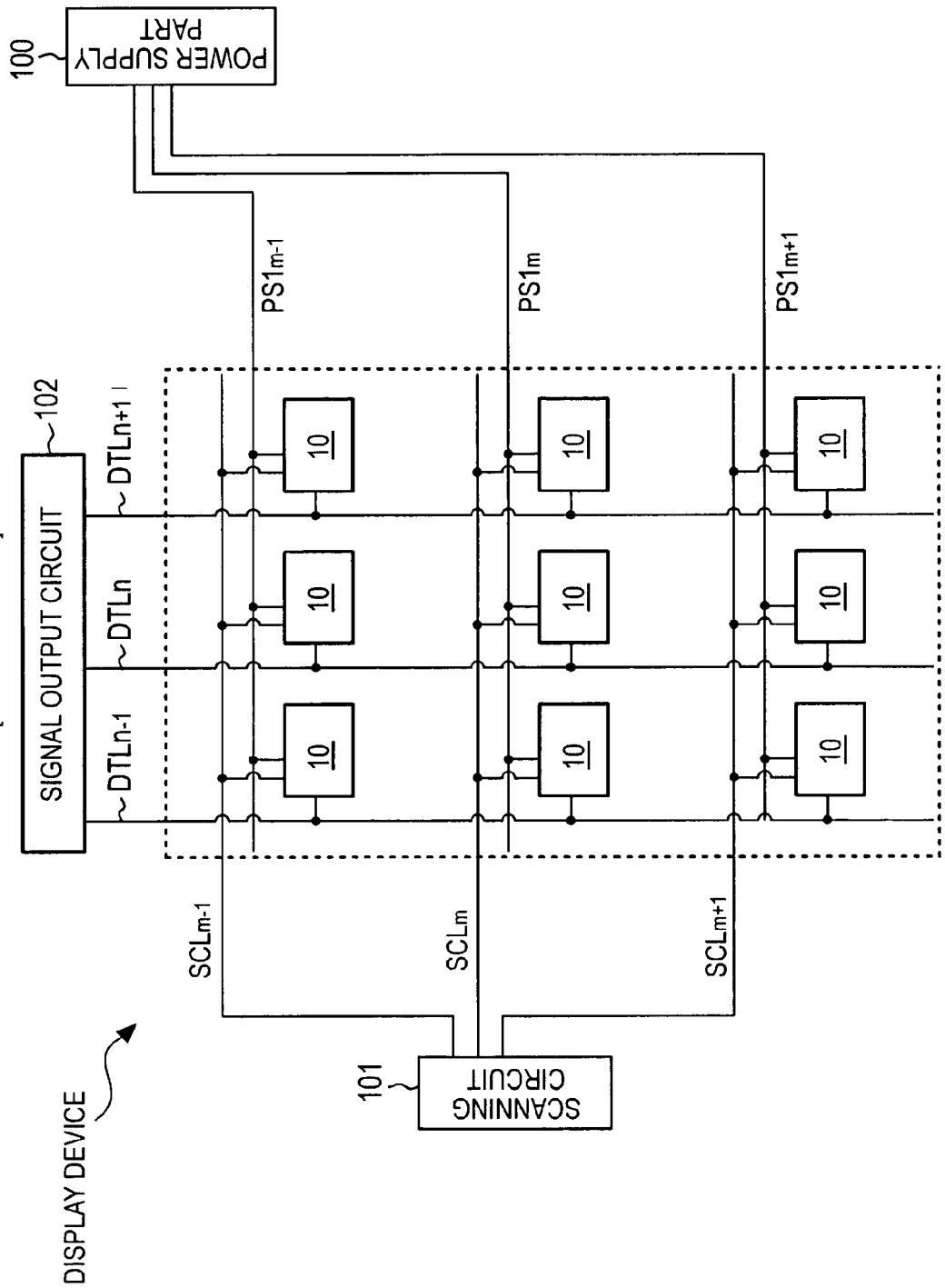
FIG. 1 is a conceptual diagram of an organic electroluminescence display device according to embodiment 1.

The invention will be described according to embodiments with reference to the drawings. The explanation will be made in the following order.

1. More detailed explanation of a driving method of organic electroluminescence emission part of embodiments of the invention 2. Explanation of outline of an organic electroluminescence display device used in the respective embodiments 3. Embodiment 1 (embodiment of 2Tr/1C drive circuit)

4. Embodiment 2 (embodiment of 2Tr/1C drive circuit)

5. Embodiment 3 (embodiment of 3Tr/1C drive circuit)

6. Embodiment 4 (embodiment of 3Tr/1C drive circuit)

7. Embodiment 5 (embodiment of 4Tr/1C drive circuit)<

<More Detailed Explanation of a Driving Method of Organic Electroluminescence Emission Part of Embodiments of the Invention>

The above described driving method of the organic electroluminescence emission part of embodiments of the invention may include the steps of:

(b) performing writing processing of applying a video signal from the data line to the first node via the writing transistor turned into ON-state by a signal from the scan line; then (c) turning the writing transistor into OFF-state by the signal from the scan line to float the first node; and (d) applying the drive voltage from the power supply part to one source/drain region of the driving transistor to flow a current in the organic electroluminescence emission part according to a value of the potential difference between the first node and the second node via the driving transistor, and a series of steps from step (b) to step (d) may be repeatedly performed and the step (a) may be performed between the step (d) and the next step (b).

The above described driving method of organic electroluminescence emission part of the embodiments of the invention containing the above described preferred configuration may include, before the step (b), the steps of: (b-1) applying a first node initializing voltage to the first node and a second node initializing voltage to the second node, and thereby, performing preprocessing of initializing the potential of the first node and the potential of the second node so that the potential difference between the first node and the second node may exceed the threshold voltage of the driving transistor and the potential difference between the second node and the cathode electrode provided in the organic electroluminescence emission part may not exceed the threshold voltage of the organic electroluminescence emission part; and then (b-2) performing threshold voltage cancel processing of changing the potential of the second node toward a potential obtained by subtracting the threshold voltage of the driving transistor from the potential of the first node while the potential of the first node is held.

In the above described driving method of organic electroluminescence emission part of the embodiments of the invention containing the above described preferred configuration, the step (a) may be the step of setting the potential of the second node by applying the predetermined intermediate voltage to the second node, applying the first node initializing voltage to the first node, then, floating the first node to hold OFF-state of the driving transistor, and applying the drive voltage from the power supply part to one source/drain region of the driving transistor.

In this case, at the step (a), the potential of the second node may be set by applying the predetermined intermediate voltage from the power supply part to the second node via the driving transistor. Alternatively, the drive circuit may further include a first transistor, and, in the first transistor, (C-1) the other source/drain region may be connected to the second node, (C-2) a gate electrode may be connected to a first transistor control line, and at the step (a), the potential of the second node may be set by applying the predetermined intermediate voltage to the second node via the first transistor turned into ON-state by a signal from the first transistor control line. Furthermore, at the step (a), the first node initializing voltage may be applied from the data line to the first node via the writing transistor turned into ON-state by the signal from the scan line.

In the above described driving method of organic electroluminescence emission part of the embodiments of the invention containing the above described various preferred configurations, at the step (b-1), the first node initializing voltage may be applied from the data line to the first node via the writing transistor turned into ON-state by the signal from the scan line. Alternatively, at the step (b-1), the second node initializing voltage may be applied from the power supply part to the second node via the driving transistor. Furthermore, the drive circuit may further include a first transistor, and, in the first transistor, (C-1) the other source/drain region may be connected to the second node, (C-2) a gate electrode may be connected to a first transistor control line, and at the step (b-1), a second node initializing voltage may be applied to the second node via the first transistor turned in to ON-state by a signal from the first transistor control line.

In the above described driving method of organic electroluminescence emission part of the embodiments of the invention containing the above described various preferred configurations, at the step (b-2), a condition in which the first node initializing voltage is applied from the data line to the first node via the writing transistor turned into ON-state by the signal from the scan line may be maintained, and thereby, the potential of the first node may be held. Alternatively, at the step (b-2), the drive voltage may be applied from the power supply part to one source/drain region of the drive transistor, and thereby, the potential of the second node may be changed toward the potential obtained by subtracting the threshold voltage of the driving transistor from the potential of the first node.

In the above described driving methods of organic electroluminescence emission part of the embodiments of the invention containing the above described various preferred configurations (hereinafter, these may be simply referred to as "driving methods of the embodiments of the invention" or "the embodiments of the invention"), at step (b), while the drive voltage is applied to one source/drain region of the driving transistor, the video signal may be applied from the data line. Thereby, at the same time with the writing processing, mobility correction processing of raising the potential of the second node according to the characteristic of the driving transistor is performed. The details of the mobility correction processing will be described later.

The organic electroluminescence display device (hereinafter, may be simply referred to as "organic EL display device") used in the embodiments of the invention, a so-called monochrome display configuration or color-display configuration may be employed. For example, a color display configuration in which one pixel includes plural sub-pixels, and specifically, one pixel includes three sub-pixels of a red light emitting sub-pixel, a green light emitting sub-pixel, and a blue light emitting sub-pixel may be employed. Further, one pixel may include one set of these three kinds of sub-pixels and additional one or plural kinds of sub-pixels (e.g., a set with an additional sub-pixel that emits white light for improvement in luminescence, a set with an additional sub-pixel that emits complementary color light for expansion of the range of color reproduction, a set with an additional sub-pixel that emits yellow light for expansion of the range of color reproduction, or a set with additional sub-pixels that emit yellow and cyan light for expansion of the range of color reproduction).

As values of pixels of the organic EL display device, some resolution for image display of VGA (640,840), S-VGA (800, 600), XGA (1024,768), APRC (1152,900), S-XGA (1280, 1024), U-XGA (1600,1200), HD-TV (1920,1080), Q-XGA (2048,1536), and (1920,1035), (720,480), (1280,960) etc. may be taken as examples, but the resolution is not limited to the values.

In the organic EL display device, configurations and structures of various circuits such as a scanning circuit and a signal output circuit, various kinds of wiring such as a scan line and a data line, the power supply part, the organic electroluminescence emission part (hereinafter, may be simply referred to as "emission part") may be known configurations and structures. Specifically, the emission part may include an anode electrode, a hole transport layer, an emission layer, an electron transport layer, a cathode electrode, etc.

As a transistor forming the drive circuit, an n-channel thin-film transistor (TFT) may be cited. The transistor forming the drive circuit may be of enhancement type or depression type. In the n-channel transistor, an LDD structure (Lightly Doped Drain structure) may be formed. In some instances, the LDD structure may be asymmetrically formed. For example, since a large current flows in the driving transistor when the organic electroluminescence display element (hereinafter, may be simply referred to as "organic EL display element") emits light, the LDD structure may be formed only at one source/drain region side that becomes the drain region side at emission. Note that a p-channel thin-film transistor may be used for the writing transistor or the like, for example.

A capacity part forming the drive circuit may be formed by one electrode, the other electrode, and a dielectric layer (insulating layer) between these electrodes. The above described transistor and capacity part forming the drive circuit are formed in a certain plane (e.g., formed on a support), and the emission part is formed above the transistor and the capacity part forming the drive circuit via an interlayer insulating layer, for example. Further, the other source/drain region of the driving transistor is connected to the anode electrode provided in the emission part via a contact hole, for example. Note that the transistor may be formed on a semiconductor substrate or the like.

As below, the embodiments of the invention will be explained with reference to the drawings, and prior to the explanation, the outline of an organic EL display device used in the respective embodiments will be explained.

<Explanation of Outline of an Organic Electroluminescence Display Device Used in the Respective Embodiments>

The organic EL display device suitable for use in the respective embodiments is an organic EL display device having plural pixels. One pixel includes plural sub-pixels (in the respective embodiments, three sub-pixels of a red light emitting sub-pixel, a green light emitting sub-pixel, and a blue light emitting sub-pixel). Each sub-pixel includes an organic EL display element 10 having a structure in which a drive circuit 11 and an emission part (emission part ELP) connected to the drive circuit 11 are stacked.

FIG. 1 is a conceptual diagram of an organic EL display device according to embodiment 1 and embodiment 2. FIG. 13 is a conceptual diagram of an organic EL display device according to embodiment 3 and embodiment 4, and FIG. 20 is a conceptual diagram of an organic EL display device according to embodiment 5.

Figure 2:
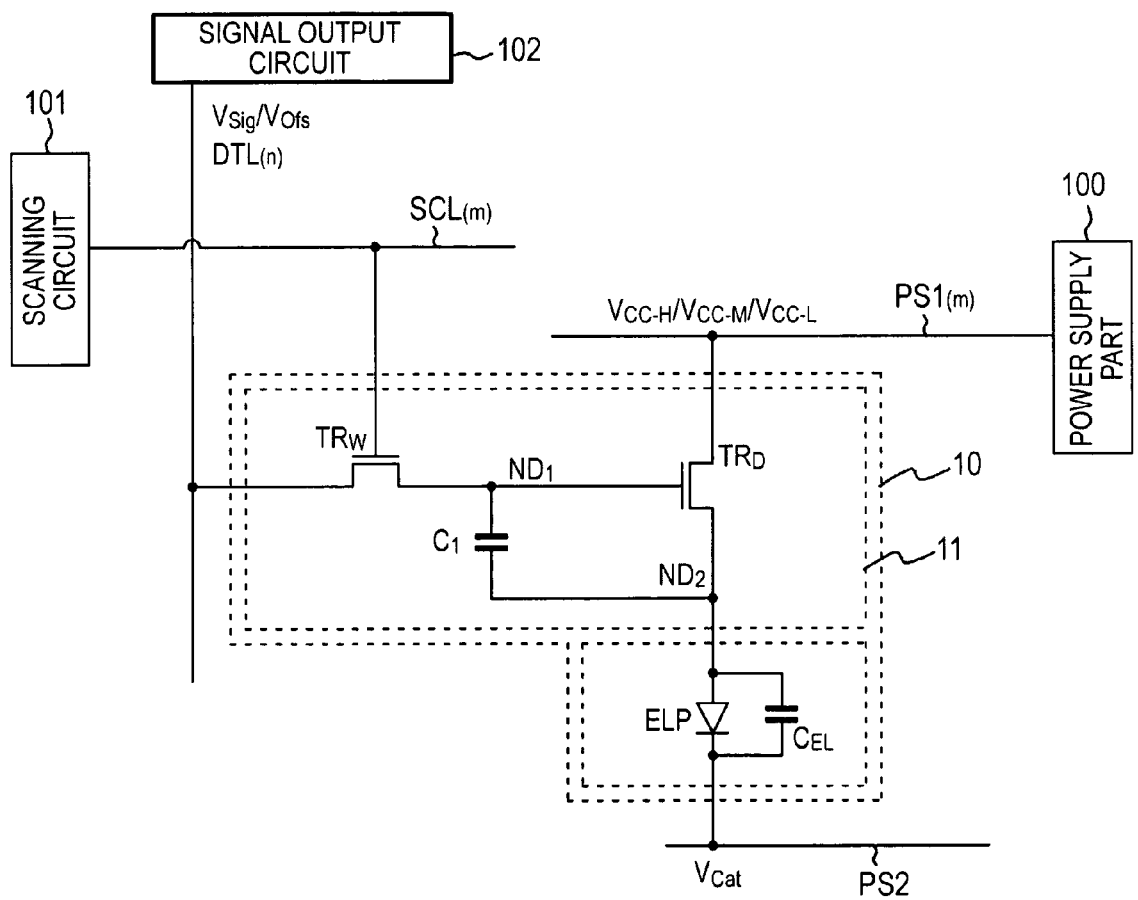
FIG. 2 is an equivalent circuit diagram of the organic electroluminescence display element including a drive circuit.
Figure 14:
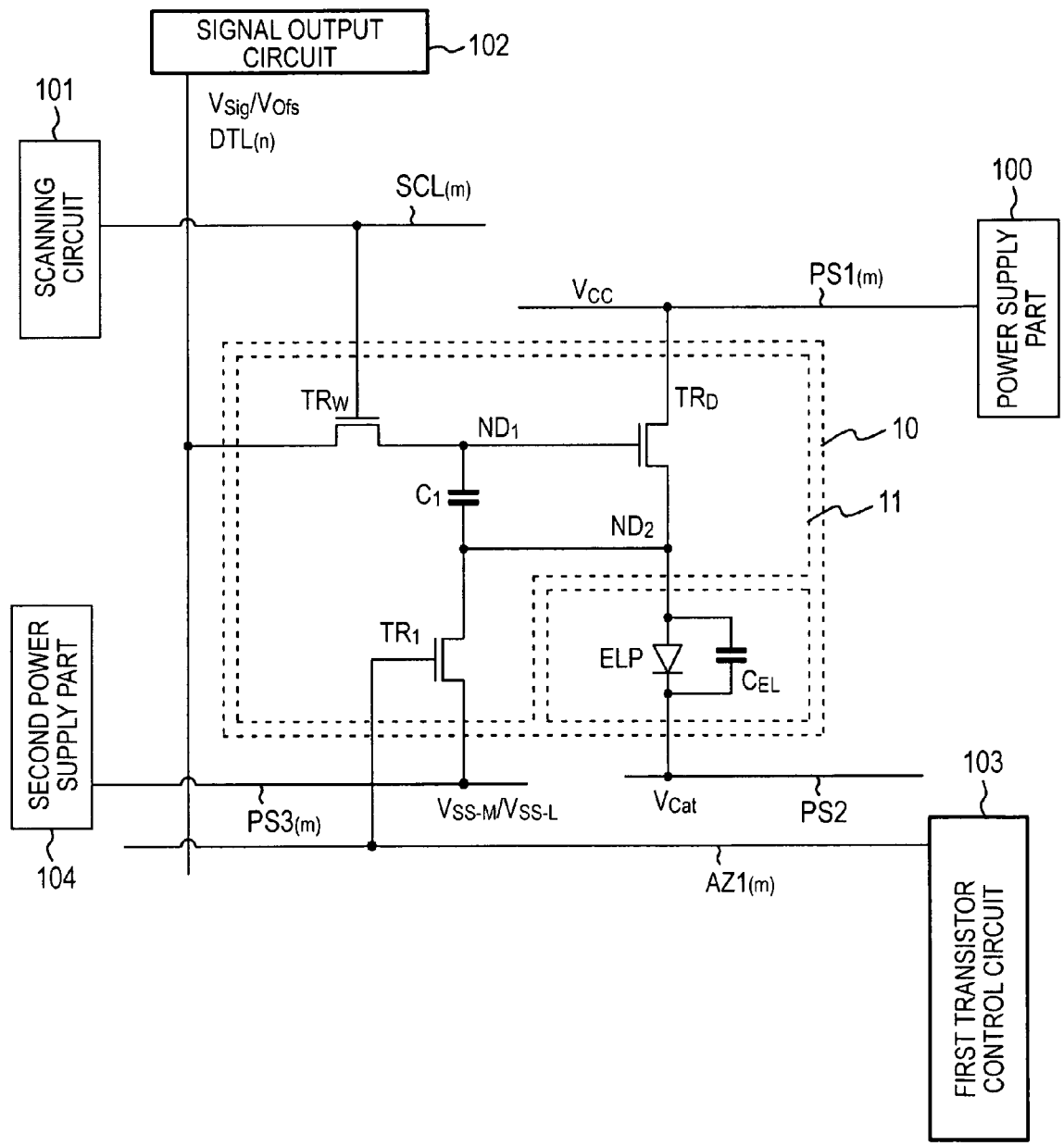
FIG. 14 is an equivalent circuit diagram of the organic electroluminescence display device including a drive circuit.
Figure 21:
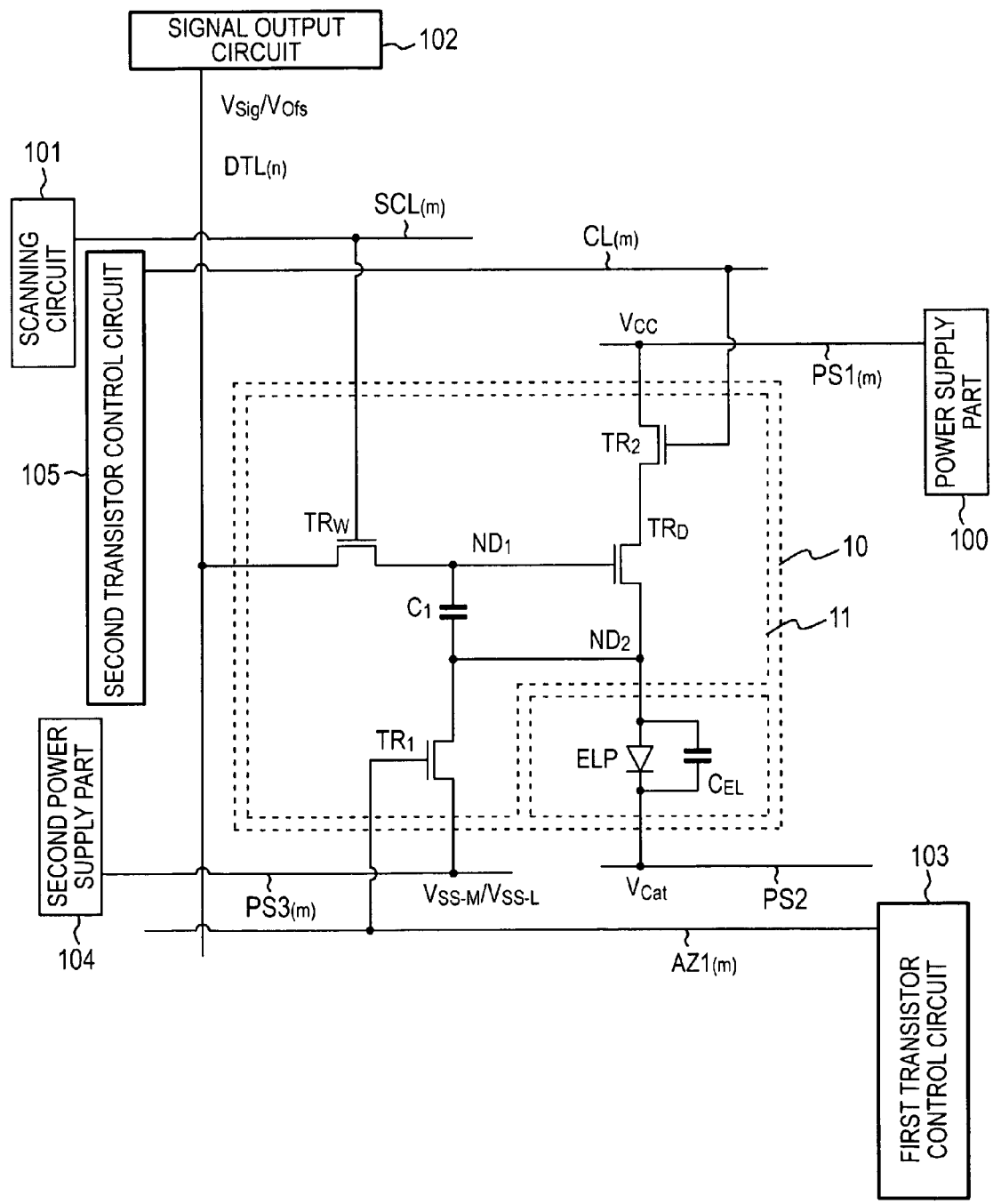
FIG. 21 is an equivalent circuit diagram of the organic electroluminescence display device including a drive circuit.

FIG. 2 shows a drive circuit basically including a two-transistors/one-capacity part (may be referred to as "2Tr/1C drive circuit"). FIG. 14 shows a drive circuit basically including three-transistors/one-capacity part (may be referred to as "3Tr/1C drive circuit"). FIG. 21 shows a drive circuit basically including four-transistors/one-capacity part (may be referred to as "4Tr/1C drive circuit").

Here, the organic EL display device in the respective embodiments includes:

(1) a scanning circuit 101;

(2) a signal output circuit 102;

(3) a total of N×M of the organic EL display elements 10 arranged in a two-dimensional matrix of N in the first direction and M in the second direction different from the first direction, each having the emission part ELP and the drive circuit 11 for driving the emission part ELP;

(4) M scan lines SCL connected to the scanning circuit 101 and extending in the first direction;

(5) N data lines DTL connected to the signal output circuit 102 and extending in the second direction; and (6) a power supply part 100.

In FIGS. 1, 13, and 20, 3×3 organic EL display elements 10 are shown, however, this is only an example. For convenience, in FIGS. 1, 13, and 20, a power supply line PS2 shown in FIG. 2 and the like is emitted.

The emission part ELP has known configuration and structure including an anode electrode, a hole transport layer, an emission layer, an electron transport layer, a cathode electrode, etc. The configurations and structures of the scanning circuit 101, the signal output circuit 102, the scan line SCL, the data line DTL, and the power supply part 100 may be known configurations and structures.

The minimum component elements of the drive circuit 11 will be explained. The drive circuit 11 includes at least a driving transistor $TR_D$, a writing transistor $TR_W$, and a capacity part $C_1$ having a pair of electrodes. The driving transistor $TR_D$ includes an n-channel TFT having source/drain regions, a channel formation region, and a gate electrode. Further, the writing transistor $TR_W$ also includes an n-channel TFT having source/drain regions, a channel formation region, and a gate electrode. The writing transistor $TR_W$ may include a p-channel TFT.

Here, in the driving transistor $TR_D$, (A-1) one source/drain region is connected to the power supply part 100, (A-2) the other source/drain region is connected to the anode electrode provided in the emission part ELP and connected to one electrode of the capacity part $C_1$, and forms a second node $ND_2$, and (A-3) the gate electrode is connected to the other source/drain region of the writing transistor $TR_W$ and connected to the other electrode of the capacity part $C_1$, and forms a first node $ND_1$.

Further, in the writing transistor $TR_W$, (B-1) one source/drain region is connected to the data line DTL, and (B-2) the gate electrode is connected to a scan line SCL.

Figure 3:
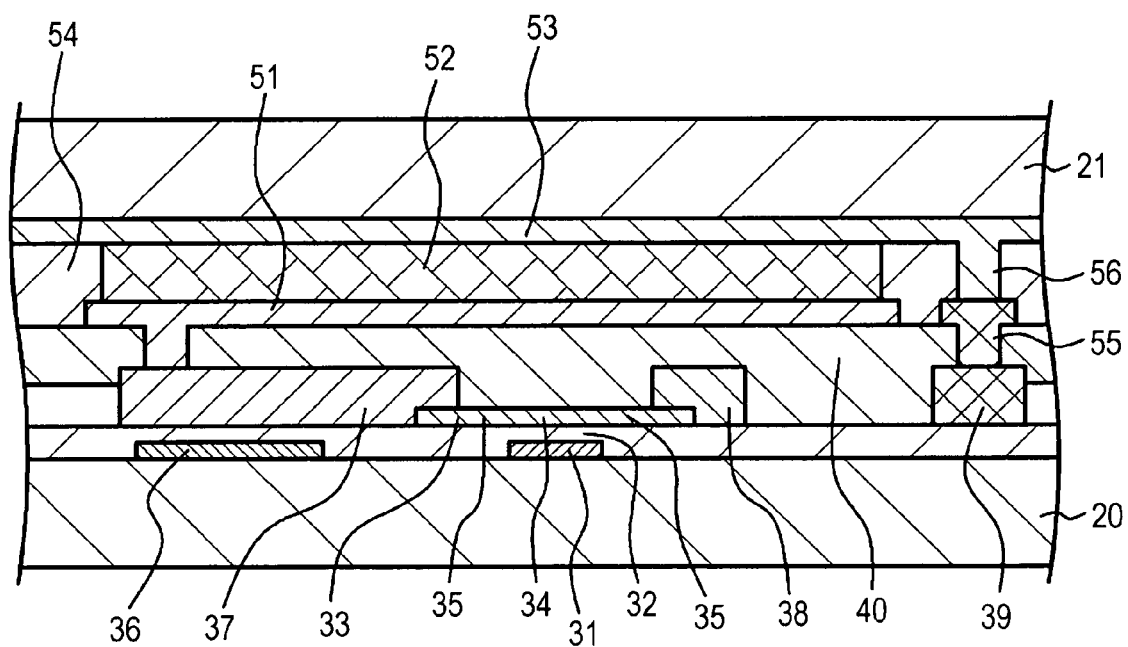
FIG. 3 is a schematic partial sectional view of the organic electroluminescence display device.

FIG. 3 is a schematic partial sectional view of a part of the organic EL display device. The transistors $TR_D$, $TR_W$ and the capacity part $C_1$ forming the derive circuit 11 are formed on a support 20, and the emission part ELP is formed above the transistors $TR_D$, $TR_W$ and the capacity part $C_1$ forming the drive circuit 11 via an interlayer insulating layer 40, for example. Further, the other source/drain region of the driving transistor $TR_D$ is connected to the anode electrode provided in the emission part ELP via a contact hole. In FIG. 3, only the driving transistor $TR_D$ is shown. The other transistor is hidden.

More specifically, the driving transistor $TR_D$ includes a gate electrode 31, a gate insulating layer 32, source/drain regions 35, 35 provided in a semiconductor layer 33, and a channel formation region 34 corresponding to a part of the semiconductor layer 33 between the source/drain regions 35, 35. On the other hand, the capacity part $C_1$ includes the other electrode 36, a dielectric layer formed by an extending portion of the gate insulating layer 32, and one electrode 37 (corresponding to the second node $ND_2$). The gate electrode 31, a part of the gate insulating layer 32, and the other electrode 36 forming the capacity part $C_1$ are formed on the support 20. The one source/drain region 35 of the driving transistor $TR_D$ is connected to a wire 38, and the other source/drain region 35 is connected to the one electrode 37. The driving transistor $TR_D$, the capacity part $C_1$, etc. are covered by the interlayer insulating layer 40, and the emission part ELP including an anode electrode 51, a hole transport layer, an emission layer, an electron transport layer, and a cathode electrode 53 is provided on the interlayer insulating layer 40. In the drawing, the hole transport layer, the emission layer, and the electron transport layer are shown by one layer 52. A second interlayer insulating layer 54 is provided on the part of the interlayer insulating layer 40 without the emission part ELP, a transparent substrate 21 is provided on the second interlayer insulating layer 54 and the cathode electrode 53, and light emitted in the emission layer passes through the substrate 21 and is output to the outside. The one electrode 37 (second node $ND_2$) and the anode electrode 51 are connected by a contact hole provided in the interlayer insulating layer 40. Further, the cathode electrode 53 is connected to a wire 39 provided on the extending portion of the gate insulating layer 32 via contact holes 56, 55 provided in the second interlayer insulating layer 54 and the interlayer insulating layer 40.

A manufacturing method of the organic EL display device shown in FIG. 3 and the like will be explained. First, on the support 20, various wires such as the scan line SCL, the electrodes forming the capacity part $C_1$, the transistors including semiconductor layers, the interlayer insulating layers, the contact holes, etc. are appropriately formed according to a known method. Then, deposition and patterning are performed according to a known method, and the emission parts ELP arranged in a matrix are formed. Then, the support 20 that has been through the above steps and the substrate 21 are opposed and sealed around and wiring connection to an external circuit is performed, for example, and thereby, an organic EL display device can be obtained.

The organic EL display device in the respective embodiments is a color display device including plural organic EL display elements 10 (e.g., N×M=1920×480). The respective organic EL display elements 10 form sub-pixels and a group including plural sub-pixels forms one pixel, and pixels are arranged in a two-dimensional matrix in a first direction and a second direction different from the first direction. One pixel includes three kinds of sub-pixels of a red light emitting sub-pixel that emits red light, a green light emitting sub-pixel that emits green light, and a blue light emitting sub-pixel that emits blue light arranged in the direction in which the scan line SCL extends.

The organic EL display device includes (N/3)×M pixels arranged in a two-dimensional matrix. The organic EL display elements 10 forming the respective pixels are line-sequentially scanned, and the display frame rate is FR (times/second). That is, the organic EL display elements 10 forming the respective (N/3) pixels (N sub-pixels) arranged in the mth row (here, m=1, 2, 3 . . . , M) are simultaneously driven. In other words, in the respective organic EL display elements 10 forming one row, their emission/non-emission times are controlled in units of rows to which they belong. Note that the processing of writing video signals with respect to each pixel forming one row may be processing of simultaneously writing the video signals to all pixels (hereinafter, may be simply referred to as "simultaneous writing processing"), or processing of sequentially writing the video signals with respect to each pixel (hereinafter, may be simply referred to as "sequential writing processing"). The writing processing may be appropriately selected according to the configuration of the organic EL display device.

As described above, the organic EL display elements 10 in the first row to Mth row are line-sequentially scanned. For convenience of explanation, the period assigned for scanning the respective rows of organic EL display elements 10 is expressed as "horizontal scan period". In the respective embodiments described as below, in each horizontal scan period, there are a period in which a first node initializing voltage is applied from the signal output circuit 102 to the data line DTL (hereinafter, referred to as "initialization period"), and then, a period in which a video signal $V_{Sig}$ is applied from the signal output circuit 102 to the data line DTL (hereinafter, referred to as "video signal period").

Here, in principle, the drive and operation relating to the organic EL display element 10 located in the mth row, the nth column (here, n=1, 2, 3 . . . , N) will be explained, and they will be referred to as "(n,m)th organic EL display element 10" or "(n,m)th sub-pixel". Further, before the horizontal scan period (the mth horizontal scan period) of the respective organic EL display elements 10 arranged in the mth row ends, various kinds of processing (threshold voltage cancel processing, writing processing, and mobility correction processing, which will be described later) are performed. Note that the writing processing and the mobility correction processing are performed within the mth horizontal scan period, and, in some cases, may be performed from the (m−m")th horizontal scan period to the mth horizontal scan period. On the other hand, depending on the drive circuit type, the threshold voltage cancel processing and the preprocessing therefor may be performed prior to the mth horizontal scan period.

Then, after all of the above described various kinds of processing are finished, the emission parts forming the respective organic EL display elements 10 arranged in the mth row are allowed to emit light. Note that, after all of the above described various kinds of processing are finished, the emission parts may promptly be allowed to emit light or emission parts may be allowed to emit light after a predetermined period (e.g., the horizontal scan period for a predetermined number of rows) has elapsed. The predetermined period may appropriately be set according to the specifications of the organic EL display device, the configuration of the drive circuit, or the like. Note that, in the following description, for convenience of explanation, after various kinds of processing ends, the emission parts are promptly allowed to emit light. Further, the emission state of the emission parts forming the respective organic EL display elements 10 arranged in the mth row is continued to the time immediately before the horizontal scan period of the respective organic EL display elements 10 arranged in the (m+m')th row. Here, "m" is determined according to the design specifications of the organic EL display device. That is, light emission of the emission parts forming the respective organic EL display elements 10 arranged in the mth row in a certain display frame is continued to the (m+m'−1)th horizontal scan period. On the other hand, from the start of the (m+m')th horizontal scan period to the completion of the writing processing and the mobility correction processing in the mth horizontal scan period in the next display frame, the emission parts forming the respective organic EL display elements 10 arranged in the mth row basically maintain the non-emission state. By providing the above described non-emission state period (hereinafter, may be simply referred to as "non-emission period"), after image blur due to active matrix drive is reduced and the more advanced moving image quality can be obtained. Note that the emission state/non-emission state of the respective sub-pixels (organic EL display elements 10) are not limited to the above described states. Further, the time length of the horizontal scan period is a time length less than (1/FR)×(1/M) seconds. When the value of (m+m') is larger than M, the excessive amount of horizontal scan period is processed in the next display frame.

In two source/drain regions of one transistor, the term "one source/drain region" may be used to mean the source/drain region at the side connected to the power supply part. Further, the ON-state of the transistor refers to the state that a channel is formed between the source/drain regions. It is not considered whether or not a current flows from one source/drain region to the other source/drain region of the transistor. On the other hand, the OFF-state of the transistor refers to the state that no channel is formed between the source/drain regions. Further, the mode that a source/drain region of a certain transistor is connected to a source/drain region of another transistor includes the mode that the source/drain region of the certain transistor and the source/drain region of the other transistor occupy the same region. Furthermore, the source/drain region may include not only a conducting material of polysilicon, amorphous silicon, or the like containing an impurity, but also include a layer formed by a metal, a metal alloy, conducting particles, a stacked structure of them, an organic material (conducting polymer). Further, in the timing charts used in the description as below, the length of the lateral axis indicating the respective periods (time length) is schematic, but does not show the proportions of time lengths of the respective periods. The same is applicable to the longitudinal axis. Furthermore, the waveform shapes in the timing charts are also schematic.

As below, the embodiments of the invention will be explained.

Embodiment 1

Embodiment 1 relates to a driving method of the organic electroluminescence emission part. In embodiment 1, the drive circuit 11 includes two-transistors/one-capacity part. FIG. 2 is an equivalent circuit diagram of the organic electroluminescence display element 10 including the drive circuit 11.

First, the details of the drive circuit and the emission part will be explained.

The drive circuit 11 includes two transistors of the writing transistor $TR_W$ and the driving transistor $TR_D$, and further includes one capacity part $C_1$ (2Tr/1C drive circuit).

[Driving Transistor $TR_D$]

One source/drain region of the driving transistor $TR_D$ is connected to the power supply part 100 via a power supply line PS1. On the other hand, the other source/drain region of the driving transistor $TR_D$ is connected to
[1] the anode electrode of the emission part ELP, and
[2] one electrode of the capacity part $C_1$,
and forms the second node $ND_2$. Further, the gate electrode of the driving transistor $TR_D$ is connected to
[1] the other source/drain region of the writing transistor $TR_W$, and
[2] the other electrode of the capacity part $C_1$, and forms the first node $ND_1$. The voltage supplied from the power supply part 100 will be described later.

Here, the driving transistor $TR_D$ is driven to flow a drain current $I_{ds}$ according to the following expression (1) in the emission state of the organic EL display element 10. In the emission state of the organic EL display element 10, the one source/drain region of the driving transistor $TR_D$ serves as a drain region and the other source/drain region serves as a source region. For convenience of explanation, in the description as below, the one source/drain region of the driving transistor $TR_D$ may be simply referred to as "drain region", and the other source/drain region may be simply referred to as "source region". Here, each symbol denotes as follows.

μ: effective mobility
L: channel length
W: channel width
$V_{gs}$: potential difference between gate electrode and source region
$V_{th}$: threshold voltage
$C_{OX}$: (relative permittivity of gate insulating layer)×(permittivity of vacuum)/(thickness of gate insulating layer)

$$k \equiv (1/2) \cdot (W/L) \cdot C_{OX}$$

$$I_{ds} = k \cdot \mu \cdot (V_{gs} - V_{th})^2 \quad (1)$$

The drain current $I_{ds}$ flows in the emission part ELP of the organic EL display element 10, and the emission part ELP of the organic EL display element 10 emits light. Further, depending on the magnitude of the value of the drain current $I_{ds}$, the emission state (luminance) in the emission part ELP of the organic EL display element 10 is controlled.

[Writing Transistor $TR_W$]

The other source/drain region of the writing transistor $TR_W$ is connected to the gate electrode of the driving transistor $TR_D$ as described above. On the other hand, the one source/drain region of the writing transistor $TR_W$ is connected to the data line DTL. Further, from the signal output circuit 102 via the data line DTL, the video signal (drive signal, luminance signal) $V_{Sig}$ for controlling the luminance in the emission part ELP and the first node initializing voltage, which will be described later, are supplied to the one source/drain region. Note that, via the data line DTL, other various signals and voltages (e.g., signals for pre-charge driving, various reference voltages, or the like) may be supplied to the one source/drain region. Further, the ON/OFF operation of the writing transistor $TR_W$ is controlled by the signal from the scan line SCL connected to the gate electrode of the writing transistor $TR_W$, specifically, the signal from the scanning circuit 101.

[Emission Part ELP]

The anode electrode of the emission part ELP is connected to the source region of the driving transistor $TR_D$ as described above. On the other hand, the cathode electrode of the emission part ELP is connected to a power supply line PS2 to which a voltage $V_{Cat}$ is applied. The parasitic capacity of the emission part ELP is expressed by $C_{EL}$. Further, the threshold voltage necessary for emission of the emission part ELP is $V_{th-EL}$. That is, if a voltage equal to or more than $V_{th-EL}$ is applied between the anode electrode and the cathode electrode of the emission part ELP, the emission part ELP emits light.

In the description as below, the voltage or potential values are set as follows, however, they are values only for explanation and not limited to the values. The same is applicable to the other embodiments, which will be described later.

Figure 4:
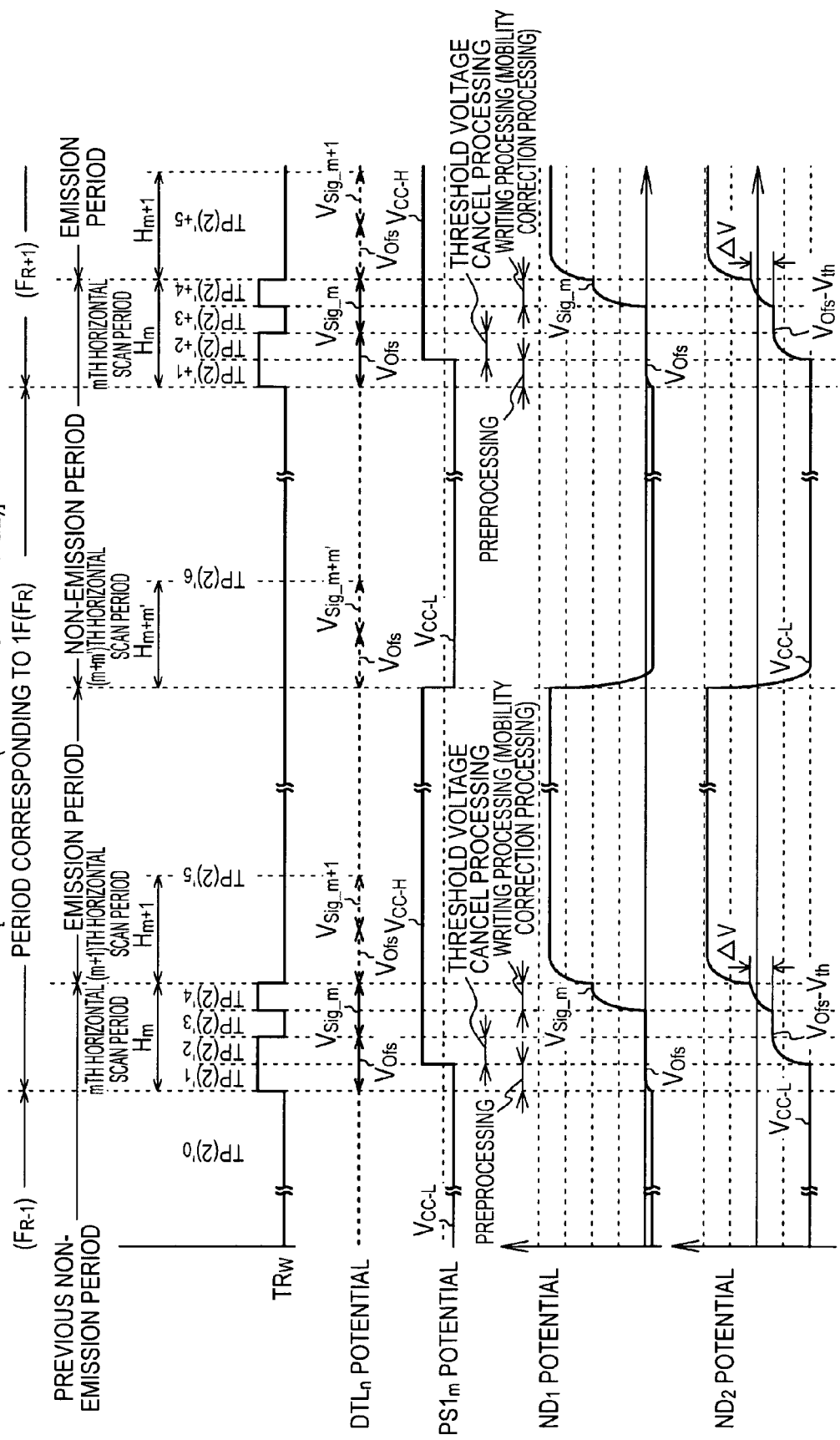
FIG. 4 is a schematic diagram of a drive timing chart of an organic electroluminescence emission part according to a reference example.

$V_{Sig}$: video signal for controlling luminance in emission part ELP, zero volts to 10 volts
$V_{CC-H}$: drive voltage for flowing current in emission part ELP, 20 volts
$V_{CC-M}$: intermediate voltage, 2 volts
$V_{CC-L}$: second node initializing voltage, −10 volts
$V_{Ofs}$: first node initializing voltage for initializing potential of gate electrode of driving transistor $TR_D$ (potential of first node $ND_1$), zero volts
$V_{th}$: design value of threshold voltage of driving transistor $TR_D$, 3 volts
$V_{cat}$: voltage applied to cathode electrode of emission part ELP, zero volts
$V_{th-EL}$: threshold voltage of emission part ELP, 3 volts First, for a better understanding of the invention, an operation of a driving method of a reference example using the organic EL display device according to embodiment 1 and problems in this case will be explained. FIG. 4 schematically shows a drive timing chart of the emission part ELP according to the reference example, and FIGS. 5A to 5F and FIGS. 6A and 6B schematically show ON/OFF states etc. of the respective transistors.

The driving method of the emission part ELP in the reference example includes, using the above described drive circuit 11, the steps of:

(a') performing preprocessing of initializing the potential of the first node $ND_1$ and the potential of the second node $ND_2$ so that the potential difference between the first node $ND_1$ and the second node $ND_2$ may exceed the threshold voltage $V_{th}$ of the driving transistor $TR_D$ and the potential difference between the second node $ND_2$ and the cathode electrode provided in the emission part ELP may not exceed the threshold voltage $V_{th\text{-}EL}$ of the emission part ELP; then (b') performing threshold voltage cancel processing of changing the potential of the second node $ND_2$ toward a potential obtained by subtracting the threshold voltage $V_{th}$ of the driving transistor $TR_D$ from the potential of the first node $ND_1$ while the potential of the first node $ND_1$ is held; then (c') performing writing processing of applying the video signal $V_{Sig}$ from the data line DTL to the first node $ND_1$ via the writing transistor $TR_W$ turned into ON-state by the signal from the scan line SCL; then (d') floating the first node $ND_1$ by turning the writing transistor $TR_W$ into OFF-state by the signal from the scan line SCL;

(e') driving the emission part ELP by flowing a current according to a value of the potential difference between the first node $ND_1$ and the second node $ND_2$ in the emission part ELP from the power supply part 100 via the driving transistor $TR_D$; and then (f') applying the second node initializing voltage $V_{CC\text{-}L}$ to the second node $ND_2$ from the power supply part 100 via the driving transistor $TR_D$ to turn the emission part ELP into the non-emission state.

[period-TP(2)e] to [period-TP(2)$_3$'] shown in FIG. 4 are operation periods immediately before [period-TP(2)$_4$'] in which writing processing is performed. Further, in [period-TP(2)$_0$'] to [period-TP(2)$_3$'], the (n,m)th organic EL display element 10 is basically in the non-emission state. As shown in FIG. 4, not only [period-TP(2)$_4$'] but also [period-TP(2)$_1$'] to [period-TP(2)$_3$'] are contained in the mth horizontal scan period $H_m$.

For convenience of explanation, the start of the [period-TP(2)$_1$'] coincides with the start of the initialization period in the mth horizontal scan period $H_m$ (the period in which the potential of the data line DTL is $V_{Ofs}$ in FIG. 4, and the same is applicable to the other horizontal scan periods). Similarly, the end of the [period-TP(2)$_2$'] coincides with the end of the initialization period in the horizontal scan period $H_m$. Further, the start of the [period-TP(2)$_3$'] coincides with the start of the video signal period in the horizontal scan period $H_m$ (the period in which the potential of the data line DTL is $V_{Sig\_m}$ in FIG. 4, which will be described later).

As below, the respective periods of [period-TP(2)$_0$'] to [period-TP(2)$_{+5}$'] will be explained. The lengths of the respective periods of [period-TP(2)$_1$'] to [period-TP(2)$_3$'] may be appropriately set according to the design of the organic EL display device.

[period-TP(2)$_0$'] (See FIGS. 4 and 5A)

The [period-TP(2)$_0$'] is for an operation from the previous display frame to the current display frame, for example. That is, the period is a period from the start of the (m+m')th horizontal scan period in the previous display frame to the (m−1)th horizontal scan period in the current display frame. Further, in the [period-TP(2)$_0$'], the (n,m)th organic EL display element 10 is in the non-emission state. At the start of [period-TP(2)$_0$'] (not shown), the voltage supplied from the power supply part 100 is switched from the drive voltage $V_{CC\text{-}H}$ to the second node initializing voltage $V_{CC\text{-}L}$. As a result, the potential of the second node $ND_2$ becomes lower to $V_{CC\text{-}L}$, a reverse voltage is applied between the anode electrode and the cathode electrode of the emission part ELP, and the emission part ELP is turned into the non-emission state. Further, according to the potential drop of the second node $ND_2$, the potential of the floating first node $ND_1$ (the gate electrode of the driving transistor $TR_D$) also becomes lower.

As described above, in the respective horizontal scan periods, the first node initializing voltage $V_{Ofs}$ is applied from the signal output circuit 102 to the data line DTL, and then, the video signal $V_{Sig}$ is applied thereto in place of the first node initializing voltage $V_{Ofs}$. More specifically, according to the mth horizontal scan period $H_m$ in the current display frame, the first node initializing voltage $V_{Ofs}$ is applied to the data line DTL, and then, the video signal (for convenience, expressed as $V_{Sig\_m}$, the same is applicable to other video signals) corresponding to the (n,m)th sub-pixel is applied thereto in place of the first node initializing voltage $V_{Ofs}$. Similarly, according to the (m+1)th horizontal scan period $H_{m+1}$, the first node initializing voltage $V_{Ofs}$ is applied to the data line DTL, and then, the video signal $V_{Sig\_m+1}$ corresponding to the (n,m+1)th sub-pixel is applied thereto in place of the first node initializing voltage $V_{Ofs}$. In FIG. 4, though the description is omitted, in the respective horizontal scan periods other than the horizontal scan periods $H_m$, $H_{m+1}$, $H_{m+m'}$, the first node initializing voltage $V_{Ofs}$ and the video signal $V_{Sig}$ are applied to the data line DTL.

[period-TP(2)$_1$'] (See FIGS. 4 and 5B)

Then, the mth horizontal scan periods $H_m$ in the current display frame starts. In the [period-TP(2)$_1$'], the above mentioned step (a') is performed.

Specifically, at the start of [period-TP(2)$_1$'], the scan line SCL is turned into HIGH-level to turn the writing transistor $TR_W$ into ON-state. The voltage applied from the signal output circuit 102 to the data line DTL is $V_{Ofs}$ (initialization period). As a result, the potential of the first node $ND_1$ becomes $V_{Ofs}$ (zero volts). Since the second node initializing voltage $V_{CC\text{-}L}$ is applied from the power supply part 100 to the second node $ND_2$, the potential of the second node $ND_2$ is held at $V_{CC\text{-}L}$ (−10 volts).

Since the potential difference between the first node $ND_1$ and the second node $ND_2$ is 10 volts and the threshold voltage $V_{th}$ of the driving transistor $TR_D$ is 3 volts, the driving transistor $TR_D$ is in ON-state. The potential difference between the second node $ND_2$ and the cathode electrode provided in the emission part ELP is −10 volts and does not exceed the threshold voltage $V_{th\text{-}EL}$ of the emission part ELP. Thereby, the preprocessing of initializing the potential of the first node $ND_1$ and the potential of the second node $ND_2$ is completed.

[period-TP(2)$_2$'] (See FIGS. 4 and 5C)

In the [period-TP(2)$_2$'], the above mentioned step (b') is performed.

That is, while the ON-state of the writing transistor $TR_W$ is maintained, the voltage supplied from the power supply part 100 is switched from $V_{CC\text{-}L}$ to $V_{CC\text{-}H}$. As a result, though the potential of the first node $ND_1$ is not changed ($V_{Ofs}$=zero volt is maintained), the potential of the second node $ND_2$ changes toward the potential obtained by subtracting the threshold voltage $V_{th}$ of the driving transistor $TR_D$ from the potential of the first node $ND_1$. That is, the potential of the floating second node $ND_2$ rises. For convenience of explanation, the length of [period-TP(2)$_2$] is a length enough to sufficiently change the potential of the second node $ND_2$.

If the length of [period-TP(2)$_2$'] is sufficiently long, the potential difference between the gate electrode and the other source/drain region of the driving transistor $TR_D$ reaches $V_{th}$, and the driving transistor $TR_D$ turns into OFF-state. That is, the potential of the floating second node $ND_2$ becomes closer to ($V_{Ofs}-V_{th}$=−3 volts), and finally becomes ($V_{Ofs}-V_{th}$). Here, if the following expression (2) is ensured, in other words, if the potentials are selected and determined to satisfy the following expression (2), the emission part ELP emits no light.

$$(V_{Ofs}-V_{th}) < (V_{th\text{-}EL}-V_{Cat}) \qquad (2)$$

In the [period-TP(2)$_2$'], the potential of the second node $ND_2$ finally becomes ($V_{Ofs}-V_{th}$). That is, the potential of the second node $ND_2$ is determined depending only on the threshold voltage $V_{th}$ of the driving transistor $TR_D$, the voltage $V_{Ofs}$ for initializing the potential of the gate electrode of the driving transistor $TR_D$. Further, the potential is independent of the threshold voltage $V_{th\text{-}EL}$ of the emission part ELP.

[period-TP$(2)_3$'] (See FIGS. 4 and 5D)

At the start of the [period-TP$(2)_3$'], the writing transistor $TR_W$ is turned into OFF-state by the signal from the scan line SCL. Further, the voltage applied to the data line DTL is switched from the first node initializing voltage $V_{Ofs}$ to the video signal $V_{Sig\_m}$ (video signal period). If the driving transistor $TR_D$ has reached OFF-state in the threshold voltage cancel processing, the potentials of the first node $ND_1$ and the second node $ND_2$ are substantially unchanged. Note that, if the driving transistor $TR_D$ has not reached OFF-state in the threshold voltage cancel processing, a bootstrap operation occurs in the [period-TP$(2)_3$'], and the potentials of the first node $ND_1$ and the second node $ND_2$ become slightly higher.

[period-TP$(2)_4$'] (See FIGS. 4 and 5E)

Within the period, the above mentioned step (c') is performed. The writing transistor $TR_W$ is turned into ON-state by the signal from the scan line SCL. Further, via the writing transistor $TR_W$, the video signal $V_{Sig\_m}$ is applied from the data line DTL to the first node $ND_1$. As a result, the potential of the first node $ND_1$ rises to the video signal $V_{Sig\_m}$. The driving transistor $TR_D$ is in ON-state. In some cases, ON-state of the writing transistor $TR_W$ may be held in the [period-TP$(2)_3$']. In the configuration, writing processing is started immediately after the voltage of the data line DTL is switched from the first node initializing voltage $V_{Ofs}$ to the video signal $V_{Sig\_m}$.

Here, given that the capacity of the capacity part $C_1$ is a value $c_1$, the capacity of the capacity $C_{EL}$ of the emission part ELP is a value $c_{EL}$, and further, the parasitic capacity between the gate electrode and the other source/drain region of the driving transistor $TR_D$ is a value $c_{gs}$, when the potential of the gate electrode of the driving transistor $TR_D$ changes from $V_{Ofs}$ to $V_{Sig\_m}$ ($>V_{Ofs}$) the potentials at ends of the capacity part $C_1$ (the potentials of the first node $ND_1$ and the second node $ND_2$) basically change. That is, the charge based on the amount of change ($V_{Sig\_m}-V_{Ofs}$) of the potential of the gate electrode of the driving transistor $TR_D$ (=potential of the first node $ND_1$) is assigned to the capacity part $C_1$, the capacity $C_{EL}$ of the emission part ELP, and the parasitic capacity between the gate electrode and the other source/drain region of the driving transistor $TR_D$. Hence, if the value $c_{EL}$ is a sufficiently large value compared to the value $c_1$ and the value $c_{gs}$, the change of the potential of the other source/drain region of the driving transistor $TR_D$ (second node $ND_2$) according to the amount of change ($V_{Sig\_m}-V_{Ofs}$) of the potential of the gate electrode of the driving transistor $TR_D$ is small. Further, typically, the value $c_{EL}$ of the capacity $C_{EL}$ of the emission part ELP is larger than the value $c_1$ of the capacity part $C_1$ and the value $c_{gs}$ of the parasitic capacity of the driving transistor $TR_D$. Accordingly, the above described explanation has been made without consideration of the potential change of the second node $ND_2$ generated by the potential change of the first node $ND_1$. Further, except the case where there is a particular necessity, the explanation is made without consideration of the potential change of the second node $ND_2$ generated by the potential change of the first node $ND_1$. The same is applicable to the other embodiments. Note that the drive timing chart is formed without consideration of the potential change of the second node $ND_2$ generated by the potential change of the first node $ND_1$.

In the above described writing processing, while the drive voltage $V_{CC\text{-}H}$ is applied from the power supply part 100 to one source/drain region of the driving transistor $TR_D$, the video signal $V_{Sig\_m}$ is applied to the gate electrode of the driving transistor $TR_D$. Accordingly, as shown in FIG. 4, in [period-TP$(2)_4$'], the potential of the second node $ND_2$ rises. The amount of rise of the potential ($\Delta V$ shown in FIG. 4) will be described later. Given that the potential of the gate electrode of the driving transistor $TR_D$ (first node $ND_1$) is $V_g$, and the potential of the other source/drain region of the driving transistor $TR_D$ (second node $ND_2$) is $V_s$, if the rise of the potential of the second node $ND_2$ is not considered, the value of $V_g$ and the value of $V_s$ are as follows. The potential difference between the first node $ND_1$ and the second node $ND_2$, i.e., the potential difference $V_{gs}$ between the gate electrode and the other source/drain region serving as the source region of the driving transistor $TR_D$ can be expressed by the following expressions (3).

$$V_g = V_{Sig\_m}$$

$$V_s \approx V_{Ofs} - V_{th}$$

$$V_{gs} \approx V_{Sig\_m} - (V_{Ofs} - V_{th}) \quad (3)$$

That is, $V_{gs}$ obtained in the writing processing in the driving transistor $TR_D$ depends only on the video signal $V_{Sig\_m}$ for controlling the luminance in the emission part ELP, the threshold voltage $V_{th}$ of the driving transistor $TR_D$, and the voltage $V_{Ofs}$ for initializing the potential of the gate electrode of the driving transistor $TR_D$. Further, it is independent of the threshold voltage $V_{th\text{-}EL}$ of the emission part ELP.

Subsequently, the rise of the potential of the second node $ND_2$ in the [period-TP$(2)_4$'] will be explained. In the above described driving method of the reference example, in the writing processing, mobility correction processing of changing the other source/drain region of the driving transistor $TR_D$ (i.e., the potential of the second node $ND_2$) according to the characteristic of the driving transistor $TR_D$ (e.g., magnitude of mobility $\mu$ or the like) is also performed.

In the case where the driving transistor $TR_D$ is fabricated from a polysilicon thin-film transistor or the like, variations in mobility $\mu$ produced among transistors may be unavoidable. Accordingly, if the video signals $V_{Sig}$ having the same value are applied to the plural driving transistors $TR_D$ having difference in mobility $\mu$, there may be a difference between the drain current $I_{ds}$ flowing in the driving transistor $TR_D$ having large mobility $\mu$ and the drain current $I_{ds}$ flowing in the driving transistor $TR_D$ having the small mobility $\mu$. When there is such a difference, uniformity of the screen of the organic EL display device is deteriorated.

In the above described driving method of the reference example, while the drive voltage $V_{CC\text{-}H}$ is applied from the power supply part 100 to one source/drain region of the driving transistor $TR_D$, the video signal $V_{Sig\_m}$ is applied to the gate electrode of the driving transistor $TR_D$. Accordingly, as shown in FIG. 4, in [period-TP$(2)_4$'], the potential of the second node $ND_2$ rises. If the value of the mobility $\mu$, of the driving transistor $TR_D$ is large, the amount of rise $\Delta V$ (potential correction value) of the potential (i.e., the potential of the second node $ND_2$) in the other source/drain region of the driving transistor $TR_D$ becomes larger. Contrary, if the value of the mobility $\mu$ of the driving transistor $TR_D$ is small, the amount of rise of the potential $\Delta V$ (potential correction value) in the other source/drain region of the driving transistor $TR_D$ becomes smaller. Here, the potential difference $V_{gs}$ between the gate electrode and the other source/drain region serving as the source region of the driving transistor $TR_D$ is transformed from the expression (3) to the following expression (4).

$$V_{gs} \approx V_{Sig\_m} - (V_{Ofs} - V_{th}) - \Delta V \quad (4)$$

Note that, a predetermined time for executing the writing processing (the whole time ($t_0$) of the [period-TP(2)$_4$'] in FIG. 4) may be determined in advance as a design value at designing of the organic EL display device. Further, the whole time $t_0$ of [period-TP(2)$_4$'] is determined so that the potential ($V_{Ofs}-V_{th}+\Delta V$) in the other source/drain region of the driving transistor TR$_D$ may satisfy the following expression (2'). Thereby, in [period-TP(2)$_4$'], the emission part ELP emits no light. Furthermore, correction of variations of the coefficient k ($\equiv(1/2)\cdot(W/L)\cdot C_{OX}$) is simultaneously performed by the mobility correction processing.

$$(V_{Ofs}-V_{th}+\Delta V) < (V_{th-EL}+V_{Cat}) \qquad (2')$$

[period-TP(2)$_5$'] (See FIG. 4 and FIG. 5F)

Through the above operation, step (a') to step (c') are completed. Then, in the [period-TP(2)$_5$'], the above mentioned step (d') and step (e') are performed. That is, while the condition in which the voltage $V_{CC-H}$ is applied from the power supply part 100 to one source/drain region of the driving transistor TR$_D$ is maintained, the scan line SCL is turned into LOW-level according to the operation of the scanning circuit 101, the writing transistor TR$_W$ is turned into OFF-state, and the first node ND$_1$, i.e., the gate electrode of the driving transistor TR$_D$ is floated. Therefore, as a result, the potential of the second node ND$_2$ rises.

Here, as described above, the gate electrode of the driving transistor TR$_D$ is floated and the same phenomenon as that in a so-called bootstrap circuit occurs in the gate electrode of the driving transistor TR$_D$ due to the existence of the capacity part C$_1$, and the potential of the first node ND$_1$ also rises. As a result, the potential difference $V_{gs}$ between the gate electrode and the other source/drain region serving as the source region of the driving transistor TR$_D$ basically holds the value of the expression (4).

Further, the potential of the second node ND$_2$ rises and exceeds ($V_{th-EL}+V_{Cat}$), and thereby, the emission part ELP starts to emit light. The current flowing in the emission part ELP is the drain current $I_{ds}$ flowing from the drain region to the source region of the driving transistor TR$_D$, and can be expressed by the expression (1). Here, from the expression (1) and the expression (4), the expression (1) can be transformed into the following expression (5).

$$I_{ds}=k\cdot\mu\cdot(V_{Sig\_m}-V_{Ofs}-\Delta V)^2 \qquad (5)$$

Therefore, the current $I_{ds}$ flowing in the emission part ELP is, when $V_{Ofs}$ is set to zero volt, for example, proportional to the square of the value obtained by subtracting the potential correction value $\Delta V$ due to the mobility $\mu$ of the driving transistor TR$_D$ from the value of the video signal $V_{Sig\_m}$ for controlling the luminescence in the emission part ELP. In other words, the current $I_{ds}$ flowing in the emission part ELP does not depend on the threshold voltage $V_{th-EL}$ of the emission part ELP or the threshold voltage $V_{th}$ of the driving transistor TR$_D$. That is, the amount of light emission (luminescence) of the emission part ELP is not affected by the threshold voltage $V_{th-EL}$ of the emission part ELP or the threshold voltage $V_{th}$ of the driving transistor TR$_D$. Further, the luminescence of the (n,m)th organic EL display element 10 corresponds to the value of the current $I_{ds}$.

In addition, the larger the mobility $\mu$ of the driving transistor TR$_D$, the larger the potential correction value $\Delta V$, and thus, the value of $V_g$ at the left-hand side of expression (4) becomes smaller. Therefore, in expression (5), even when the mobility $\mu$ is large, the value of $(V_{Sig\_m}-V_{Ofs}-\Delta V)^2$ becomes smaller, and, as a result, the drain current $I_{ds}$ can be corrected. That is, in the driving transistors TR$_D$ having different mobility $\mu$, when the values of the video signals $V_{Sig}$ are the same, the drain currents $I_{ds}$ become substantially the same. As a result, the currents $I_{ds}$ flowing in the emission part ELP and controlling the luminescence of the emission part ELP are uniformized. Thereby, variations in the luminescence of the emission part ELP due to variations in the mobility $\mu$ (further, variations in k) can be corrected.

Then, the emission state of the emission part ELP continues to the (m+m'-1)th horizontal scan period. The end of the (m+m'-1)th horizontal scan period corresponds to the end of the [period-TP(2)$_5$']. Here, "m'" satisfies the relationship 1<m'<M and is a predetermined value in the organic EL display device. In other words, the emission part ELP is driven from the start of the (m+1)th horizontal scan period H$_{m+1}$ to immediately before the (m+m')th horizontal scan period H$_{m+m'}$, and the period is the emission period.

[period-TP(2)$_6$'] (See FIGS. 4 and 6A)

Then, the above mentioned step (f') is performed, and the emission part ELP is turned into the non-emission state.

Specifically, while the OFF-state of the writing transistor TR$_W$ is maintained, the voltage supplied from the power supply part 100 is switched from $V_{CC-H}$ to $V_{CC-L}$ at the start of [period-TP(2)$_6$'] (in other words, the start of the (m+m')th horizontal scan period H$_{m+m'}$). As a result, the potential of the second node ND$_2$ becomes lower to $V_{CC-L}$ and a reverse voltage is applied between the anode electrode and the cathode electrode of the emission part ELP, and the emission part ELP turns into the non-emission state. Further, according to the potential drop of the second node ND$_2$, the potential of the floating first node ND$_1$ (the gate electrode of the driving transistor TR$_D$) also becomes lower.

Then, the above described non-emission state is continued to immediately before the mth horizontal scan period H$_m$ in the next frame. The time corresponds to immediately before the start of [period-TP(2)$_{+1}$'] shown in FIG. 4. In this manner, by providing the non-emission period, after image blur due to active matrix drive is reduced and the more advanced moving image quality can be obtained. For example, if m'=M/2, the time lengths of the emission period and the non-emission period are substantially the half of the time length of one display frame, respectively.

Then, in [period-TP(2)$_{+1}$'] and the subsequent periods, the same steps as those described in [period-TP(2)$_1$'] to [period-TP(2)$_6$'] are repeatedly performed (see FIG. 4 and FIG. 6B). That is, the [period-TP(2)$_6$'] shown in FIG. 4 corresponds to the next [period-TP(2)$_0$'].

In the above described driving method of the reference example, the potential of the gate electrode of the driving transistor TR$_D$ in the emission period is higher than the potential of the channel formation region between the source/drain regions. Further, the large part of the non-emission period is occupied by the [period-TP(2)$_6$'] shown in FIG. 4, and the potential of the gate electrode of the driving transistor TR$_D$ is also higher than the potential of the channel formation region between the source/drain regions in the [period-TP(2)$_6$']. Therefore, when the emission part ELP is driven according to the above described driving method, it is recognized that the characteristic of the driving transistor TR$_D$ tends to shift to the enhancement side due to temporal change.

For example, it is assumed that the value of the threshold voltage $V_{th}$ of the driving transistor TR$_D$ becomes higher by 3 volts from the 3 volts as the design value to 6 volts. Here, the potential of the second node ND$_2$ at the end of [period-TP(2)$_2$'] becomes lower by 3 volts to −6 volts. Consequently, the potential of the second node ND$_2$ at the end of [period-TP(2)$_4$'] when the writing processing ends also becomes lower by 3 volts than the potential when the threshold voltage $V_{th}$ of the driving transistor TR$_D$ is 3 volts.

If the bootstrap operation in [period-TP(2)$_5$'] of FIG. 4 is ideally performed, the value of the potential difference between the first node ND$_1$ and the second node ND$_2$ in [period-TP(2)$_4$'] is also maintained in [period-TP(2)$_5$']. Since the drain current is given by the expression (5), if the characteristic of the driving transistor TR$_D$ shifts to the enhancement side, the shift does not affect the luminescence of the display device.

However, in practice, when the potential of the first node ND$_1$ rises in the bootstrap operation, the amount of change in the potential of the first node ND$_1$ is divided by the capacity part C$_1$, the capacity C$_{EL}$, etc. and the potential of the second node ND$_2$ rises. That is, the amount of rise of the potential of the second node ND$_2$ is slightly smaller than the amount of rise of the potential of the first node ND$_1$. In other words, through the bootstrap operation, the potential difference between the first node ND$_1$ and the second node ND$_2$ becomes smaller. The amount of change in the potential difference between the first node ND$_1$ and the second node ND$_2$ becomes larger as the potential change of the first node ND$_1$ in the bootstrap operation is larger.

As described above, when the value of the threshold voltage V$_{th}$ of the driving transistor TR$_D$ is 6 volts, higher by 3 volts from the 3 volts as the design value, the potential of the second node ND$_2$ at the end of [period-TP(2)$_4$'] also becomes lower by 3 volts than the potential when the threshold voltage V$_{th}$ of the driving transistor TR$_D$ is 3 volts. Thereby, the amount of potential change of the second node ND$_2$ due to the bootstrap operation in [period-TP(2)$_5$'] becomes larger by nearly 3 volts. Therefore, if the values of the video signals V$_{Sig}$ are the same, the potential difference between the first node ND$_1$ and the second node ND$_2$ in [period-TP(2)$_5$'] becomes slightly smaller than that in the case where the threshold voltage V$_{th}$ is 3 volts, and the drain current decreases.

As described above, if the characteristic of the driving transistor TR$_D$ shifts to the enhancement side due to temporal change, the potential difference between the first node ND$_1$ and the second node ND$_2$ consequently becomes smaller in the bootstrap operation. Thereby, phenomena that the drain current decreases and the luminescence of the emission part ELP becomes lower occur.

Next, the driving method of embodiment 1 will be explained. FIG. 7 schematically shows a drive timing chart of the emission part ELP according to embodiment 1, and FIGS. 8A to 8F and FIGS. 9A to 9C schematically show ON/OFF states etc. of the respective transistors.

The driving method of the emission part ELP in embodiment 1 and the other embodiments, which will be described later, includes the step of, using the above described drive circuit 11, (a) setting the potential of the second node ND$_2$ by applying a predetermined intermediate voltage V$_{CC-M}$ to the second node ND$_2$ so that the potential difference between the second node ND$_2$ and the cathode electrode provided in the emission part ELP may not exceed the threshold voltage V$_{th-EL}$ of the emission part ELP, and then, holding the driving transistor TR$_D$ in OFF-state while the drive voltage V$_{CC-H}$ is applied from the power supply part 100 to one source/drain region of the driving transistor TR$_D$. Note that, in embodiment 3 and embodiment 4, the voltage V$_{CC-H}$ is read into the voltage V$_{CC}$ and the voltage V$_{CC-M}$ is read into a voltage V$_{SS-M}$, which will be described later. The same is applicable to the following description.

The driving method of the emission part ELP in embodiment 1 and the other embodiments includes the steps of:

(b) performing writing processing of applying the video signal V$_{Sig}$ from the data line DTL to the first node ND$_1$ via the writing transistor TR$_W$ turned into ON-state by the signal from the scan line STL; then (c) turning the writing transistor TR$_W$ into OFF-state by the signal from the scan line SCL to float the first node ND$_1$; and (d) applying the drive voltage V$_{CC-H}$ from the power supply part 100 to one source/drain region of the driving transistor TR$_D$ to flow a current in the emission part ELP according to the value of the potential difference between the first node ND$_1$ and the second node ND$_2$ via the driving transistor TR$_D$, and a series of steps from step (b) to step (d) is repeatedly performed and the above mentioned step (a) may be performed between the step (d) and the next step (b).

Furthermore, the driving method of the emission part ELP in embodiment 1 and the other embodiments includes, before the step (b), the steps of:

(b-1) applying a first node initializing voltage to the first node ND$_1$ and a second node initializing voltage to the second node ND$_2$, and thereby, performing preprocessing of initializing the potential of the first node ND$_1$ and the potential of the second node ND$_2$ so that the potential difference between the first node ND$_1$ and the second node ND$_2$ may exceed the threshold voltage V$_{th}$ of the driving transistor TR$_D$ and the potential difference between the second node ND$_2$ and the cathode electrode provided in the emission part ELP may not exceed the threshold voltage V$_{th-EL}$ of the emission part ELP; and then (b-2) performing threshold voltage cancel processing of changing the potential of the second node ND$_2$ toward a potential obtained by subtracting the threshold voltage V$_{th}$ of the driving transistor TR$_D$ from the potential of the first node ND$_1$ while the potential of the first node ND$_1$ is held.

In the driving method of the emission part ELP in embodiment 1 and the other embodiments, the step (a) is the step of setting the potential of the second node ND$_2$ by applying the predetermined intermediate voltage V$_{CC-M}$ to the second node ND$_2$, applying the first node initializing voltage to the first node ND$_1$, then, floating the first node ND$_1$ to hold OFF-state of the driving transistor TR$_D$, and applying the drive voltage V$_{CC-H}$ from the power supply part 100 to one source/drain region of the driving transistor TR$_D$.

[period-TP(2)$_0$] to [period-TP(2)$_3$] shown in FIG. 7 are operation periods immediately before [period-TP(2)$_4$] in which writing processing is performed. Further, in [period-TP(2)$_0$] to [period-TP(2)$_4$], the (n,m)th organic EL display element 10 is in the non-emission state. As shown in FIG. 7, not only [period-TP(2)$_4$] but also [period-TP(2)$_1$] to [period-TP(2)$_3$] are contained in the mth horizontal scan period H$_m$.

For convenience of explanation, the start of the [period-TP(2)$_1$] coincides with the start of the initialization period in the mth horizontal scan period H$_m$ (the period in which the potential of the data line DTL is V$_{Ofs}$ in FIG. 7, and the same is applicable to the other horizontal scan periods). Similarly, the end of the [period-TP(2)$_2$] coincides with the end of the initialization period in the horizontal scan period H$_m$. Further, the start of the [period-TP(2)$_3$] coincides with the start of the video signal period in the horizontal scan period H$_m$ (the period in which the potential of the data line DTL is V$_{Sig\_m}$ in FIG. 7).

Furthermore, the end of [period-TP(2)$_4$] coincides with the end of the video signal period in the horizontal scan period H$_m$.

As below, first, the respective periods of [period-TP(2)$_0$] to [period-TP(2)$_4$] will be explained.

[period-TP(2)$_0$] (See FIGS. 7 and 8A)

The [period-TP(2)$_0$] is for an operation from the previous display frame to the current display frame, for example. That is, the [period-TP(2)$_0$] is a period from the start of the (m+m')th horizontal scan period in the previous display frame to the (m−1)th horizontal scan period in the current display frame. Further, in the [period-TP(2)$_0$], the (n,m)th organic EL display element 10 is in the non-emission state. At the start of [period-TP(2)$_0$] (not shown), an operation explained in the [period-TP(2)$_{6A}$] and the like, which will be described later is performed.

The drive voltage $V_{CC-H}$ (20 volts) is applied from the power supply part 100 to one source/drain region of the driving transistor TR$_D$. However, the potential of the first node ND$_1$ (the gate electrode of the driving transistor TR$_D$) is $V_{Ofs}$ (zero volt), and the potential of the second node ND$_2$ is $V_{CC-M}$ (2 volts). Accordingly, the potential difference between the second node ND$_2$ and the cathode electrode provided in the emission part ELP does not exceed the threshold voltage $V_{th-EL}$ of the emission part ELP. Further, the potential difference $V_{gs}$ between the gate electrode of the driving transistor TR$_D$ and the other source/drain region serving as the source region does not exceed the threshold voltage $V_{th}$ of the driving transistor TR$_D$. The (n,m)th organic EL display element 10 is in the non-emission state.

[period-TP(2)$_1$] (See FIGS. 7 and 8B)

Then, the mth horizontal scan period H$_m$ in the current display frame starts. In the [period-TP(2)$_1$], the above mentioned step (b-1) is performed.

In embodiment 1, the second node initializing voltage $V_{CC-L}$ is applied from the power supply part 100 to the second node ND$_2$ via the driving transistor TR$_D$, and the first node initializing voltage $V_{Ofs}$ is applied from the data line DTL to the first node ND$_1$ via the writing transistor TR$_W$ turned into ON-state by the signal from the scan line SCL.

Specifically, at the start of [period-TP(2)$_1$], the scan line SCL is turned into HIGH-level to turn the writing transistor TR$_W$ into ON-state. The voltage applied from the signal output circuit 102 to the data line DTL is $V_{Ofs}$ (initialization period). As a result, the potential of the first node ND$_1$ becomes $V_{Ofs}$ (zero volts). Further, the voltage from the power supply part 100 is switched from the drive voltage $V_{CC-H}$ to the second node initializing voltage $V_{CC-L}$ (−10 volts). Since the potential difference $V_{gs}$ between the gate electrode of the driving transistor TR$_D$ and one source/drain region serving as the source region exceeds the threshold voltage $V_{th}$ of the driving transistor TR$_D$, the second node initializing voltage $V_{CC-L}$ is applied from the power supply part 100 to the second node ND$_2$ via the driving transistor TR$_D$.

Since the potential difference between the first node ND$_1$ and the second node ND$_2$ is 10 volts and the threshold voltage $V_{th}$ of the driving transistor TR$_D$ is 3 volts, the driving transistor TR$_D$ is in ON-state. The potential difference between the second node ND$_2$ and the cathode electrode provided in the emission part ELP is −10 volts and does not exceed the threshold voltage $V_{th-EL}$ of the emission part ELP. Thereby, the preprocessing of initializing the potential of the first node ND$_1$ and the potential of the second node ND$_2$ is completed.

[period-TP(2)$_2$] (See FIGS. 7 and 8C)

In the [period-TP(2)$_2$], the above mentioned step (b-2) is performed.

In embodiment 1, via the writing transistor TR$_W$ turned into ON-state by the signal from the scan line SCL, the condition in which the first node initializing voltage $V_{Ofs}$ is applied from the data line DTL to the first node ND$_1$ is maintained, and thereby, the potential of the first node ND$_1$ is held. Further, the drive voltage $V_{CC-H}$ is applied from the power supply part 100 to one source/drain region of the driving transistor TR$_D$, and thereby, the potential of the second node ND$_2$ is changed toward the potential obtained by subtracting the threshold voltage $V_{th}$ of the driving transistor TR$_D$ from the potential of the first node ND$_1$.

The operation in [period-TP(2)$_2$] is the same as the operation in [period-TP(2)$_2$'] described by referring to FIGS. 4 and 5C, and the explanation will be omitted. In [period-TP(2)$_2$], the potential of the second node ND$_2$ also finally becomes ($V_{Ofs}-V_{th}$). That is, the potential of the second node ND$_2$ is determined depending only on the threshold voltage $V_{th}$ of the driving transistor TR$_D$, the voltage $V_{Ofs}$ for initializing the potential of the gate electrode of the driving transistor TR$_D$, but independent of the threshold voltage $V_{th-EL}$ of the emission part ELP.

[period-TP(2)$_3$] (See FIGS. 7 and 8D)

At the start of the [period-TP(2)$_3$], the writing transistor TR$_W$ is turned into OFF-state by the signal from the scan line SCL. Further, the voltage applied to the data line DTL is switched from the first node initializing voltage $V_{Ofs}$ to the video signal $V_{Sig\_m}$ (video signal period).

The operation in [period-TP(2)$_3$] is the same as the operation in [period-TP(2)$_3$'] described by referring to FIGS. 4 and 5D. If the driving transistor TR$_D$ has reached OFF-state at step (b-2), the potentials of the first node ND$_1$ and the second node ND$_2$ are substantially unchanged. Note that, if the driving transistor TR$_D$ has not reached OFF-state at step (b-2) a bootstrap operation occurs in the [period-TP(2)$_3$], and the potentials of the first node ND$_1$ and the second node ND$_2$ become slightly higher.

[period-TP(2)$_4$] (See FIGS. 7 and 8E)

Within the period, the above mentioned step (b) is performed. The writing transistor TR$_W$ is turned into ON-state by the signal from the scan line SCL. Further, via the writing transistor TR$_W$, the video signal $V_{Sig\_m}$ is applied from the data line DTL to the first node ND$_1$.

The operation in [period-TP(2)$_4$] is the same as the operation in [period-TP(2)$_4$'] described by referring to FIGS. 4 and 5E, and the explanation will be omitted. The potential difference $V_{gs}$ between the gate electrode and the other source/drain region serving as the source region of the driving transistor TR$_D$ is provided by the above described expression (4).

[period-TP(2)$_5$] (See FIGS. 7 and 8F)

Through the above operation, step (b-1) to step (b) are completed. Then, in the [period-TP(2)$_5$], the above mentioned step (c) and step (d) are performed.

The operation in [period-TP(2)$_5$] is the same as the operation in [period-TP(2)$_5$] described by referring to FIGS. 4 and 5F. While the condition in which the voltage $V_{CC-H}$ is applied from the power supply part 100 to one source/drain region of the driving transistor TR$_D$ is maintained, the scan line SCL is turned into LOW-level according to the operation of the scanning circuit 101, the writing transistor TR$_W$ is turned into OFF-state, and the first node ND$_1$, i.e., the gate electrode of the driving transistor TR$_D$ is floated.

The potential of the second node ND$_2$ rises and the same phenomenon as that in the bootstrap circuit occurs in the gate electrode of the driving transistor TR$_D$, and the potential of the first node ND$_1$ also rises. The potential of the second node ND$_2$ rises and exceeds ($V_{th-EL}+V_{Cat}$), and thereby, the emission part ELP starts to emit light. The current flowing in the emission part ELP is the drain current I$_{ds}$ flowing from the drain region to the source region of the driving transistor TR$_D$, and is expressed by the expression (5). The organic EL display element 10 turns into the emission state and maintains the state immediately before the (m+m')th horizontal scan period $H_{m+m'}$.

In [period-TP(2)$_{+1}$] and the subsequent periods shown in FIG. 7, the above described step (b-1) to step (d) are repeatedly performed. For example, in [period-TP(2)$_{+1}$], the next step (b-1) is performed. In the driving method of embodiment 1, the above step (a) is performed between the step (d) and the next step (b-1), specifically, in [period-TP(2)$_{6A}$] to [period-TP(2)$_{6C}$] shown in FIG. 7. The start of [period-TP(2)$_{6A}$] and the end of [period-TP(2)$_{6B}$] correspond to the start and the end of the initialization period in the (m+m')th horizontal scan period $H_{m+m'}$, respectively. The start of [period-TP(2)$_{6C}$] corresponds to the start of the video signal period in the (m+m')th horizontal scan period $H_{m+m'}$.

In embodiment 1, the potential of the second node $ND_2$ is set by applying a predetermined intermediate voltage $V_{CC-M}$ to the second node $ND_2$ so that the potential of the second node $ND_2$ may be higher than the potential of the second node $ND_2$ at step (b-1) (specifically, $V_{CC-L}$) and the potential difference between the second node $ND_2$ and the cathode electrode provided in the emission part ELP may not exceed the threshold voltage $V_{th-EL}$ of the emission part ELP. Then, the driving transistor $TR_D$ is held in OFF-state while the drive voltage $V_{CC-H}$ is applied from the power supply part 100 to one source/drain region of the driving transistor $TR_D$.

Specifically, via the driving transistor $TR_D$, the intermediate voltage $V_{CC-M}$ is applied from the power supply part 100 to the second node $ND_2$, and then, the voltage of the power supply part 100 is switched from the intermediate voltage $V_{CC-M}$ to the drive voltage $V_{CC-H}$. Further, via the writing transistor $TR_W$ turned into ON-state by the signal from the scan line SCL, the first node initializing voltage $V_{0fs}$ is applied from the data line DTL to the first node $ND_1$, and then, the writing transistor $TR_W$ is turned into OFF-state by the signal from the scan line SCL. As below, the operations from [period-TP(2)$_{6A}$] to [period-TP(2)$_{6C}$] will be explained.

[period-TP(2)$_{6A}$] (See FIGS. 7 and 9A)

At the start of [period-TP(2)$_{6A}$] the voltage of the power supply part 100 is switched from the drive voltage $V_{CC-H}$ to the intermediate voltage $V_{CC-M}$ (2 volts). The intermediate voltage $V_{CC-M}$ is applied from the power supply part 100 to the second node $ND_2$ via the driving transistor $TR_D$. The potential of the second node $ND_2$ becomes $V_{CC-M}$. The organic EL display element 10 turns into the non-emission state. The potential of the first node $ND_1$ becomes lower according to the potential change of the second node $ND_2$.

[period-TP(2)$_{6B}$] (See FIGS. 7 and 9B)

While the voltage of the power supply part 100 is maintained at the intermediate voltage $V_{CC-M}$, at the start of the [period-TP(2)$_{6B}$], the scan line SCL is turned into HIGH-level, and the writing transistor $TR_W$ is turned into ON-state. Via the writing transistor $TR_W$ turned into ON-state, the first node initializing voltage $V_{0fs}$ is applied from the data line DTL to the first node $ND_1$. Thereby, the potential difference $V_{gs}$ between the gate electrode and the source/drain region of the driving transistor $TR_D$ becomes smaller than the threshold voltage $V_{th}$ of the driving transistor $TR_D$, and thus, the driving transistor $TR_D$ turns into OFF-state. Then, at the end of [period-TP(2)$_{6B}$], the writing transistor $TR_W$ is turned into OFF-state by the signal from the scan line SCL. The driving transistor $TR_D$ maintains OFF-state.

[period-TP(2)$_{6C}$] (See FIGS. 7 and 9C)

At the start of [period-TP(2)$_{6C}$], the voltage of the power supply part 100 is switched from the intermediate voltage $V_{CC-M}$ to the drive voltage $V_{CC-H}$. The driving transistor $TR_D$ maintains OFF-state. The state is maintained to immediately before [period-TP(2)$_{+1}$]. The organic EL display element 10 also maintains the non-emission state.

Then, as shown in FIG. 7, in [period-TP(2)$_{+1}$] and the subsequent periods, the same steps as those explained in the above [period-TP(2)$_1$] to [period-TP(2)$_{6C}$] are repeatedly performed. The start of [period-TP(2)$_{+1}$] corresponds to the mth horizontal scan period $H_m$ in the next frame.

In the driving method of embodiment 1 explained by referring to FIG. 7, the emission period is [period-TP(2)$_5$], and the large part of the non-emission period is occupied by the [period-TP(2)$_{6C}$]. Like the driving method of the above described reference example, in the driving method of embodiment 1, the potential of the gate electrode of the driving transistor $TR_D$ in the emission period is also higher than the potential of the channel formation region between the source/drain regions.

However, in the driving method of embodiment 1, in the [period-TP(2)$_{6C}$] occupying the large part of the non-emission period, the potential of the gate electrode of the driving transistor $TR_D$ is $V_{0fs}$ (zero volt), the potential of one source/drain region is $V_{CC-H}$ (20 volts), and the potential of the other source/drain region is $V_{CC-M}$ (2 volts). That is, the potential of the gate electrode of the driving transistor $TR_D$ in the non-emission period is lower than the potential of the channel formation region between the source/drain regions.

As explained above, in the driving method of embodiment 1, the potential relationship between the gate electrode and the channel formation region of the driving transistor $TR_D$ is inverted between the emission period and the non-emission period, and the tendency to shift to the enhancement side due to temporal change is reduced. Further, at step (a), the potential of the second node $ND_2$ is set by applying the predetermined intermediate voltage $V_{CC-M}$ to the second node $ND_2$, and thus, the time shifting from step (d) to step (a) can be made shorter, and the emission part ELP can be driven without trouble even in the display device having a short scanning period.

Embodiment 2

Embodiment 2 also relates to a driving method of the organic electroluminescence emission part. Embodiment 2 is a modification of embodiment 1.

In the driving method of embodiment 2, the steps (b-1) to step (a) explained in embodiment 1 are also performed. Note that the driving method of embodiment 2 is different in that, in the initialization period, the signal output circuit 102 applies a first initializing voltage to the data line DTL as the first node initializing voltage, and then, in place of the first initializing voltage, applies a second initializing voltage lower than the first initializing voltage to the data line DTL as the first node initializing voltage.

In the following description, voltage values are as below, however, these are values only for explanation, but not limited to the values. The same is applicable to the other embodiments described later.

$V_{0fs1}$: first initializing voltage, zero volt $V_{0fs2}$: second initializing voltage, −2 volts The driving method of embodiment 2 will be explained. FIG. 10 schematically shows a drive timing chart of the emission part ELP according to embodiment 2, and FIGS. 11A to 11F and FIGS. 12A to 12E schematically show ON/OFF states etc. of the respective transistors.

For convenience of explanation, the start of the [period-TP(2)$_1$] shown in FIG. 10 coincides with the start of the initialization period in the mth horizontal scan period $H_m$ (the period in which the potential of the data line DTL is $V_{0fs1}$ or $V_{Ofs2}$ in FIG. 10). Similarly, the end of the [period-TP(2)$_{3A}$] coincides with the end of the initialization period in the horizontal scan period $H_m$. Further, the start of the [period-TP(2)$_{3B}$] coincides with the start of the video signal period in the horizontal scan period $H_m$ (the period in which the potential of the data line DTL is $V_{Sig\_m}$ in FIG. 10).

Furthermore, in the initialization period in the horizontal scan period $H_m$, the period in which the signal output circuit 102 applies the first initializing voltage $V_{Ofs1}$ to the data line DTL as the first node initializing voltage coincides with the period from the start of [period-TP(2)$_1$] to the end of [period-TP(2)$_2$]. Similarly, the period in which the signal output circuit 102 applies the second initializing voltage $V_{Ofs2}$ to the data line DTL as the first node initializing voltage coincides with [period-TP(2)$_{3A}$].

Moreover, the end of [period-TP(2)$_4$] coincides with the end of the video signal period in the mth horizontal scan period $H_m$.

[period-TP(2)$_0$] (See FIGS. 10 and 11A)

The operation in the period is the same as the operation in [period-TP(2)$_0$] described by referring to FIGS. 7 and 8A in embodiment 1, and the explanation will be omitted.

[period-TP(2)$_1$] (See FIGS. 10 and 11B)

Then, the mth horizontal scan period $H_m$ in the current display frame starts. In the [period-TP(2)$_1$], the step (b-1), i.e., the above described preprocessing is performed. The operation in this period is substantially the same as the operation in [period-TP(2)$_1$] described by referring to FIGS. 7 and 8B in embodiment 1.

That is, at the start of [period-TP(2)$_1$], the writing transistor TR$_W$ is turned into ON-state by the signal from the scan line SCL, and the first initializing voltage $V_{Ofs1}$ as the first node initializing voltage is applied from the data line DTL to the first node ND$_1$ via the writing transistor TR$_W$ in ON-state to initialize the potential of the first node ND$_1$. Further, the second node ND$_2$ voltage $V_{CC-L}$ is applied from the power supply part 100 to one source/drain region of the driving transistor TR$_D$ and the potential of the second node ND$_2$ is initialized. Thereby, the preprocessing of initializing the potential of the first node ND$_1$ and the potential of the second node ND$_2$ is completed.

[period-TP(2)$_2$] (See FIGS. 10 and 11C)

In the [period-TP(2)$_2$], the above mentioned step (b-2) is performed.

In embodiment 2, as is the case of embodiment 1, via the writing transistor TR$_W$ turned into ON-state by the signal from the scan line SCL, the condition in which the first initializing voltage $V_{Ofs1}$ is applied from the data line DTL to the first node ND$_1$ is maintained, and thereby, the potential of the first node ND$_1$ is held. Further, the drive voltage $V_{CC-H}$ is applied from the power supply part 100 to one source/drain region of the driving transistor TR$_D$, and thereby, the potential of the second node ND$_2$ is changed toward the potential obtained by subtracting the threshold voltage $V_{th}$ of the driving transistor TR$_D$ from the potential of the first node ND$_1$.

The operation in the period is substantially the same as the operation in [period-TP(2)$_2$] described by referring to FIGS. 7 and 8C in embodiment 1, and the explanation will be omitted. The potential of the second node ND$_2$ finally becomes $(V_{Ofs1}-V_{th})$.

[period-TP(2)$_{3A}$] (See FIGS. 10 and 11D)

At the start of the [period-TP(2)$_{3A}$], the writing transistor TR$_W$ is turned into OFF-state by the signal from the scan line SCL. Further, the voltage applied to the data line DTL is switched from the first initializing voltage $V_{Ofs1}$ to the second initializing voltage $V_{Ofs2}$. If the driving transistor TR$_D$ has sufficiently reached OFF-state at step (b-2) and the influence by the parasitic capacity and the like can be neglected, the potentials of the first node ND$_1$ and the second node ND$_2$ are substantially unchanged.

[period-TP(2)$_{3B}$] (See FIGS. 10 and 11E)

At the start of the [period-TP(2)$_{3B}$], the voltage applied to the data line DTL is switched from the second initializing voltage $V_{Ofs2}$ to the video signal $V_{Sig\_m}$ (video signal period). Further, the OFF-state of the writing transistor TR$_W$ is maintained. The potentials of the first node ND$_1$ and the second node ND$_2$ are substantially unchanged.

[period-TP(2)$_4$] (See FIGS. 10 and 11F)

Within the period, the above mentioned step (b) is performed. The writing transistor TR$_W$ is turned into ON-state by the signal from the scan line SCL. Further, via the writing transistor TR$_W$, the video signal $V_{Sig\_m}$ is applied from the data line DTL to the first node ND$_1$.

The operation in the period is the same as the operation in [period-TP(2)$_4$] described by referring to FIGS. 7 and 8E, and the explanation will be omitted. The potential difference $V_{gs}$ between the gate electrode and the other source/drain region serving as the source region of the driving transistor TR$_D$ is given by the above described expression (4).

[period-TP(2)$_5$] (See FIGS. 10 and 12A)

Through the above operation, step (b-1) to step (b) are completed. Then, in the [period-TP(2)$_5$], the above mentioned step (c) and step (d) are performed.

The operation in the period is the same as the operation in [period-TP(2)$_4$] described by referring to FIGS. 7 and 8F, and the explanation will be omitted. The emission part ELP starts to emit light. The current flowing in the emission part ELP is the drain current $I_{ds}$ flowing from the drain region to the source region of the driving transistor TR$_D$, and is given by the expression (5). The organic EL display element 10 turns into the emission state and maintains the state immediately before the (m+m')th horizontal scan period $H_{m+m'}$.

As is the case described in embodiment 1, in [period-TP(2)$_{+1}$] and the subsequent periods shown in FIG. 10, the above described step (b-1) to step (d) are repeatedly performed. For example, in [period-TP(2)$_{+1}$], the next step (b-1) is performed. In the driving method of embodiment 2, the above step (a) is performed between the step (d) and the next step (b-1), specifically, in [period-TP(2)$_{6A}$] to [period-TP(2)$_{6C}$] shown in FIG. 10. The start of [period-TP(2)$_{6A}$] and the end of [period-TP(2)$_{6C}$] correspond to the start and the end of the initialization period in the (m+m')th horizontal scan period $H_{m+m'}$, respectively. The start of [period-TP(2)$_{6D}$] corresponds to the start of the video signal period in the (m+m')th horizontal scan period $H_{m+m'}$.

In embodiment 2, the potential of the second node ND$_2$ is set by applying a predetermined intermediate voltage $V_{CC-M}$ to the second node ND$_2$ so that the potential of the second node ND$_2$ may be higher than the potential of the second node ND$_2$ at step (b-1) (specifically, $V_{CC-L}$) and the potential difference between the second node ND$_2$ and the cathode electrode provided in the emission part ELP may not exceed the threshold voltage $V_{th-EL}$ of the emission part ELP. Then, the driving transistor TR$_D$ is held in the OFF-state while the drive voltage $V_{CC-H}$ is applied from the power supply part 100 to one source/drain region of the driving transistor TR$_D$.

Specifically, via the driving transistor TR$_D$, the intermediate voltage $V_{CC-M}$ is applied from the power supply part 100 to the second node ND$_2$, and then, the voltage of the power supply part 100 is switched from the intermediate voltage $V_{CC-M}$ to the drive voltage $V_{CC-H}$. Further, via the writing transistor TR$_W$ turned into ON-state by the signal from the scan line, the first initializing voltage $V_{Ofs1}$ and the second initializing voltage $V_{Ofs2}$ as the first node initializing voltages are applied from the data line DTL to the first node $ND_1$, and then, the writing transistor $TR_W$ is turned into OFF-state by the signal from the scan line SCL. As below, the operations in [period-TP$(2)_{6A}$] to [period-TP$(2)_{6D}$] will be explained.

[period-TP$(2)_{6A}$] (See FIGS. 10 and 12B)

At the start of [period-TP$(2)_{6A}$] the voltage of the power supply part 100 is switched from the drive voltage $V_{CC-H}$ to the intermediate voltage $V_{CC-M}$ (2 volts). The intermediate voltage $V_{CC-M}$ is applied from the power supply part 100 to the second node $ND_2$ via the driving transistor $TR_D$. The potential of the second node $ND_2$ becomes $V_{CC-M}$. The organic EL display element 10 turns into the non-emission state. The potential of the first node $ND_1$ becomes lower according to the potential change of the second node $ND_2$.

[period-TP$(2)_{6B}$] (See FIGS. 10 and 12C)

While the voltage of the power supply part 100 is maintained at the intermediate voltage $V_{CC-M}$, at the start of the [period-TP$(2)_{6B}$], the scan line SCL is turned into HIGH-level, and the writing transistor $TR_W$ is turned into ON-state. Via the writing transistor $TR_W$ turned into ON-state, the first initializing voltage $V_{Ofs1}$ (zero volt) is applied from the data line DTL to the first node $ND_1$. Thereby, the potential difference $V_g$, between the gate electrode and the source/drain region of the driving transistor $TR_D$ becomes smaller than the threshold voltage $V_{th}$ of the driving transistor $TR_D$, and thus, the driving transistor $TR_D$ turns into OFF-state. Then, the ON-state of the writing transistor $TR_W$ is maintained to the end of the next [period-TP$(2)_{6C}$].

[period-TP$(2)_{6C}$] (See FIGS. 10 and 12D)

At the start of [period-TP$(2)_{6C}$], via the writing transistor $TR_W$ turned into ON-state, the second initializing voltage $V_{Ofs2}$ (−2 volts) is applied from the data line DTL to the first node $ND_1$. The potential of the first node $ND_1$ changes from $V_{Ofs1}$ to $V_{Ofs2}$. The driving transistor $TR_D$ maintains OFF-state.

[period-TP$(2)_{6D}$] (See FIGS. 10 and 12E)

At the start of [period-TP$(2)_{6D}$], the voltage of the power supply part 100 is switched from the intermediate voltage $V_{CC-M}$ to the drive voltage $V_{CC-H}$. The driving transistor $TR_D$ maintains OFF-state. The condition is maintained to immediately before [period-TP$(2)_{+1}$]. The organic EL display element 10 also maintains the non-emission state.

Then, as shown in FIG. 10, in [period-TP$(2)_{+1}$] and the subsequent periods, the same steps as those explained in the above [period-TP$(2)_1$] to [period-TP$(2)_{6D}$] are repeatedly performed. The start of [period-TP$(2)_{+1}$] corresponds to the start of the mth horizontal scan period $H_m$ in the next frame.

In the driving method of embodiment 2, the emission period is [period-TP$(2)_5$], and the large part of the non-emission period is occupied by the [period-TP$(2)_{6D}$]. The potential of the gate electrode of the driving transistor $TR_D$ in the emission period is higher than the potential of the channel formation region between the source/drain regions. However, in the [period-TP$(2)_{6D}$] occupying the large part of the non-emission period, the potential of the gate electrode of the driving transistor $TR_D$ is $V_{Ofs2}$ (−2 volts), the potential of one source/drain region is $V_{CC-H}$ (20 volts), and the potential of the other source/drain region is $V_{CC-M}$ (2 volts). That is, the potential of the gate electrode of the driving transistor $TR_D$ in the non-emission period is lower than the potential of the channel formation region between the source/drain regions.

In the driving method of embodiment 2, the potential relationship between the gate electrode of the driving transistor $TR_D$ and the channel formation region is also inverted between the emission period and the non-emission period, and the tendency to shift to the enhancement side due to temporal change is reduced.

In the driving method of embodiment 1, in [period-TP$(2)_{6C}$] shown in FIG. 7, the potential of the gate electrode of the driving transistor $TR_D$ is $V_{Ofs}$ (zero volt). On the other hand, in the driving method of embodiment 2, in [period-TP$(2)_{6D}$] occupying the large part of the non-emission period, the potential of the gate electrode of the driving transistor $TR_D$ is $V_{Ofs2}$ (−2 volts). That is, compared to the driving method of embodiment 1, the potential of the gate electrode of the driving transistor $TR_D$ in the non-emission period can be made lower than the potential of the channel formation region between the source/drain regions. Therefore, the tendency of the driving transistor $TR_D$ to shift to the enhancement side due to temporal change is further reduced.

Embodiment 3

Embodiment 3 also relates to a driving method of the organic electroluminescence emission part. In embodiment 3, the drive circuit 11 includes three-transistors/one-capacity part (3Tr/IC drive circuit). FIG. 13 is a conceptual diagram of an organic EL display device according to embodiment 3, and FIG. 14 is an equivalent circuit diagram of the organic electroluminescence display element 10 including the drive circuit 11.

First, the details of the drive circuit and the emission part will be explained.

Like the above described 2Tr/IC drive circuit, the 3Tr/IC drive circuit includes two transistors of the writing transistor $TR_W$ and the driving transistor $TR_D$, and further includes one capacity part $C_1$. In addition, the 3Tr/1C drive circuit further includes a first transistor $TR_1$.

[Driving Transistor $TR_D$]

The configuration of the driving transistor $TR_D$ is the same as the configuration of the driving transistor $TR_D$ described in embodiment 1, and the detailed explanation will be omitted. Note that, in embodiment 1, the potential of the second node $ND_2$ is initialized by applying the voltage $V_{CC-L}$ from the power supply unit 100 to one source/drain region of the driving transistor $TR_D$. On the other hand, in embodiment 3, as will be described later, the potential of the second node $ND_2$ is initialized using the first transistor $TR_1$. Therefore, in embodiment 3, for initialization of the potential of the second node $ND_2$, it is unnecessary to apply the voltage $V_{CC-L}$ from the power supply unit 100. On this account, the power supply unit 100 applies a constant voltage $V_{CC}$ in embodiment 3.

[Writing Transistor $TR_W$]

The configuration of the writing transistor $TR_W$ is the same as the configuration of the writing transistor $TR_W$ described in embodiment 1, and the detailed explanation will be omitted. Like the embodiment 1, from the signal output circuit 102 via the data line DTL, the video signal (drive signal, luminance signal) $V_{Sig}$ for controlling the luminance in the emission part ELP and further the first node initializing voltage $V_{Ofs}$ are supplied to the one source/drain region.

[First Transistor $TR_1$]

In the first transistor $TR_1$, (C-1) the other source/drain region is connected to the second node $ND_2$, (C-2) a second node initializing voltage $V_{SS-L}$ or an intermediate voltage $V_{SS-M}$ is applied to one source/drain region, and (C-3) the gate electrode is connected to a first transistor control line AZ1. The voltage $V_{SS-L}$ and the voltage $V_{SS-M}$ will be described later.

The conductivity type of the first transistor $TR_1$ is not particularly limited. In embodiment 3, the first transistor $TR_1$ includes an n-channel transistor, for example. The ON-state/

OFF-state of the first transistor $TR_1$ is controlled by a signal from the first transistor control line AZ1. More specifically, the first transistor control line AZ1 is connected to a first transistor control circuit 103. Further, according to the operation of the first transistor control circuit 103, the first transistor control line AZ1 is turned into LOW-level or HIGH-level, and the first transistor $TR_1$ is turned into ON-state or OFF-state. One source/drain region of the first transistor $TR_1$ is connected to a power supply line PS3. One end of the power supply line PS3 is connected to a second power supply part 104. According to the operation of the second power supply part 104, the voltage $V_{SS-L}$ or the voltage $V_{SS-M}$ is appropriately applied to the power supply line PS3.

[Emission Part ELP]

The configuration of the emission part ELP is the same as the configuration of the emission part ELP described in embodiment 1, and the detailed explanation will be omitted.

Next, a driving method of embodiment 3 will be explained.

In the description as below, the value of the voltage $V_{CC}$, the value of the voltage. $V_{SS-L}$, and the value of the voltage $V_{SS-M}$ are set as follows. However, they are values only for explanation and not limited to the values. The same is applicable to the other embodiments, which will be described later.

$V_{CC}$: drive voltage for flowing current in emission part ELP, 20 volts $V_{SS-L}$: second node initializing voltage for initializing potential of second node $ND_2$, −10 volts $V_{SS-M}$: intermediate voltage, 2 volts FIG. 15 schematically shows a drive timing chart of the emission part ELP according to embodiment 3, and FIGS. 16A to 16F and FIGS. 17A to 17C schematically show ON/OFF states etc. of the respective transistors.

From the driving method of embodiment 1, the driving method of embodiment 3 is mainly different in that the power supply part 100 applies the constant voltage $V_{CC}$ and the potential of the second node $ND_2$ is initialized using the first transistor $TR_1$. The respective periods of [period-TP(3)$_0$] to [period-TP(3)$_{+5}$] shown in FIG. 15 correspond to the respective periods of [period-TP(2)$_0$] to [period-TP(2)$_{+5}$] shown in FIG. 7 referred to in embodiment 1.

In the organic EL display device of embodiment 3, in the respective horizontal scan periods, the first node initializing voltage $V_{Ofs}$ is applied from the signal output circuit 102 to the data line DTL, and then, the video signal $V_{Sig}$ is applied thereto in place of the first node initializing voltage $V_{Ofs}$. The details are the same as those described in embodiment 1. The relationships between the initialization periods and the video signal periods in the respective horizontal scan periods and the respective periods of [period-TP(3)$_0$] to [period-TP(3)$_{+5}$] are the same as those described with respect to [period-TP(2)$_0$] to [period-TP(2)$_{+5}$] shown in FIG. 7 in embodiment 1, and the explanation will be omitted.

As below, the respective periods of [period-TP(3)$_0$] to [period-TP(3)$_{+5}$] will be explained.

[period-TP(3)$_0$] (See FIGS. 15 and 16A)

The [period-TP(3)$_0$] is for an operation from the previous display frame to the current display frame, for example. That is, the period [period-TP(3)$_0$] is a period from the start of the (m+m')th horizontal scan period in the previous display frame to the (m−1)th horizontal scan period in the current display frame. Further, in the [period-TP(3)$_0$], the (n,m)th organic EL display element 10 is in the non-emission state. At the start of [period-TP(3)$_0$] (not shown), the operation described later in [period-TP(3)$_{6A}$] and the like is performed. Except that the first transistor $TR_1$ is in OFF-state, the operation in the period is substantially the same as that in [period-TP(2)$_0$] described in embodiment 1.

[period-TP(3)$_1$] (See FIGS. 15 and 16B)

Then, the mth horizontal scan period $H_m$ in the current display frame starts. In the [period-TP(3)$_1$], the above mentioned step (b-1) is performed.

In embodiment 3, unlike embodiment 1, via the first transistor $TR_1$ turned into ON-state by the first transistor control line AZ1, the second node initializing voltage $V_{SS-L}$ is applied to the second node $ND_2$. Note that, like embodiment 1, via the writing transistor $TR_W$ turned into ON-state by the signal from the scan line SCL, the first node initializing voltage $V_{Ofs}$ is applied from the data line DTL to the first node $ND_1$.

Specifically, at the start of [period-TP(3)$_1$], the scan line SCL is turned into HIGH-level to turn the writing transistor $TR_W$ into ON-state. The voltage applied from the signal output circuit 102 to the data line DTL is $V_{Ofs}$ (initialization period). As a result, the potential of the first node $ND_1$ becomes $V_{Ofs}$ (zero volts). Further, the first transistor $TR_1$ is turned into ON-state by the signal from the first transistor control line AZ1. The second node initializing voltage $V_{SS-L}$ is applied to the second node $ND_2$ via the first transistor $TR_1$ in ON-state.

Also the drive voltage $V_{CC}$ is applied to the second node $ND_2$ via the driving transistor $TR_D$. Accordingly, the potential of the second node $ND_2$ is determined by the voltage $V_{SS-L}$ and the voltage $V_{CC}$, and the value of the on-resistance of the first transistor $TR_1$ and the value of the on-resistance of the driving transistor $TR_D$. Here, if the on-resistance of the first transistor $TR_1$ is sufficiently low, the potential of the second node $ND_2$ becomes lower to nearly $V_{SS-L}$. As below, for convenience, the explanation will be made assuming that the potential of the second node $ND_2$ is $V_{SS-L}$. Further, FIG. 15 shows the case where, when the first transistor $TR_1$ is in ON-state, the potential of the second node $ND_2$ is $V_{SS-L}$. The same is applicable to FIG. 18, which will be referred to in embodiment 4.

Since the potential difference between the first node $ND_1$ and the second node $ND_2$ is 10 volts and the threshold voltage $V_{th}$ of the driving transistor $TR_D$ is 3 volts, the driving transistor $TR_D$ is in ON-state. The potential difference between the second node $ND_2$ and the cathode electrode provided in the emission part ELP is −10 volts and does not exceed the threshold voltage $V_{th-EL}$ of the emission part ELP. Thereby, the preprocessing of initializing the potential of the first node $ND_1$ and the potential of the second node $ND_2$ is completed.

[period-TP(3)$_2$] (See FIGS. 15 and 16C)

At the start of the [period-TP(3)$_2$], the first transistor $TR_1$ is turned into OFF-state by the signal from the first transistor control line AZ1. To the start of [period-TP(3)$_5$], which will be described later, OFF-state of the first transistor $TR_1$ is maintained.

In the [period-TP(3)$_2$], the above mentioned step (b-2) is performed. The operation in this period is substantially the same as the operation described with respect to [period-TP(2)$_2$] in embodiment 1, and the explanation will be omitted. FIG. 16C corresponds to FIG. 8C.

[period-TP(3)$_3$] (See FIGS. 15 and 16D)

At the start of the [period-TP(3)$_3$], the writing transistor $TR_W$ is turned into OFF-state by the signal from the scan line SCL. Further, the voltage applied to the data line DTL is switched from the first node initializing voltage $V_{Ofs}$ to the video signal $V_{Sig\_m}$ (video signal period). The operation in this period is substantially the same as the operation described with respect to [period-TP(2)$_3$] in embodiment 1, and the explanation will be omitted. FIG. 16D corresponds to FIG. 8D.

[period-TP(3)$_4$] (See FIGS. 15 and 16E)

Within the period, the above mentioned step (b) is performed. The writing transistor TR$_W$ is turned into ON-state by the signal from the scan line SCL. Further, via the writing transistor TR$_W$, the video signal V$_{Sig\_m}$, is applied from the data line DTL to the first node ND$_1$. The operation in this period is substantially the same as the operation described with respect to [period-TP(2)$_4$] in embodiment 1, and the explanation will be omitted. FIG. 16E corresponds to FIG. 8E.

[period-TP(3)$_5$] (See FIGS. 15 and 16F)

Through the above operation, step (b-1) to step (b) are completed. Then, in the [period-TP(3)$_5$], the above mentioned step (c) and step (d) are performed. The operation in this period is substantially the same as the operation described with respect to [period-TP(2)$_5$] in embodiment 1, and the explanation will be omitted. FIG. 16F corresponds to FIG. 8F.

In [period-TP(3)$_{+1}$] and the subsequent periods shown in FIG. 15, the above described step (b-1) to step (d) are repeatedly performed. For example, in [period-TP(3)$_{+1}$], the next step (b-1) is performed. In the driving method of embodiment 3, the above step (a) is performed between the step (d) and the next step (b-1), specifically, in [period-TP(3)$_{6A}$] to [period-TP(3)$_{6C}$] shown in FIG. 15.

In embodiment 3 as well, the potential of the second node ND$_2$ is set by applying the predetermined intermediate voltage V$_{SS-M}$ to the second node ND$_2$ so that the potential of the second node ND$_2$ may be higher than the potential of the second node ND$_2$ at step (b-1) (specifically, V$_{SS-L}$) and the potential difference between the second node ND$_2$ and the cathode electrode provided in the emission part ELP may not exceed the threshold voltage V$_{th-EL}$ of the emission part ELP. Then, the driving transistor TR$_D$ is held in OFF-state while the drive voltage V$_{CC}$ is applied from the power supply part 100 to one source/drain region of the driving transistor TR$_D$.

Specifically, via the first transistor TR$_1$ turned into ON-state by the signal from the first transistor control line AZ1, the intermediate voltage V$_{SS-M}$ is applied to the second node ND$_2$. Further, via the writing transistor TR$_W$ turned into ON-state by the signal from the scan line SCL, the first node initializing voltage V$_{Ofs}$ is applied from the data line DTL to the first node ND$_1$, and then, the writing transistor TR$_W$ is turned into OFF-state by the signal from the scan line SCL.

As below, the operations from [period-TP(3)$_{6A}$] to [period-TP(3)$_{6C}$] will be explained.

[period-TP(3)$_{6A}$] (See FIGS. 15 and 17A)

At the start of [period-TP(3)$_{6A}$] via the first transistor TR$_1$ turned into ON-state by the signal from the first transistor control line AZ1, the intermediate voltage V$_{SS-M}$ is applied to the second node ND$_2$. To the end of [period-TP(3)$_{6B}$] described later, ON-state of the first transistor TR$_1$ is maintained.

As is the case described in [period-TP(3)$_1$], also the drive voltage V$_{CC}$ is applied to the second node ND$_2$ via the driving transistor TR$_D$. Accordingly, the potential of the second node ND$_2$ is determined by the voltage V$_{SS-M}$ and the voltage V$_{CC}$, and the value of the on-resistance of the first transistor TR$_1$ and the value of the on-resistance of the driving transistor TR$_D$. Here, if the value of the on-resistance of the first transistor TR$_1$, is sufficiently low, the potential of the second node ND$_2$ becomes lower to nearly V$_{SS-M}$. As below, for convenience, the explanation will be made assuming that the potential of the second node ND$_2$ is V$_{SS-M}$. Further, FIG. 15 shows the case where, when the first transistor TR$_1$ is in ON-state, the potential of the second node ND$_2$ is V$_{SS-M}$. The same is applicable to FIG. 18, which will be referred to in embodiment 4.

The potential of the second node ND$_2$ becomes V$_{SS-M}$. The organic EL display element 10 turns into the non-emission state. The potential of the first node ND$_1$ becomes lower according to the potential change of the second node ND$_2$.

[period-TP(3)$_{6B}$] (See FIGS. 15 and 17B)

At the start of the [period-TP(3)$_{6B}$], the scan line SCL is turned into HIGH-level, and the writing transistor TR$_W$ is turned into ON-state. Via the writing transistor TR$_W$ turned into ON-state, the first node initializing voltage V$_{Ofs}$ is applied from the data line DTL to the first node ND$_1$. Thereby, the potential difference V$_{gs}$ between the gate electrode and the source/drain region of the driving transistor TR$_D$ becomes smaller than the threshold voltage V$_{th}$ of the driving transistor TR$_D$, and thus, the driving transistor TR$_D$ turns into OFF-state.

[period-TP(3)$_{6C}$] (See FIGS. 15 and 17C)

At the start of [period-TP(3)$_{sc}$], the writing transistor TR$_W$ is turned into OFF-state by the signal from the scan line SCL, and the first transistor TR$_1$ is turned into OFF-state by the signal from the first transistor control line AZ1. The driving transistor TR$_D$ maintains OFF-state. The state is maintained to immediately before [period-TP(3)$_{+1}$]. The organic EL display element 10 also maintains the non-emission state.

Then, as shown in FIG. 15, in [period-TP(3)$_{+1}$] and the subsequent periods, the same steps as those explained in the above [period-TP(3)$_1$] to [period-TP(3)$_{6C}$] are repeatedly performed. The start of [period-TP(3)$_{+1}$] corresponds to the start of the mth horizontal scan period H$_m$ in the next frame.

In the driving method of embodiment 3, in the [period-TP(3)$_{6C}$] occupying the large part of the non-emission period, the potential of the gate electrode of the driving transistor TR$_D$ is V$_{Ofs}$ (zero volt), the potential of the one source/drain region is V$_{CC}$ (20 volts), and the potential of the other source/drain region is V$_{SS-M}$ (2 volts). That is, the potential of the gate electrode of the driving transistor TR$_D$ in the non-emission period is lower than the potential of the channel formation region between the source/drain regions.

Therefore, as is the case explained in the driving method of embodiment 1, the potential relationship between the gate electrode of the driving transistor TR$_D$ and the channel formation region is inverted between the emission period and the non-emission period, and the tendency to shift to the enhancement side due to temporal change is reduced. Further, at step (a), the potential of the second node ND$_2$ is set by applying the predetermined intermediate voltage V$_{SS-M}$ to the second node ND$_2$, and thus, the time shifting from step (d) to step (a) can be made shorter, and the emission part ELP can be driven without trouble even in the display device having a short scanning period.

Embodiment 4

Embodiment 4 also relates to a driving method of the organic electroluminescence emission part. Embodiment 4 is a modification of embodiment 3 and also a modification of embodiment 2. The relationship of embodiment 4 to embodiment 3 corresponds to the relationship of embodiment 2 to embodiment 1. That is, embodiment 4 is different in that, in the initialization period, the signal output circuit 102 applies the first initializing voltage V$_{Ofs1}$ to the data line DTL as the first node initializing voltage, and then, in place of the first initializing voltage V$_{Ofs1}$, applies the second initializing voltage V$_{Ofs2}$ lower than the first initializing voltage to the data line DTL as the first node initializing voltage.

The conceptual diagram of an organic EL display device according to embodiment 4 is the same as FIG. 13 and the equivalent circuit diagram of the organic EL display element 10 including the drive circuit 11 is the same as FIG. 14. The respective component elements forming the display device of embodiment 4 are the same as those described in embodiment 3, and the explanation will be omitted.

FIG. 18 schematically shows a drive timing chart of the emission part ELP according to embodiment 4, and FIGS. 19A to 19E schematically show ON/OFF states etc. of the respective transistors.

From the driving method of embodiment 2, the driving method of embodiment 4 is mainly different in that the power supply part 100 applies the constant voltage $V_{CC}$ and the potential of the second node $ND_2$ is initialized using the first transistor $TR_1$. The respective periods of [period-TP(3)$_0$] to [period-TP(3)$_{+5}$] shown in FIG. 18 correspond to the respective periods of [period-TP(2)$_0$] to [period-TP(2)$_{+5}$] shown in FIG. 10 referred to in embodiment 10. The relationships between the initialization periods and the video signal periods in the respective horizontal scan periods and the respective periods of [period-TP(3)$_0$] to [period-TP(3)$_{+5}$] are the same as those described with respect to [period-TP(2)$_0$] to [period-TP(2)$_{+5}$] shown in FIG. 10 in embodiment 2, and the explanation will be omitted.

[period-TP(3)$_0$] (See FIG. 18)

The operation in this period is the same as that described by referring to FIGS. 15 and 16A in embodiment 3, and the explanation will be omitted.

[period-TP(3)$_1$] (See FIG. 18)

The mth horizontal scan period $H_m$ in the current display frame starts. In the [period-TP(3)$_1$], the above mentioned step (b-1) is performed. The operation in this period is the same as the operation of [period-TP(3)$_1$] described by referring to FIGS. 15 and 16B in embodiment 3 in which the voltage $V_{Ofs}$ is read into $V_{Ofs1}$, and the explanation will be omitted.

[period-TP(3)$_2$] (See FIG. 18)

At the start of the [period-TP(3)$_2$], the first transistor $TR_1$ is turned from ON-state into OFF-state by the signal from the first transistor control line AZ1. To the end of [period-TP(3)$_5$], which will be described later, OFF-state of the first transistor $TR_1$ is maintained.

The operations in [period-TP(3)$_2$] to [period-TP(3)$_4$] as shown in FIG. 18 are substantially the same as the operations in [period-TP(2)$_2$] to [period-TP(2)$_4$] described by referring to FIG. 10 in embodiment 2 except that there is a difference in that the first transistor $TR_1$ is in OFF-state, and the explanation will be omitted.

[period-TP(3)$_5$] (See FIGS. 18 and 19A)

Through the above operation, step (b-1) to step (b) are completed. Then, in the [period-TP(3)$_5$], the above mentioned step (c) and step (d) are performed. The operation in this period is substantially the same as the operation in [period-TP(2)$_5$] described by referring to FIG. 10 in embodiment 2 except that there is a difference in that the first transistor $TR_1$ is in OFF-state, and the explanation will be omitted. The emission part ELP starts to emit light. The current flowing in the emission part ELP is the drain current $I_{ds}$ flowing from the drain region to the source region of the driving transistor $TR_D$, and is given by the expression (5). The organic EL display element 10 turns into the emission state and maintains the state immediately before the (m+m')th horizontal scan period $H_{m+m'}$.

As is the case described in embodiment 2, in [period-TP(3)$_{+1}$] and the subsequent periods shown in FIG. 18, the above described step (b-1) to step (d) are repeatedly performed. For example, in [period-TP(3)$_{+1}$], the next step (b-1) is performed. In the driving method of embodiment 4, the above step (a) is performed between the step (d) and the next step (b-1), specifically, in [period-TP(3)$_{6A}$] to [period-TP(3)$_{6D}$] shown in FIG. 18.

In embodiment 4 as well, the potential of the second node $ND_2$ is set by applying the predetermined intermediate voltage $V_{SS-M}$ to the second node $ND_2$ so that the potential of the second node $ND_2$ may be higher than the potential of the second node $ND_2$ at step (b-1) (specifically, $V_{SS-L}$) and the potential difference between the second node $ND_2$ and the cathode electrode provided in the emission part ELP may not exceed the threshold voltage $V_{th-EL}$ of the emission part ELP. Then, the driving transistor $TR_D$ is held in OFF-state while the drive voltage $V_{CC}$ is applied from the power supply part 100 to one source/drain region of the driving transistor $TR_D$.

Specifically, via the first transistor $TR_1$ turned into ON-state by the signal from the first transistor control line AZ1, the intermediate voltage $V_{SS-M}$ is applied to the second node $ND_2$. Further, via the writing transistor $TR_W$ turned into ON-state by the signal from the scan line SCL, the first initializing voltage $V_{Ofs1}$ and the second initializing voltage $V_{Ofs1}$ as the first node initializing voltages are applied from the data line DTL to the first node $ND_1$, and then, the writing transistor $TR_W$ is turned into OFF-state by the signal from the scan line SCL. As below, the operations from [period-TP(3)$_{6A}$] to [period-TP(3)$_{6D}$] will be explained.

[period-TP(3)$_{6A}$] (See FIGS. 18 and 19B)

At the start of [period-TP(3)$_{6A}$], the first transistor $TR_1$ is turned into ON-state by the signal from the first transistor control line AZ1. The intermediate voltage $V_{SS-M}$ is applied to the second node $ND_2$ via the first transistor $TR_1$. The potential of the second node $ND_2$ becomes $V_{SS-M}$. The organic EL display element 10 turns into the non-emission state. The potential of the first node $ND_1$ becomes lower according to the potential change of the second node $ND_2$.

[period-TP(3)$_{6B}$] (See FIGS. 18 and 19C)

While ON-state of the first transistor $TR_1$ is maintained, at the start of the [period-TP(3)$_{6B}$] the scan line SCL is turned into HIGH-level, and the writing transistor $TR_W$ is turned into ON-state. Via the writing transistor $TR_W$ turned into ON-state, the first node initializing voltage $V_{Ofs1}$ (zero volts) is applied from the data line DTL to the first node $ND_1$. Thereby, the potential difference $V_{gs}$ between the gate electrode and the source/drain region of the driving transistor $TR_D$ becomes smaller than the threshold voltage $V_{th}$ of the driving transistor $TR_D$, and thus, the driving transistor $TR_D$ turns into OFF-state. To the end of the next [period-TP(3)$_{6C}$], ON-state of the writing transistor $TR_W$ is maintained.

[period-TP(3)$_{6C}$] (See FIGS. 18 and 19D)

At the start of [period-TP(3)$_{6C}$], Via the writing transistor $TR_W$ turned into ON-state, the second initializing voltage $V_{Ofs2}$ (−2 volts) is applied from the data line DTL to the first node $ND_1$. The potential of the first node $ND_1$ changes from $V_{Ofs1}$ to $V_{Ofs2}$. The driving transistor $TR_D$ maintains OFF-state.

[period-TP(3)$_{6D}$] (See FIGS. 18 and 19E)

At the start of [period-TP(3)$_{6D}$], the writing transistor $TR_W$ is turned into OFF-state by the signal from the scan line SCL, and the first transistor $TR_1$ is turned into OFF-state by the signal from the first transistor control line AZ1. The driving transistor $TR_D$ maintains OFF-state. The state is maintained to immediately before [period-TP(3)$_{+1}$]. The organic EL display element 10 also maintains the non-emission state.

In the driving method of embodiment 4, in the [period-TP(3)$_{6D}$] occupying the large part of the non-emission period, the potential of the gate electrode of the driving transistor $TR_D$ is $V_{Ofs2}$ (−2 volts), the potential of the one source/drain region is $V_{CC}$ (20 volts), and the potential of the other source/drain region is $V_{SS-M}$ (2 volts). That is, the potential of the gate electrode of the driving transistor $TR_D$ in the non-emission period is lower than the potential of the channel formation region between the source/drain regions.

Therefore, as is the case explained in the driving method of embodiment 1, the potential relationship between the gate electrode of the driving transistor $TR_D$ and the channel formation region is inverted between the emission period and the non-emission period, and the tendency to shift to the enhancement side due to temporal change is reduced. Further, at step (a), the potential of the second node $ND_2$ is set by applying the predetermined intermediate voltage $V_{SS-M}$ to the second node $ND_2$, and thus, the time shifting from step (d) to step (a) can be made shorter, and the emission part ELP can be driven without trouble even in the display device having a short scanning period.

In the driving method of embodiment 3, in [period-TP$(3)_{6C}$] shown in FIG. 10, the potential of the gate electrode of the driving transistor $TR_D$ is $V_{Ofs}$ (zero volt). On the other hand, in the driving method of embodiment 4, in [period-TP$(3)_{6D}$] occupying the large part of the non-emission period, the potential of the gate electrode of the driving transistor $TR_D$ is $V_{Ofs2}$ (−2 volts). That is, compared to the driving method of embodiment 3, the potential of the gate electrode of the driving transistor $TR_D$ in the non-emission period can be made lower than the potential of the channel formation region between the source/drain regions. Therefore, the tendency of the driving transistor $TR_D$ to shift to the enhancement side due to temporal change is further reduced.

Embodiment 5

Embodiment 5 also relates to a driving method of the organic electroluminescence emission part. Embodiment 5 is modifications of embodiment 3 and embodiment 4. In embodiment 5, the drive circuit 11 includes four-transistors/one-capacity part (4Tr/1C drive circuit). FIG. 20 is a conceptual diagram of an organic EL display device according to embodiment 5, and FIG. 21 is an equivalent circuit diagram of the organic electroluminescence display element 10 including the drive circuit 11.

First, the details of the drive circuit will be explained.

Like the above described 3Tr/1C drive circuit, the 4Tr/1C drive circuit includes three transistors of the writing transistor $TR_W$, the driving transistor $TR_D$, and a first transistor $TR_1$, and one capacity part $C_1$. In addition, the 4Tr/1C drive circuit further includes a second transistor $TR_2$.

[Driving Transistor $TR_D$]

The configuration of the driving transistor $TR_D$ is the same as the configuration of the driving transistor $TR_D$ described in embodiment 1, and the detailed explanation will be omitted. As is the case described in embodiment 3, the power supply unit 100 applies the constant voltage $V_{CC}$ to one source-drain region of the drive transistor.

[Writing Transistor $TR_W$]

The configuration of the writing transistor $TR_W$ is the same as the configuration of the writing transistor $TR_W$ described in embodiment 1, and the detailed explanation will be omitted.

[First Transistor $TR_1$]

The configuration of the first transistor $TR_1$ is the same as the configuration of the writing transistor $TR_W$ described in embodiment 3, and the detailed explanation will be omitted.

The drive circuit 11 of embodiment 5 further includes the second transistor $TR_2$, and the power supply part 100 and one source/drain region of the driving transistor $TR_D$ are connected via the second transistor $TR_2$. Further, embodiment 5 is different from embodiment 3 and embodiment 4 in that, when the first transistor $TR_1$ is in ON-state, the second transistor $TR_2$ is turned into OFF-state.

Specifically, in the second transistor $TR_2$.

(D-1) one source/drain region is connected to the power supply part 100, (D-2) the other source/drain region is connected to the one source/drain region of the driving transistor $TR_D$, and (D-3) the gate electrode is connected to a second transistor control line CL. The end of the second transistor control line CL is connected to a second transistor control circuit 105.

In embodiment 3, the explanation that, when the second node initializing voltage $V_{SS}$ is applied to the second node $ND_2$ via the first transistor $TR_1$ in ON-state, also the drive voltage $V_{CC}$ is applied to the second node $ND_2$ via the driving transistor $TR_D$ is made. In this case, there is a problem that a through current flows via the driving transistor $TR_D$ and the first transistor $TR_1$.

Accordingly, in embodiment 5, when the first transistor $TR_1$ is turned into ON-state in the operations described in embodiment 3 and embodiment 4, the second transistor $TR_2$ is turned into OFF-state according to the signal from the second transistor control circuit 105.

As an example, FIGS. 22A to 22C schematically show ON/OFF states etc. of the respective transistors when the operations corresponding to the respective periods of [period-TP$(3)_0$] to [period-TP$(3)_2$] shown in FIG. 15 referred to in embodiment 3 are performed.

As above, the operation of embodiment 5 has been explained compared to the operation in embodiment 3, however, the operation is not limited to that. Compared to the operation of embodiment 4 as well, when the first transistor $TR_1$ is in ON-state, a through current is prevented from flowing by turning the second transistor $TR_2$ into OFF-state.

As above, the preferred embodiments of the invention have been explained, however, the embodiments of the invention are not limited to those. The configurations and structures of the organic EL display device, the organic EL element, various component elements forming the drive circuit, and the steps in the driving method of the emission part are just examples, and may be appropriately changed.

Figure 23:
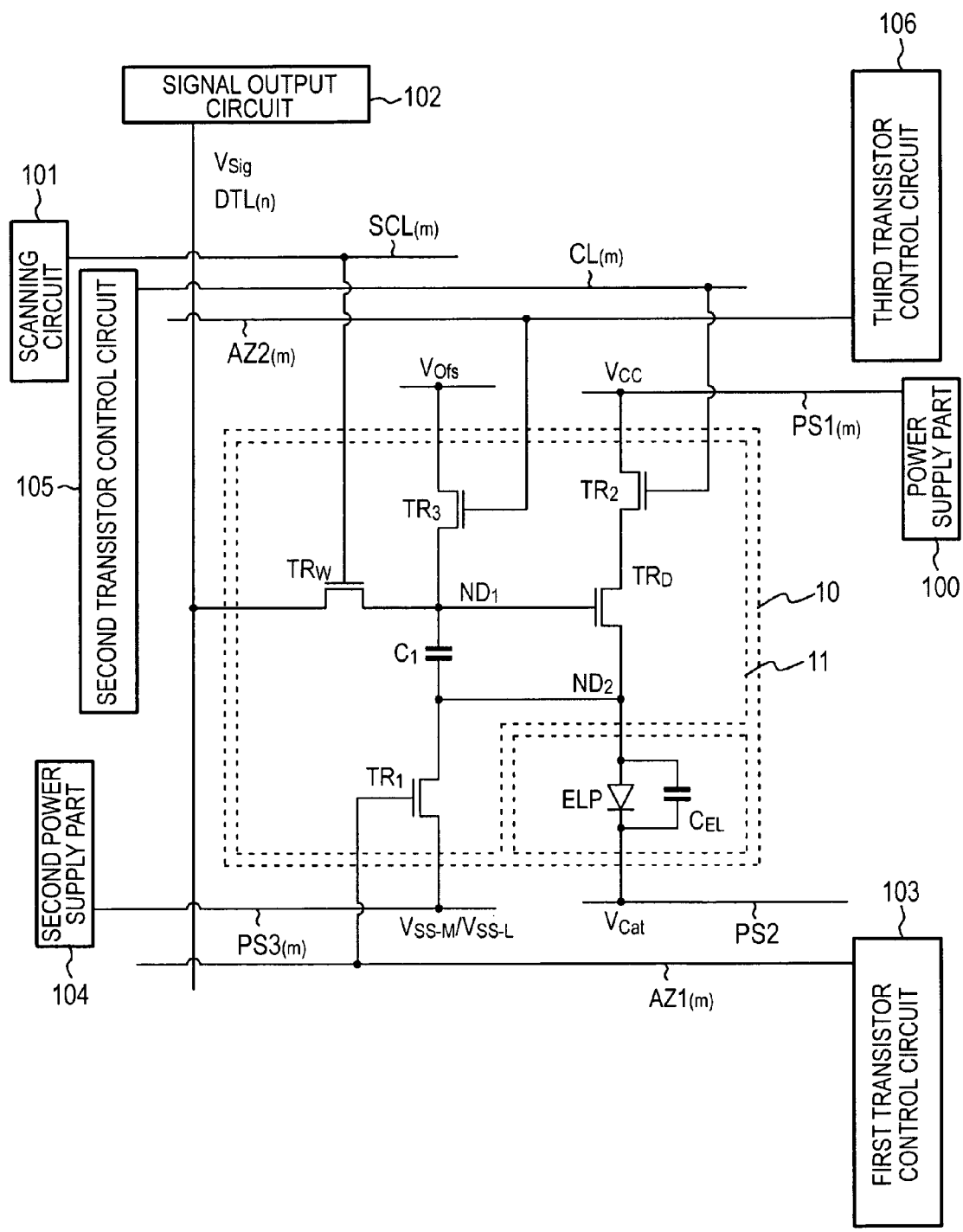
FIG. 23 is an equivalent circuit diagram of the organic electroluminescence display device including a drive circuit.

In embodiment 1 to embodiment 5, the voltage $V_{Ofs}$ and the like are applied to the first node $ND_1$ via the data line DTL. On the other hand, for example, as shown in FIG. 23, the voltage $V_{Ofs}$ and the like may be applied to the first node $ND_1$ using a third transistor $TR_3$ connected to the first node $ND_1$.

The present application contains subject matter related to that disclosed in Japanese Priority Patent Application JP 2009-000664 filed in the Japan Patent Office on Jan. 6, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A driving method of a display device having a driving transistor and a display element,
   wherein a first current electrode of the driving transistor is connected to a power supply line, and a second current electrode of the driving transistor is connected to an anode electrode of the display element,
   the method comprising the steps of, during display of image frames in a plurality of frame periods:
   after a light emitting period of a given frame period begins and before a light emitting period of a next frame period begins, setting a potential of the anode electrode by applying a predetermined intermediate voltage to the anode electrode so that a potential difference between the anode electrode of the display element and a cathode electrode of the display element does not exceed a threshold voltage of the display element; and then holding the driving transistor in an OFF-state from a time period beginning when a drive voltage is applied from the power supply line to the first current electrode of the driving transistor and ending when an anode initializing voltage is applied to the anode, throughout which the drive voltage is applied from the power supply line to the first current electrode of the driving transistor, wherein the intermediate voltage is higher than the anode initializing voltage, which is a voltage low enough to stop light emission of the display element and which is applied to the anode to initialize the anode between light emission periods, and the intermediate voltage is lower than the drive voltage, which is a voltage that produces light emission in the display element.

2. A driving method of an organic electroluminescence emission part, using a drive circuit including a writing transistor, a driving transistor, and a capacity part, wherein the driving transistor comprises,
(A-1) a first current electrode connected to a power supply line,
(A-2) a second current electrode connected to an anode electrode of an organic electroluminescence emission part and connected to a first electrode of the capacity part, and forming a second node, and
(A-3) a gate electrode connected to a second current electrode of the writing transistor and connected to a second electrode of the capacity part, and forming a first node, wherein the writing transistor comprises,
(B-1) a first current electrode connected to a data line, and
(B-2) a gate electrode connected to a scan line, the method comprising the step of, during display of image frames in a plurality of frame periods:

(a) after a light emitting period of a given frame period begins and before a light emitting period of a next frame period begins, setting a potential of the second node by applying a predetermined intermediate voltage to the second node so that a potential difference between the second node and a cathode electrode of the organic electroluminescence emission part may not exceed a threshold voltage of the organic electroluminescence emission part, and then, holding the driving transistor in an OFF-state from a time period beginning when a drive voltage is applied from the power supply line to the first current electrode of the driving transistor and ending when an anode initializing voltage is applied to the anode, throughout which the drive voltage is applied from the power supply line to the first current electrode of the driving transistor, wherein the intermediate voltage is higher than the anode initializing voltage, which is a voltage low enough to stop light emission of the display element and which is applied to the anode to initialize the anode between light emission periods, and the intermediate voltage is lower than the drive voltage, which is a voltage that produces light emission in the display element.

3. The driving method of an organic electroluminescence emission part according to claim 2, further comprising the steps of:

(b) performing writing processing by applying a video signal from the data line to the first node through the writing transistor turned into an ON-state by a signal from the scan line; then (c) turning the writing transistor into an OFF-state by the signal from the scan line, thereby causing the first node to float; and (d) applying the drive voltage from the power supply line to the first current electrode of the driving transistor and causing a current to flow through the driving transistor to the organic electroluminescence emission part, the magnitude of the current being determined by a value of a potential difference between the first node and the second node, wherein a series of steps from step (b) to step (d) is repeatedly performed in each frame period and the step (a) of the given frame period is performed between step (d) of the given frame period and the step (b) of a subsequent frame period.

4. The driving method of an organic electroluminescence emission part according to claim 3, further comprising, before the step (b), the steps of:

(b-1) applying a first initializing voltage to the first node and the anode initializing voltage to the second node, and thereby, performing preprocessing of initializing the potential of the first node and the potential of the second node so that the potential difference between the first node and the second node exceeds the threshold voltage of the driving transistor and the potential difference between the second node and the cathode electrode of the organic electroluminescence emission part does not exceed the threshold voltage of the organic electroluminescence emission part; and then (b-2) performing threshold voltage cancel processing, which comprises changing the potential of the second node toward a potential obtained by subtracting the threshold voltage of the driving transistor from the potential of the first node while the potential of the first node is held at a fixed value.

5. The driving method of an organic electroluminescence emission part according to claim 4, wherein the step (a) further comprises applying the first initializing voltage to the first node after setting the potential of the second node and then causing the first node to float when the drive voltage is applied to the first current electrode of the driving transistor.

6. The driving method of an organic electroluminescence emission part according to claim 5, wherein, at the step (a), the potential of the second node is set by applying the predetermined intermediate voltage from the power supply line through the driving transistor to the second node.

7. The driving method of an organic electroluminescence emission part according to claim 5, wherein the drive circuit further includes a first transistor, wherein the first transistor comprises,
(C-1) a first current electrode connected to the second node, and
(C-2) a gate electrode connected to a first transistor control line, and wherein at the step (a),
the potential of the second node is set by applying the predetermined intermediate voltage to the second node through the first transistor turned into an ON-state by a signal from the first transistor control line.

8. The driving method of an organic electroluminescence emission part according to claim 5, wherein, at the step (a), the first initializing voltage is applied from the data line to the first node through the writing transistor turned into an ON-state by the signal from the scan line.

9. The driving method of an organic electroluminescence emission part according to claim 5, wherein, at the step (b-1), the first initializing voltage is applied from the data line to the first node through the writing transistor turned into an ON-state by the signal from the scan line.

10. The driving method of an organic electroluminescence emission part according to claim 5, wherein, at the step (b-1), the anode initialization voltage is applied from the power supply line through the driving transistor to the second node.

11. The driving method of an organic electroluminescence emission part according to claim 5, wherein the drive circuit further includes a first transistor,
wherein the first transistor comprises,
(C-1) a first current electrode connected to the second node, and
(C-2) a gate electrode connected to a first transistor control line, and
wherein at the step (b-1),
the anode initializing voltage is applied to the second node through the first transistor turned into an ON-state by a signal from the first transistor control line.

12. The driving method of an organic electroluminescence emission part according to claim 5, wherein, at the step (b-2), a condition in which the first initializing voltage is applied from the data line to the first node through the writing transistor turned into an ON-state by the signal from the scan line is maintained, and thereby, the potential of the first node is held.

13. The driving method of an organic electroluminescence emission part according to claim 5, wherein, at the step (b-2), the drive voltage is applied from the power supply line to the first current electrode of the drive transistor, and thereby, the potential of the second node is changed toward the potential obtained by subtracting the threshold voltage of the driving transistor from the potential of the first node.

14. The driving method of an organic electroluminescence emission part according to claim 5,
wherein the step (a) further comprises applying a second initializing voltage to the first node after applying the first initializing voltage and before causing the first node to float,
wherein the second initializing voltage is lower than the first initializing voltage.

15. A display device having a driving transistor and a display element, comprising:
a first current electrode of the driving transistor connected to a power supply line; and
a second current electrode connected to an anode electrode of the display element,
wherein, during display of image frames in a plurality of frame periods, after a light emitting period of a given frame period begins and before a light emitting period of a next frame period begins, a potential of the anode electrode is set by applying a predetermined intermediate voltage to the anode electrode so that a potential difference between the anode electrode of the display element and a cathode of the display element may not exceed a threshold voltage of the display element, and then, the driving transistor is in an OFF-state from a time period beginning when a drive voltage is applied from the power supply line to the first current electrode of the driving transistor and ending when an anode initializing voltage is applied to the anode, throughout which the drive voltage is applied from the power supply line to the first current electrode of the driving transistor,
wherein the intermediate voltage is higher than the anode initializing voltage, which is a voltage low enough to stop light emission of the display element and which is applied to the anode to initialize the anode between light emission periods, and the intermediate voltage is lower than the drive voltage, which is a voltage that produces light emission in the display element.

* * * * *